United States Patent [19]

Uchida et al.

[11] Patent Number: 5,613,020

[45] Date of Patent: Mar. 18, 1997

[54] OPTICAL DEVICES HAVING A PERIODICAL CURRENT RESTRAINT LAYER AND OPTICAL COMMUNICATION SYSTEMS USING THE OPTICAL DEVICE

[75] Inventors: Mamoru Uchida, Yokohama; Hidetoshi Nojiri, Hadano, both of Japan

[73] Assignee: Canon Kabushiki Kaisha, Tokyo, Japan

[21] Appl. No.: 571,741

[22] Filed: Dec. 13, 1995

Related U.S. Application Data

[63] Continuation of Ser. No. 460,526, Jun. 2, 1995, abandoned, which is a continuation of Ser. No. 208,464, Mar. 9, 1994, abandoned.

[30] Foreign Application Priority Data

| Mar. 15, 1993 | [JP] | Japan | 5-080170 |
| Jul. 27, 1993 | [JP] | Japan | 5-185052 |
| Nov. 22, 1993 | [JP] | Japan | 5-315969 |
| Dec. 29, 1993 | [JP] | Japan | 5-352709 |

[51] Int. Cl.$^6$ .................................................. G02B 6/34
[52] U.S. Cl. ............................... 385/9; 385/10; 385/27; 385/40
[58] Field of Search .......................... 385/1–4, 8–10, 385/27, 28, 30, 31, 37, 39, 40, 129, 130, 131

[56] References Cited

U.S. PATENT DOCUMENTS

| 4,904,045 | 2/1990 | Alferness et al. | 385/37 |
| 4,980,895 | 12/1990 | Nishimura | 372/96 |
| 5,131,060 | 7/1992 | Sakata | 385/2 |

FOREIGN PATENT DOCUMENTS

| 0466082 | 1/1992 | European Pat. Off. |
| 0558948 | 9/1993 | European Pat. Off. |
| 60-032029 | 2/1985 | Japan |
| 3-20723 | 1/1991 | Japan |
| 4264429 | 9/1992 | Japan |
| 4-64044 | 10/1992 | Japan |

OTHER PUBLICATIONS

H. C. Casey, Jr., et al., "Heterostructure Lasers," Academic Press, pp. 42–46 (1978). [No Month].
Erman, et al., "Mach–Zehnder Modulators and Optical Switches on III–V Semiconductors," *Journal of Lightwave Technology*, vol. 6, No. 6, pp. 837–846, 1988 (Jun.).
Liou et al. "Monolithically Integrated GaInAsP/InP Optical Amplifier with Low Loss Y–branching Waveguides and Monitoring Photodetector," Lecture No. CFD7, *Conference on Laser and Electrooptics*, 1990 (May).
Chuang, et al., "Photonic Integrated Tunable Receivers with Optical Preamplifiers for Direct Detection," *Applied Physics Letters*, vol. 63, No. 7, Aug. 1993, pp. 880–882.
Herczfeld, Peter R., "Hybrid Photonic–Microwave Systems and Devices," *IEICE Transactions on Electronics*, vol. E–76–C, No. 2, Feb. 1993, pp. 191–197.
Sakata et al., "Wavelength Tuning in a Grating–Assisted Vertical Coupler Filter Using Quantum Well Electrorefraction," *Applied Physics Letters*, vol. 59, No. 24, Dec. 1991, pp. 3081–3083.

*Primary Examiner*—John D. Lee
*Attorney, Agent, or Firm*—Fitzpatrick, Cella, Harper & Scinto

[57] ABSTRACT

An optical device for performing a light power transfer between two waveguides that includes a first waveguide, a second waveguide, a transfer rate control element for controlling a light power transfer rate between the first and second waveguides and an electric element for electrically controlling the transfer rate control element by imparting electric energy to the transfer rate control element. The transfer rate control element sets the light power transfer rate to zero when the transfer rate control element is in an inoperative state. The transfer rate control element falls into the inoperative state when the electric element imparts no electric energy to the transfer rate control element.

35 Claims, 39 Drawing Sheets

43 PIN PHOTODETECTOR PORTION
42 Y-BRANCHING PORTION
41 OPTICAL AMPLIFIER PORTION

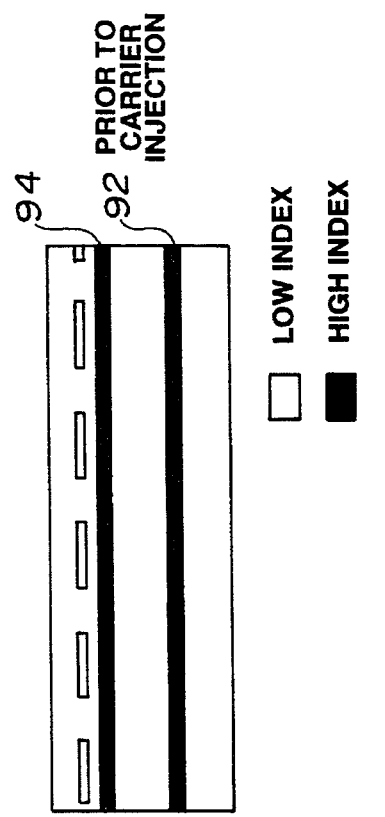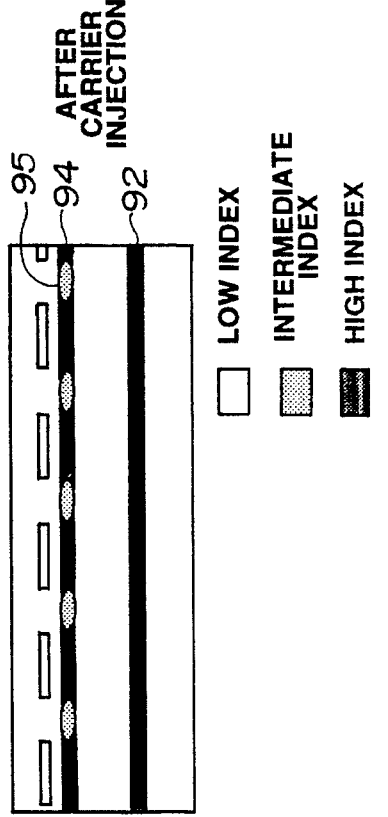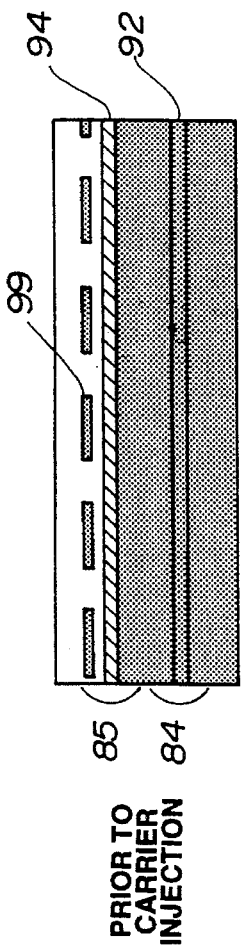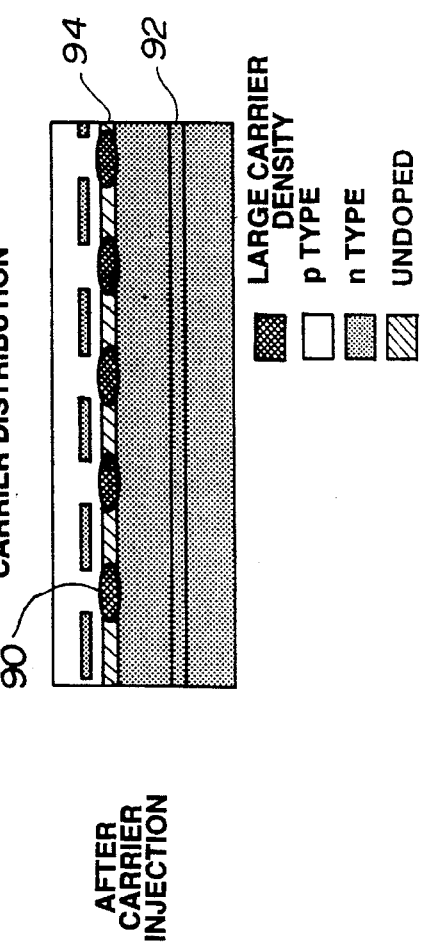

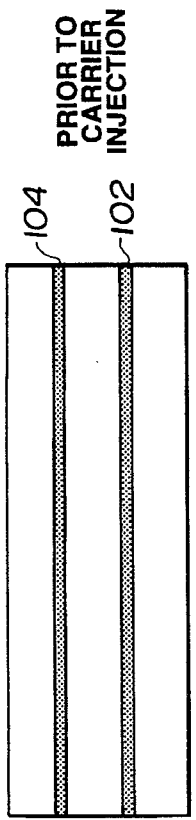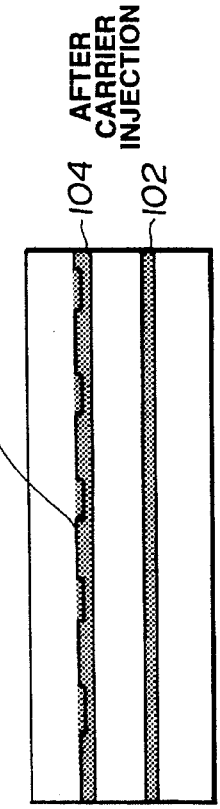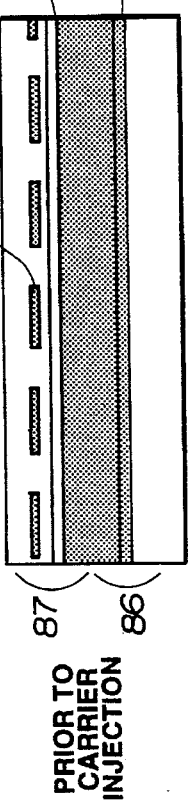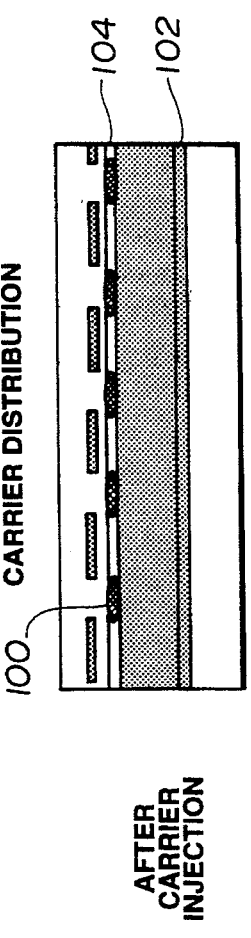

REFRACTIVE INDEX DISTRIBUTION
PRIOR TO FIELD APPLICATION

☐ LOW INDEX
▨ INTERMEDIATE INDEX

REFRACTIVE INDEX DISTRIBUTION
AFTER FIELD APPLICATION

☐ LOW INDEX
▨ INTERMEDIATE INDEX
■ HIGH INDEX

CARRIER DISTRIBUTION
PRIOR TO FIELD APPLICATION

☐ p TYPE
▨ n TYPE

CARRIER DISTRIBUTION
AFTER FIELD APPLICATION

☐ p TYPE
▨ n TYPE 5,613,020

OPTICAL DEVICES HAVING A PERIODICAL CURRENT RESTRAINT LAYER AND OPTICAL COMMUNICATION SYSTEMS USING THE OPTICAL DEVICE

This application is a continuation of application Ser. No. 08/460,526, filed Jun. 2, 1995, which is a continuation of application Ser. No. 08/208,464, filed Mar. 9, 1994, both now abandoned.

BACKGROUND OF THE INVENTION

1. Field of the Invention

The present invention relates to optical devices such as integrated semiconductor devices for repeating a signal, integrated light branching-combining devices and semiconductor optical amplifiers. The present invention also relates to optical communication networks or systems using the optical devices.

2. Description of Related Background Art

In recent years, there has been an increasing demand for optical devices used in optical local area networks (optical LAN) in the field of optical communications. A conventional optical LAN is shown in FIG. 1. In the optical LAN, a transmitted signal is taken into respective terminals, and the signal is logically processed in each terminal and re-transmitted therefrom. In such a system, optical nodes 12-1~12-4 need to have a structure as shown in FIG. 2. FIG. 2 illustrates the optical node 12-2 as an example. In this structure of the node, there are provided opto-electric (O/E) converters 14-1 and 14-2 for respectively converting a signal transmitted from each of transmission lines 11-1 and 13-1 to an electric signal, a control circuit 16 for processing an electric signal, electro-optic (E/O) converters 15-1 and 15-2 for converting the electrically processed signal to a light signal to be re-transmitted to transmission lines 11-2 and 13-2, and the like.

Generally, communication is performed by the above means in a network as shown in FIG. 1. There may be a case where communication is interrupted because of trouble in the network. Therefore, in order to improve the reliability of the network, the optical nodes 12-1~12-4 need to have a function for coping with trouble when it occurs. A conventional trouble countermeasure method used in the optical communication network shown in FIG. 1 will be described.

Possible types of trouble or failures are breakdown of the optical fibers 11 and 13, failure of the optical nodes 12 to function and so forth. Trouble in the communication network may include a case where the transmission line or the optical fiber is intentionally disconnected at the time of addition of optical nodes or the like, and a case where an electric source in the optical node is switched off. When an optical node 12 is out of order, the network is divided into two portions at the boundary of the optical node in trouble.

A countermeasure for such trouble will be described using the system shown in FIG. 1. If the transmission line is a single line in an ordinary optical communication network, the countermeasure of the division of the network cannot be used. Therefore, in order to solve such a hardship, two series or sets of transmission lines, O/E converters and E/O converters are provided for respective optical nodes 12. One system is used as a reserve. In FIG. 1, reference numerals 11-1~11-4 designate optical fibers to be used as an ordinary transmission line, reference numerals 12-1~12-4 designate optical nodes and reference numerals 13-1~13-4 designate optical fibers to be used as reserve transmission lines when trouble occurs. Each of the optical nodes 12-1~12-4 has the structure shown in FIG. 2, and has communication functions for the transmission lines 11 and 13.

First, an operation that takes place when trouble occurs in the optical node 12 will be described.

If trouble occurs in optical node 12-2, the trouble is detected when a communication is routed through the optical node 12-2. Upon detection of trouble, the optical node 12-1 notifies other optical nodes 12-3 and 12-4 of the fact that trouble has occurred in the optical node 12-2 on the ordinary transmission line, by utilizing the reserve O/E and E/O converters in the optical node 12-1 and by using the reserve transmission system. Upon this notice, the other optical nodes 12-3 and 12-4 change from ordinary communication to a communication that is performed by the reserve O/E and E/O converters and the reserve transmission series. Thus, communication after trouble has occurred can be secured. However, if trouble occurs in the entire optical node or in both of the two series, then it becomes impossible to route a communication through the optical node in trouble in the network.

The operation that occurs when an optical fiber is broken down will be described next. If the optical fiber 11-2 is broken down, this disconnection is detected when a communication passing through the optical fiber 11-2 (e.g., communication between the optical nodes 12-1 and 12-3) is performed. Upon this detection, the optical node 12-1 notifies other optical nodes 12-3 and 12-4 of the fact that trouble has occurred on the transmission line usually used, similar to the above, by changing O/E and E/O converters in the optical node 12-1 and using the reserve transmission series. Upon this notice, the other optical nodes 12-3 and 12-4 change from ordinary communication to a communication that is performed by the reserve O/E and E/O converters and the reserve transmission series. Thus, communication after the breakdown can be also secured. However, as described above, the following problems exist in the countermeasure for trouble in the active optical LAN as shown in FIG. 1.

(1) All communication function will be lost if trouble occurs in the entire optical node;

(2) A reserve communication series is needed; and (3) All optical nodes are required to secure a state in which reproduction and relay (i.e., repeating) is possible.

Those facts mean that the network always needs two sets of optical nodes and two sets of transmission lines, leading to a costly system. Furthermore, the problem (3) becomes serious, when the network is extended over a wide range. It is also a serious burden to warrant the operation of the entire network.

Further, in optical communication networks such as optical LAN devices, such as light branching-combining devices and demultiplexing or multiplexing devices, there are key devices for determining the specifications of a system.

An example of the light branching-combining device is disclosed in Erman et al. "Mach-Zehnder Modulators and Optical Switches on III–V Semiconductors", Journal of Lightwave Technology, vol. 6, No. 6, pp. 837–846, 1988. FIG. 3 is a plan view thereof, and FIG. 4 is a cross-sectional view of a light waveguide which forms input and output ports. In FIG. 3, reference numeral 21 designates an input port, and reference numerals 22 and 23 designate output ports. Light incident on the input port 21 is branched into two portions propagated through the output ports 22 and 23, by a beam splitter 24. In FIG. 4, reference numeral 33 designates a core layer, and the effective refractive index in a transverse direction is defined by a groove 37 formed in a cladding layer 32 layered on an n⁺-GaAs substrate 31 so that a transverse mode of the propagated light can be stabilized. Reference numerals 34, 35 and 36 respectively designate an n-type $Al_{0.5}Ga_{0.5}As$ layer, an n-type $Al_{0.1}Ga_{0.9}As$ layer and a p-type GaAs layer formed on the core layer 33. The beam splitter 24 is composed of a perpendicular groove which horizontally extends at an angle of 45° relative to the light propagation direction and whose depth is ended halfway of the core layer 33. Side faces of the perpendicular groove act as a total reflection mirror. As a result, the branching of the light incident from the port 21 into the port 22 is performed by the total reflection mirror, while the branching thereof toward the port 23 is achieved by a wave-front splitting with respect to the depth direction.

The structure as shown in FIGS. 3 and 4, however, has several drawbacks as follows:

(1) A failure-safety function is not established;

(2) Compensation for insertion loss is disregarded;

(3) Cost performance and extensibility are low; and (4) A high fabrication precision is required to obtain a desired branching ratio.

It is highly desirable that devices disposed in optical communication networks have a function to automatically overcome trouble in the network (so-called failure-safety function) so that the network is not influenced thereby even when trouble occurs in the device itself, a terminal or a terminal unit connected to the device. However, this function is impossible to achieve in the above-discussed device. Although other devices, such as an ordinary optical switch, can be disposed in order to obtain the failure-safety function and the function to vary the branching ratio, those devices have to be disposed externally. Therefore, the advantageous effects of integration and extensibility will be lost, and size and cost will increase. Further, the device structure inevitably becomes complicated because other devices, such as an optical amplifier, are needed, for example, to compensate for light loss due to the light splitting.

Furthermore, it is advantageous for the branching ratio of the light branching-combining device that is disposed in the optical network to be variable in order to achieve flexibility and expansibility in the network.

Further, in optical communications such as an optical LAN, the importance of devices such as optical amplifiers has been increasing in recent years. Optical amplifiers can be roughly classified into fiber amplifiers and semiconductor amplifiers, and they are respectively used for different purposes.

The semiconductor amplifier or laser diode amplifier (LDA) is advantageous in that its structure is suited to integration since the LDA has the same structure as the semiconductor laser. An example, in which devices such as the LDA are integrated, is disclosed in K. Y. Liou et al. "Monolithically Integrated GaInAsP/InP Optical Amplifier with Low Loss Y-branching Waveguides and Monitoring Photodetector", Lecture No. CDF7, Conference on Laser and Electrooptics, 1990. FIG. 5 shows such an example.

In FIG. 5, optical amplifier portion 41, Y-branching portion 42 and PIN photodetector portion 43 are integrated on an InP substrate 40. In its layer structure, a light guide layer (its band gap in wavelength: 1.1 μm) is formed under an active layer (its band gap in wavelength: 1.3 μm), and the active layer is common to the optical amplifier portion 41 and the photodetector portion 43. In the Y-branching portion 42 the active layer is removed, and antireflection coatings are provided on facets of the optical amplifier portion 41 and photodetector portion 43. This structure features a very small waveguiding loss and coupling loss in the respective waveguides and the branching of a light wave into two portions by the Y-branching portion 42 where the two portions can be respectively monitored.

The above described amplifier, however, has the following disadvantage. Since the light signal necessarily passes through LDA, the light signal will be greatly disrupted if trouble occurs in the LDA. The amount of carrier injection in the LDA is larger than that of a laser diode, so that the probability of internal degradation of the LDA is considerably greater than that of the laser diode. Therefore, the LDA needs to have a failure-safety function in case the degradation occurs. To achieve this purpose, a method can be considered in which ordinary optical switches are disposed in front of and at the rear of the LDA. For example, Japanese Patent Publication No. 4-64044 discloses a method wherein optical components such as lens and prism are externally disposed. According to this method, however, since external disposition needs to be adopted, size and cost of the device necessarily increase and the merit of integration is lost. Thus, the advantages particular to the LDA will be lost.

SUMMARY OF THE INVENTION

It is an object of the present invention to overcome the problems of the prior art.

It is an object of the present invention to provide an optical device in which a so-called failure-safety function will always work irrespective of the type of trouble or the condition of an electric source for the device, and an optical communication system using such an optical device.

According to one aspect of the present invention which achieves these objectives, an optical device comprises a first waveguide for allowing a light wave to propagate therein, a second waveguide, transfer rate control means for controlling a power transfer rate of the light wave between the first and second waveguides, and electric means for electrically controlling the transfer rate control means by imparting electric energy to the transfer rate control means. The light-wave power transfer rate has a value of zero when the transfer rate control means is in an inoperative state. The transfer rate control means falls into the inoperative state when the electric means imparts no electric energy to the transfer rate control means.

According to another aspect of the present invention which achieves these objectives, an optical device comprises a semiconductor substrate, a first cladding layer formed on the semiconductor substrate, a first core layer formed on the first cladding layer, a second cladding layer formed on the first core layer, a third cladding layer formed on the second cladding layer, a second core layer formed on the third cladding layer, a fourth cladding layer formed on the second core layer, a refractive index modulating layer, and electric means for electrically controlling the refractive index modulating layer by imparting electric energy to the refractive index modulating layer. The refractive index modulating layer is formed between the second and third cladding layers and in at least one of a plurality of regions divided along a light propagation direction of the device.

According to another aspect of the present invention which achieves these objectives, an optical device comprises a semiconductor substrate, a first cladding layer formed on the semiconductor substrate and having a first conduction type, a first core layer formed on the first cladding layer and having the first conduction type, a second cladding layer formed on the first core layer and having the first conduction type, a second core layer formed on the second cladding layer, a third cladding layer formed on the second core layer and having a second conduction type, a periodical refractive index modulating layer, and electric means for electrically controlling the periodical refractive index modulating layer by imparting electric energy to the periodical refractive index modulating layer. The refractive index modulating layer is formed in at least one of the second and third cladding layers and in at least one of a plurality of regions divided along a light propagation direction of the device.

According to another aspect of the present invention which achieves these objectives, an optical device comprises a semiconductor substrate, a first cladding layer formed on the semiconductor substrate and having a first conduction type, a first core layer formed on the first cladding layer, a second cladding layer formed on the first core layer and having a second conduction type, a second core layer formed on the second cladding layer, a third cladding layer formed on the second core layer and having the first conduction type, first means for periodically modulating a refractive index of the layer near the first means in a light propagation direction of the device, second means for uniformly modulating a refractive index in the light propagation direction of the device, and electric means for electrically controlling the first and second means by imparting electric energy to the first and second means. The first means is formed in at least one of a plurality of regions divided along the light propagation direction of the device, and the second means is formed in at least one of the plurality of regions.

According to still another aspect of the present invention which achieves these objectives, an optical communication network comprises a plurality of terminals; a light transmission line for connecting the terminals to each other, and an optical device located on the light transmission line. The optical device may be any one of optical devices described immediately above.

According to still another aspect of the present invention which achieves these objectives, an optical communication network comprises a plurality of terminals; a light transmission line for connecting the terminals to each other, and an optical device located in the terminal. The optical device may be any one of optical devices described immediately above.

Principles of a switchover and the variation of a power transfer rate of a light beam between two waveguides will be described, using three typical examples (one is an example of a grating, another is an example of a periodical current restraint layer and the other is an example of a combination of a periodical current restraint layer and an index uniform variable layer), with reference to FIGS. 6A—6H and 7A—7D.

An optical device, which has two waveguides formed nearby, is well known as a directional coupler. In the directional coupler, a power branching ratio between the first and second waveguides is determined by a propagation constant difference $\Delta\beta=\beta_2-\beta_1$, a distance between the two waveguides and a coupling length L, where $\beta_1$ and $\beta_2$ are respectively propagation constants of the waveguides. Thus, the directional coupler can function as a coupler or a switch. Furthermore, if a layer for modulating the propagation constant, or refractive index modulating layer (there are typically two configurations; a current restraint layer and a grating) is arranged, for example, between the two waveguides, freedom of design and tolerance in fabrication can be improved, and a new function (for example, optical filtering function) can be added.

By injecting carriers into the core layer of the waveguide, the device can be used as an optical amplifier or semiconductor laser which has a gain for a wavelength range that is determined by the core material. Further, since the refractive index of the core layer is lowered by the carrier injection into the core layer, the intensity distribution of a propagated light wave can be varied. At this time, when the layer structure is built up so that the carrier density is periodically modulated during carrier injection time into the core layer, the above two functions (i.e., the optical amplification and the change in the optical intensity distribution) can be simultaneously obtained.

For example, the directional coupler is constructed by first and second core layers, where carriers are periodically injected only into one of the core layer. FIGS. 6A–6B and 6C–6D respectively illustrate carrier distributions and refractive index distributions in a layer structure (this is illustrated only as an example) prior to and after carrier injection. In FIGS. 6A–6D, reference numeral 99 designates a periodical current restraint layer in which portions of different types of conduction materials are periodically disposed alternately, and in this case electrons are partly blocked by the periodical current restraint layer 99 and the refractive index thereof is approximately equal to the refractive index during carrier non-injection time. Further, in FIGS. 6A–6D, reference numerals 84 and 85 respectively designate first and second waveguides which respectively include first and second core layers 92 and 94, and reference numeral 90 designates a portion of the second core layer 94 whose carrier density is large. When carriers of $1\times10^{18}$ cm$^{-3}$ are injected, the refractive index is lowered by the order of $10^{-3}$ (see Casey and Panish, "Heterostructure Lasers" pages 42–46, Academic Press, 1978). Therefore, if carrier density is about $1\times10^{18}$ cm$^{-3}$, the carrier distribution around the second core layer 94 becomes periodical as illustrated in FIG. 6B. At this time, the refractive index distribution is as illustrated in FIG. 6D. Therefore, the periodical injection of carriers is equivalent to the formation of a refractive index variable grating 95 (an effective grating).

Further, it is possible that the directional coupler is constructed by the first and second core layers and a physical refractive index variable grating, and that carriers are injected into only one core layer.

In both those cases (cases of effective and physical gratings), where a grating vector is K, the Bragg condition or phase matching condition is given by:

$$\beta_2=\beta_1+K \qquad (1)$$

Where $$\Delta=\beta_2-(\beta_1+K) \qquad (2)$$

a power transfer rate $\eta$ is represented by:

$$\eta-1/(1+(\Delta/\kappa)^2)\cdot(\sin\beta_c z)^2 \qquad (3)$$

Here, $\kappa$ is a coupling coefficient or efficiency between two waveguides, z is a coordinate in a light propagation direction and $$\beta_c=(\kappa^2+\Delta^2)^{1/2} \qquad (4)$$

From the above, a maximum power transfer rate $\eta_{max}$ is given by:

$$\eta_{max}=1/(1+(\Delta/\kappa)^2) \qquad (5)$$

and a maximum complete coupling length L is given by:

$$L=\pi/2\beta_c \quad (6)$$

First, when the physical refractive index variable grating is formed, the effective refractive indices $n_1$ and $n_2$ of the first and second waveguides are reduced by the order of $10^{-1}$ if carriers of about $1\times10^{18}$ cm$^{-3}$ are injected. As a result, the propagation constant is lowered and the coupling coefficient or efficiency $\kappa$ is increased.

Where the propagation constant of the first waveguide and the coupling efficiency thereof with the second waveguide are represented by $\beta_{1,inj}$ and $\kappa_{inj}$ when carriers are injected solely into one waveguide, a relation is given:

$$\beta_{1,inj}=\beta_1-\Delta\beta_1 \quad (\Delta\beta_1>0)$$

At this time, when $\Delta$ at the carrier injection time is represented by $\Delta_{inj}$, a relation can be obtained from the relation (2):

$$\Delta_{inj}=\Delta+\Delta\beta_1$$

From the relation (3), a power transfer rate $\eta_{inj}$ at the carrier injection time can be given by:

$$\eta_{inj}=1/(1+(\Delta/\kappa_{inj}+\Delta\beta_{1,inj}/\kappa_{inj})^2)\cdot(\sin\beta_{c,inj}z)^2$$

Therefore, the layer structure can be set so that the following conditions (7-1a) and (7-1b) can be satisfied, for the reason that $\kappa$ increases at the carrier injection time and for some other reasons:

$$\Delta/\kappa\gg 1 \text{ (at carrier non-injection time)} \quad (7\text{-}1a)$$

$$\Delta/\kappa\gg 1 \text{ (at carrier injection time)} \quad (7\text{-}1b)$$

Thus, $\eta_{inj}$ increases and the power of the light beam is transferred from one waveguide to another when carriers are injected, while no power is transferred therebetween at a carrier non-injection time.

When no grating is formed, $\kappa\ll 1$ and hence a relation is established:

$$\Delta/\kappa\gg 1 \text{ (at all times)} \quad (8\text{-}1)$$

Thus, the power transfer does not occur.

On the other hand, when carriers are periodically injected through the periodical current restraint layer, relations are given since K=0 at the carrier non-injection time:

$$\Delta_o=\beta_2-\beta_1 \text{ (at carrier non-injection time)}$$

$$\Delta_{inj}=\beta_{2,inj}-(\beta_{1,inj}+K \text{ (at carrier injection time)} =\Delta_o-K$$

By adjusting $\kappa$ at the carrier non-injection time as $\kappa\ll 1$, relations can be obtained:

$$\Delta/\kappa\gg 1 \text{ (at carrier non-injection time)} \quad (7\text{-}2a)$$

$$\Delta/\kappa\ll 1 \text{ (at carrier injection time)} \quad (7\text{-}2b)$$

Thus, light power is transferred from one waveguide to another waveguide when carriers are injected, while no power is transferred at non-injection time.

If no periodical current restraint layer is formed, the layer structure can be set so that $\kappa\ll 1$ and a relation is established:

$$\Delta/\kappa\gg 1 \text{ (at all times)} \quad (8\text{-}2)$$

Thus, the power transfer does not occur.

In both cases, when the device is one such as an amplifier having a high carrier injection, the carrier injection effect to the refractive index is great and the device is advantageously constructed in its function.

Furthermore, the device can be used as an optical coupler whose light branching ratio between the two waveguides is variable, when another waveguide 86 also has a uniform refractive index variable layer 102 and this layer is controlled independent of the control of a periodical current restraint layer 109 (see FIGS. 6C–6H and 7A–7D). For example, when the first core layer 102 is composed of an ordinary bulk semiconductor and a bias voltage is uniformly applied thereto as shown by the arrow in FIG. 7B, the refractive index thereof increases due to Franz-Keldysh effect as shown in FIG. 7D. In FIGS. 6E–6H and 7A–7D, reference numeral 100 designates a portion in which the carrier density is large, and reference numeral 105 designates an effective grating.

Therefore, when carriers are injected into the periodical current restraint layer 109 as shown in FIGS. 6C and 6D and at the same time a voltage is applied to the first core layer 102, the refractive index of a second core layer 104 in a second waveguide 87 can be periodically changed as shown in FIG. 6H and the refractive index of the first core layer 102 in the first waveguide 86 can be uniformly changed independently as shown in FIG. 7D. As a result, the coupling constant $\kappa$ can be changed while the complete coupling length L is maintained. That is, the branching ratio between first and second waveguides 102 and 104 can be varied.

The principle of variation of the branching ratio will be described in more detail.

The power transfer rate $\eta$ is a function of $\Delta$, $\kappa$ and device length z as is represented by the relation (3), and $\kappa$ and $\Delta$ vary by changing the magnitude of K. If 100% or constant branching (power transfer) is performed, parameters can be optimized relatively readily as described above. It is possible to switch over the branching ratio in principle by changing $\kappa$. However, it is difficult to vary the branching ratio by one control parameter if wavelength dependency should not occur and if the branching ratio should be stably controlled. This problem can be solved if the device length is set to the maximum complete coupling length and the maximum branching ratio can be controlled by another parameter. This is because the influence of a change in the refractive index on the branching ratio is small when the maximum coupling length is established. A new control parameter can be a change in the refractive index of the first waveguide 86, for example, the first core layer 102. As a method of changing the refractive index of the first waveguide 86, in addition to the above method of carrier injection (in this case, the decrease of the refractive index), there exists another method of applying an electric field to change or increase the refractive index via the Franz-Keldysh effect, the Pockels effect, the quantum confinement Stark effect (QCSE) or the like.

A change in the refractive index of the first core layer 102 means a change in $\beta_1$ and $\kappa$. Where $\Delta$ at this time is $\Delta'$, a relation is obtained from the relation (2):

$$\Delta'=\Delta_o'-K$$

In order to change the branching ratio while stable operation is maintained, it is desirable that the maximum coupling length L be constant.

In the relation (6) $L=\pi/2\cdot(\kappa^2+\Delta^2)^{1/2}$, where $\kappa$ and $\Delta$ are $\kappa_e$ and $\Delta_e$ and their change amounts are $\delta\kappa$ and $\delta\Delta$ when carriers are injected into the periodical current restraint layer 109 and at the same time the refractive index of the entire first core layer 102 is uniformly modulated, relations are obtained:

$$\kappa_e = \kappa + \Delta\kappa,$$

$$\Delta_e = \Delta + \delta\Delta,$$

$$L\pi/2 \cdot (\kappa^2 + \Delta^2 + 2\delta\kappa \cdot \kappa + 2\alpha\sigma \cdot \Delta)^{1/2}$$

Here, when the layer structure is fabricated so that the following relation is satisfied:

$$\delta\kappa \cdot \kappa + \sigma\Delta \cdot \Delta \approx 0,$$

the device length can always be set to the maximum coupling length.

At this time, the power transfer rate becomes equal to the maximum transfer rate $\eta_{max}$ and a relation is satisfied:

$$\eta_{max} = 1/(1 + (\Delta_e/\kappa_e)^2)$$

Consequently, the branching ratio can be varied by controlling the value of $\Delta_e/\kappa_e$. The foregoing can be summarized by Table 1 as follows:

TABLE 1

| uniform mod. of index in 1st waveguide 86 | periodical mod. of index in 2nd waveguide 87 | Δ/κ | function |
|---|---|---|---|
| ON/OFF | OFF | >>1 | passing through 1st waveguide with no change |
| ON | ON | ≈1 | branched to 2nd waveguide |
| OFF | ON | <<1 | 100% transfer to 2nd waveguide |

The light branching between one waveguide and outside will be described. When a portion of the propagated light is branched and directed to an external optical fiber or when light is guided to the device from outside, a wave front separation type light beam splitter, which has no wavelength dependency, is produced, especially if the light has a wide wavelength band. When all of the light is branched or the light path is to be changed by 100%, a total reflection mirror is produced. A light splitter, which has a V-shaped sectional shape (its face is 45°), can change the light path at 90° with 100% efficiency.

A loss compensation function will now be described. One or both of the two waveguides can be made of a semiconductor amplifier type gain material to the propagated light so that light lost by light branching can be compensated for.

As described above, when a PN junction is formed above and under the core layer in the semiconductor light waveguide, the device can be used for gain at a wavelength range determined by the core material (i.e., optical amplifier) by injecting carriers thereinto. Therefore, when carriers are injected into the core layer through the periodical refractive index modulating layer, two functions (i.e., change in light intensity distribution and optical amplification) can be simultaneously satisfied.

In the above description, a forward bias voltage is applied to a region of the refractive index modulating layer, but the same effect as above can be obtained by applying a reverse bias voltage thereto to change the refractive index of the waveguide.

These and other objects, features, and advantages of the present invention will become more apparent upon consideration of the following detailed description of the preferred embodiments when read in conjunction with the attached drawings.

BRIEF DESCRIPTION OF THE DRAWINGS

FIGS. 6A–6H are views illustrating relationships between carrier injection and a change in refractive index to describe the principle of the present invention.

DESCRIPTION OF THE PREFERRED EMBODIMENTS

First Embodiment

A first embodiment of an integrated optical device according to the present invention will be described with reference to FIGS. 8 to 10. In this device, three regions are serially arranged along a light propagation direction. Regions I and III are respectively coupler regions, and a region II is a gain region or optical amplifier region. The layer structure in each of the regions I and III is designed so that the above-mentioned relations (7-1a) and (7-1b) are satisfied, while the layer structure of the region I is designed so that the above-mentioned relation (8-1) is satisfied.

Figure 8:
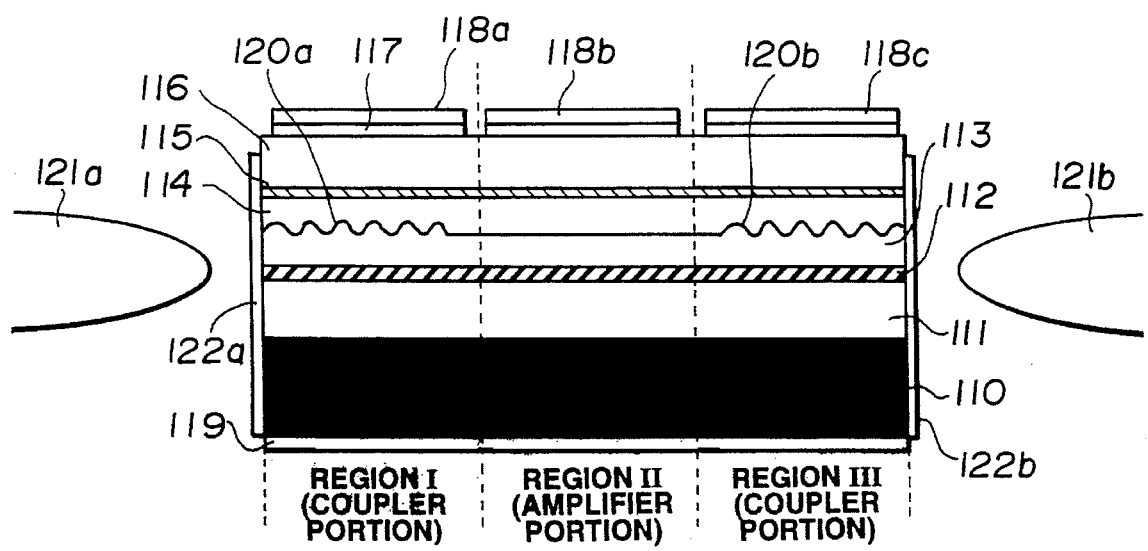
FIG. 8 is a schematic diagram illustrating a first embodiment of the present invention.

In FIG. 8, reference numeral 110 designates an n-type GaAs substrate, reference numeral 111 designates an n-type first cladding layer of $Al_{0.5}Ga_{0.5}As$ having a thickness of 1.5 μm, reference numeral 112 designates an n-type first core layer of $Al_{0.08}Ga_{0.92}As$ having a thickness of 0.1 μm, reference numeral 113 designates an n-type second cladding layer of $Al_{0.5}Ga_{0.5}As$ having a thickness of 0.5 μm, reference numeral 114 designates an n-type third cladding layer of $Al_{0.3}Ga_{0.7}As$ having a thickness of 0.5 μm, reference numeral 115 designates an undoped second core layer of $Al_{0.08}Ga_{0.92}As$ having a thickness of 0.05 μm, reference numeral 116 designates a p-type fourth cladding layer of $Al_{0.05}Ga_{0.05}As$ having a thickness of 1.5 μm, and reference numeral 117 designates a contact layer of GaAs. Further, reference numerals 118a–118c and 119 respectively designate positive and negative electrodes, and reference numeral 120a and 120b respectively designate gratings for modulating a refractive index therearound. In the first embodiment, the wavelength of a propagating light wave is 860 nm, and the gratings 120a and 120b have the shape of a sinusoidal curve with a pitch of 8.5 μm and a depth of 1.2 nm.

Each of the device lengths of the regions I and III (coupler portions) amounts to a complete coupling length (in this embodiment, 500 μm) which is determined from the above-mentioned relation (4), and the device length of the region III (an amplifier portion) is 600 μm. Antireflection (AR) coatings 122a and 122b are respectively provided on input and output facets perpendicular to the light propagation direction. Reference numerals 121a and 121b are respectively tip-rounded optical fibers which are externally disposed.

The operation of the first embodiment will be described with reference to FIGS. 9 and 10. For example, it is assumed that a light beam of wavelength 860 nm is propagated solely along the first core layer 112.

Figure 9:
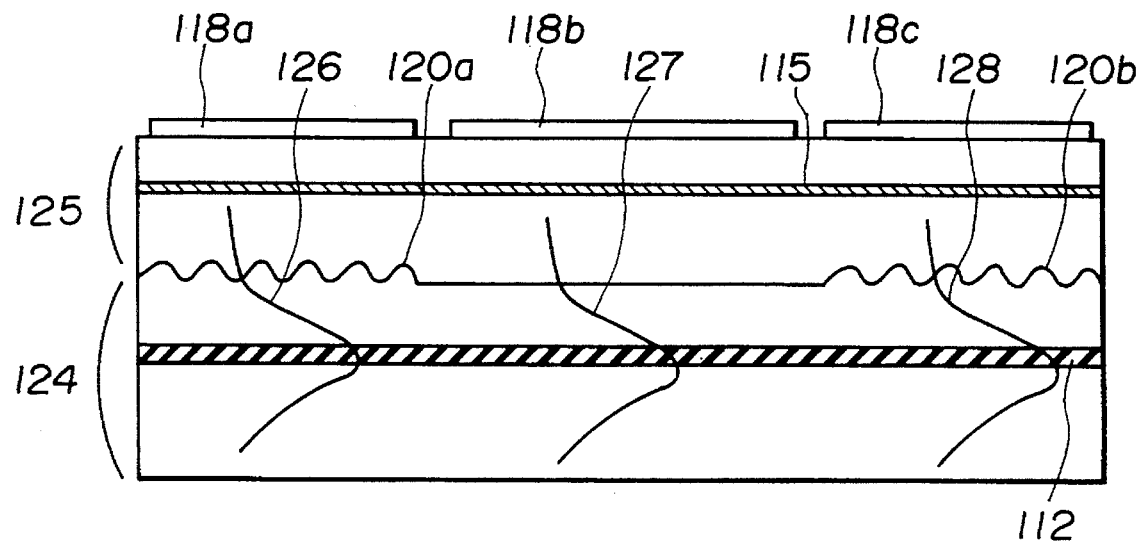
FIG. 9 is a schematic diagram illustrating the operation of the first embodiment of the present invention.

When no current is injected into either regions I–III, a light wave 126 that is input into a first waveguide 124 around the first core layer 112 does not couple whatsoever to the waveguiding mode of a second waveguide 125 around the second core layer 115, as shown in FIG. 9, since the refractive index remains unchanged. Therefore, light waves 127 and 128 are respectively passed through the regions I and III without any change, and the light wave is output.

Figure 10:
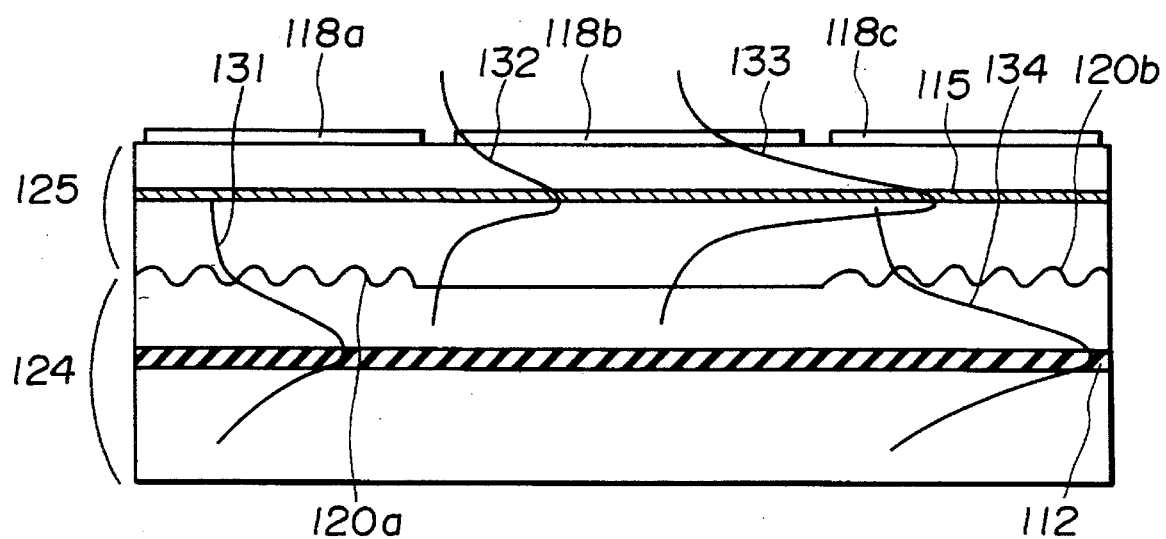
FIG. 10 is a schematic diagram illustrating the operation of the first embodiment of the present invention.

When current is injected into all regions I–III, a light wave 131 that is input into the first waveguide 124 is modulated by the grating 120a and coupled to the second waveguide 125 as shown in FIG. 10. The light wave 131 is thus transferred to the second waveguide 125 at a power transfer rate of 100%, as shown by a light wave 132 in FIG. 10, when propagated the complete coupling length, since the structure is designed so that the transfer rate becomes 100% for the density of the injected current. Since the region II is a gain region, optical amplification is only performed therein and the light intensity is increased as illustrated by a light wave 133. In the region III along which a light wave 134 travels, the light wave is shifted from the second waveguide 125 to the first waveguide 124, similar to the region I, and the light wave 134 is output outward through the AR coating. In the region H, the light wave is never coupled to the first waveguide 124 irrespective of the amount of injected carriers therein, so that the carrier injection amount and the device length of the region II can be selected to achieve a desired optical amplification.

Second Embodiment

Figure 11:
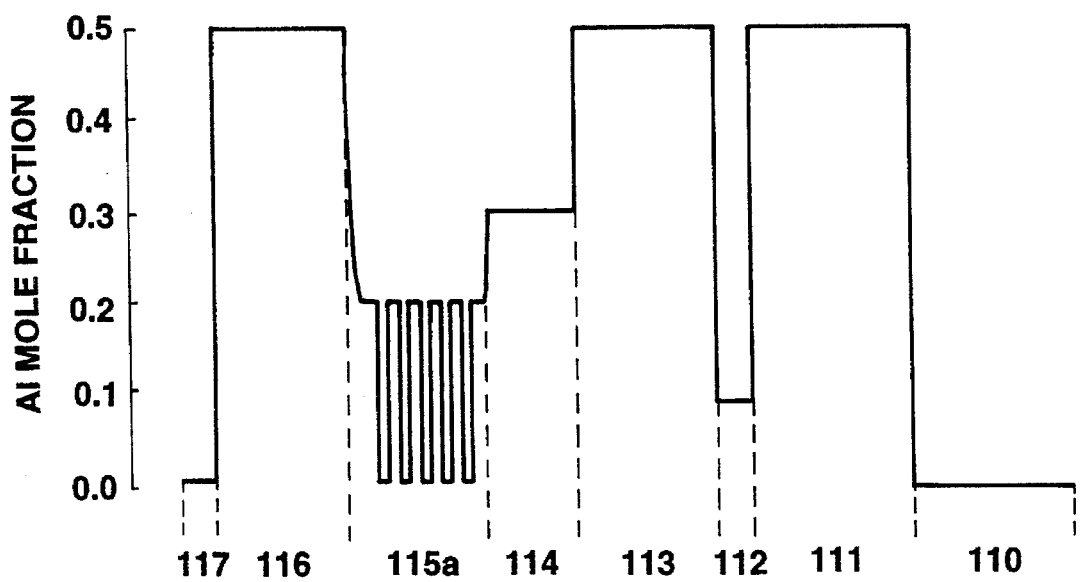
FIG. 11 is a graph illustrating Al mole fractions of layers in a second embodiment of the present invention.
Figure 12:
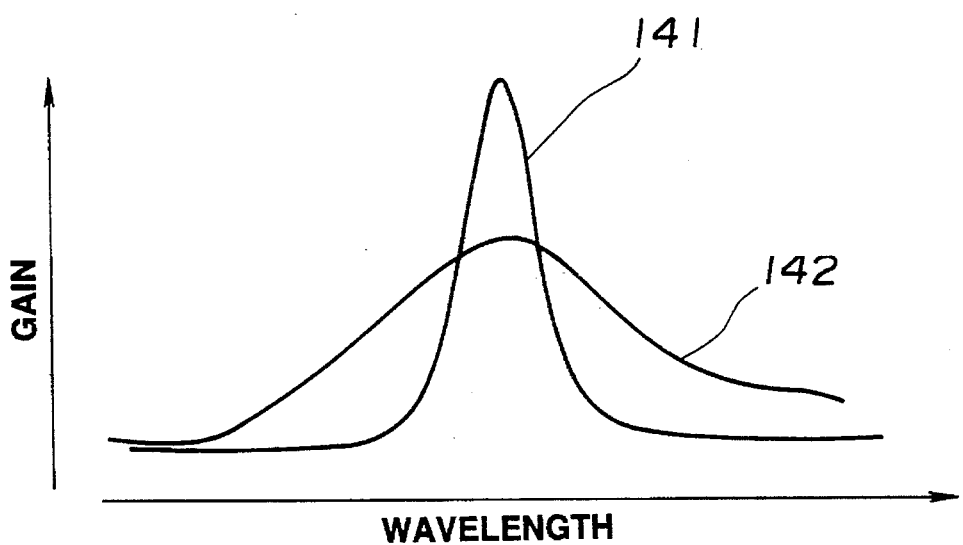
FIG. 12 is a graph illustrating gain spectra of bulk and quantum well layers.

In the first embodiment, a bulk AlGaAs is used as the core layer 115 in the amplifier portion, but a quantum well (QW) layer 115a may also be used. FIG. 11 illustrates Al mole fractions of respective layers 110–114, 115a and 116–117 of the second embodiment. The second core layer 115a, having a multi-quantum well structure, consists of five pairs of $Al_{0.02}Ga_{0.8}As$ barrier layers and GaAs well layers. As a result, the gain spectrum can be narrowed, compared to the first embodiment, and at the same time the gain can be increased. FIG. 12 graphically illustrates a gain spectrum 142 of the bulk structure, and a gain spectrum 141 of the multi-quantum well structure, when the injection level of carriers is made equal to each other. The other aspects of the second embodiment are the same as the first embodiment.

Third Embodiment

Figure 16:
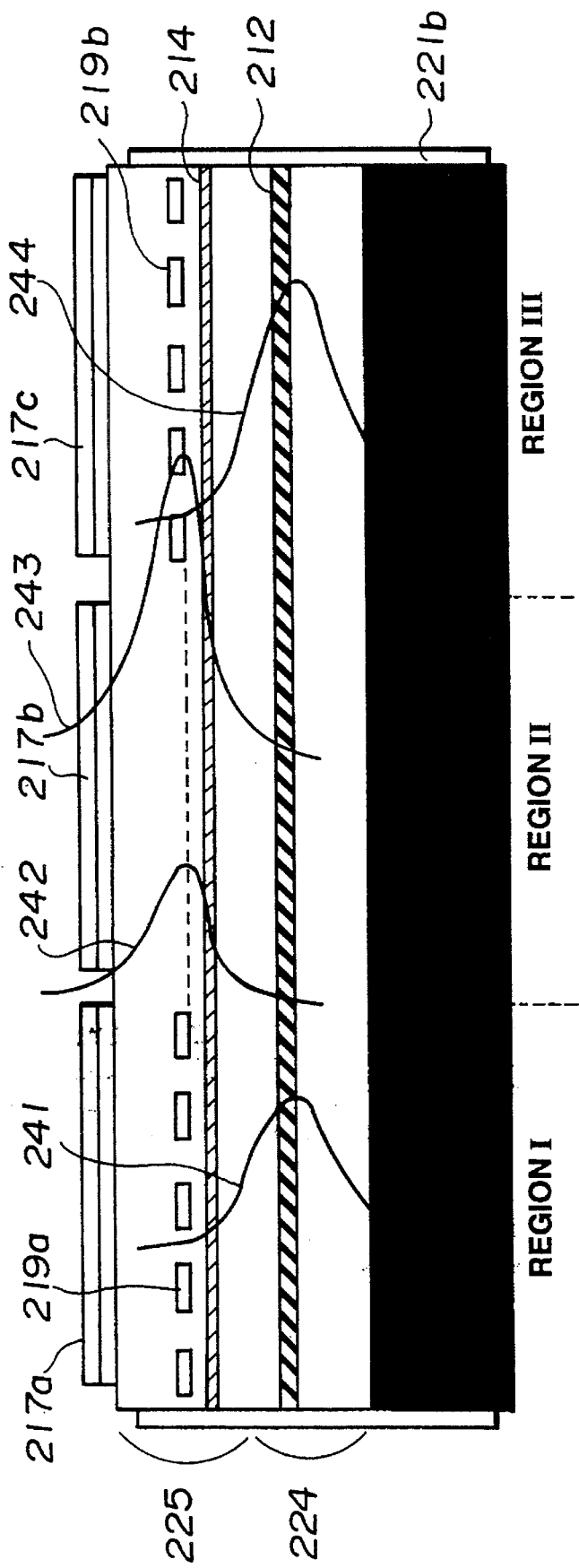
FIG. 16 is a schematic diagram illustrating the operation of the third embodiment of the present invention.

A third embodiment of an integrated optical device according to the present invention will be described with reference to FIGS. 13 and 16. In this device, three regions are serially arranged along a light propagation direction. Regions I and III are respectively coupler regions, and a region II is a gain region or an optical amplifier region. The layer structure in each of the regions I and III is designed so that the above-mentioned relations (7-2a) and (7-2b) are satisfied, while the layer structure of the region II is designed so that the relation (8-2) is satisfied.

Figure 13:
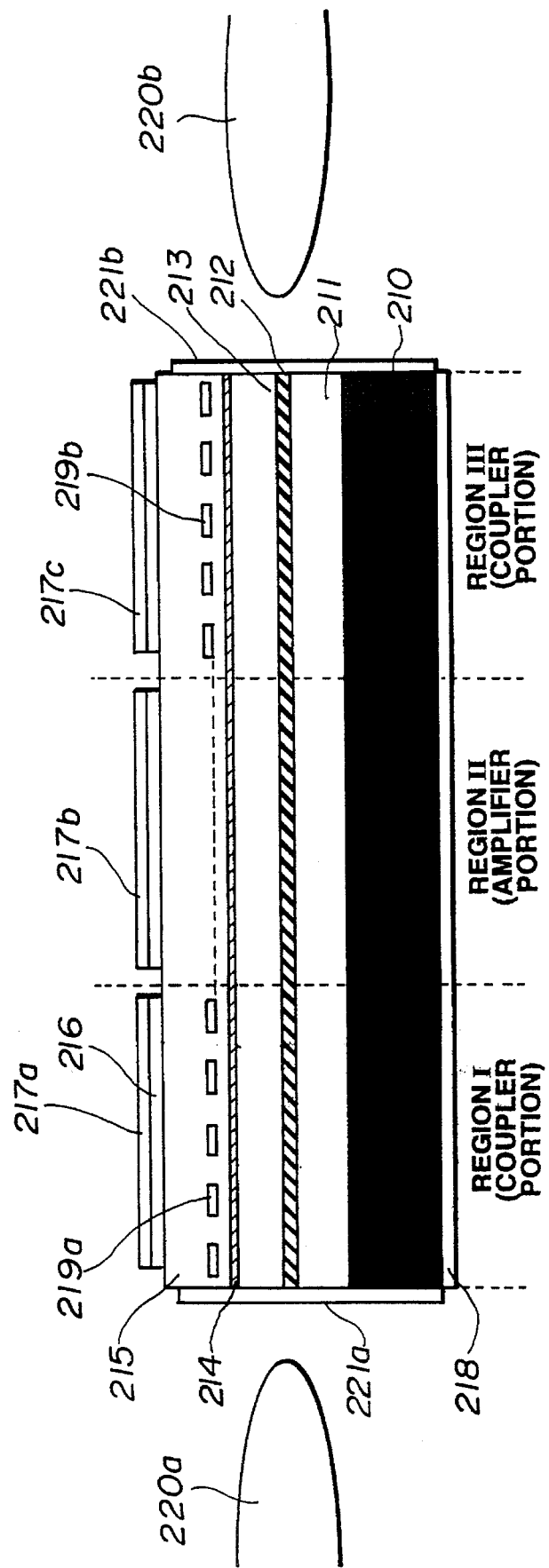
FIG. 13 is a schematic diagram illustrating a third embodiment of the present invention.

In FIG. 13, reference numeral 210 designates an n-type GaAs substrate, reference numeral 211 designates an n-type first cladding layer of $Al_{0.5}Ga_{0.5}As$ having a thickness of 1.5 µm, reference numeral 212 designates an n-type first core layer of $Al_{0.08}Ga_{0.92}As$ having a thickness of 0.1 µm, reference numeral 213 designates an n-type second cladding layer of $Al_{0.05}Ga_{0.5}As$ having a thickness of 0.5 µm, reference numeral 214 designates an undoped second core layer of $Al_{0.08}Ga_{0.92}As$ having a thickness of 0.05 µm, reference numeral 215 designates a p-type third cladding layer of $Al_{0.5}Ga_{0.5}As$ having a thickness of 1.5 µm, and reference numeral 216 designates a contact layer of GaAs. Further, reference numerals 217a–217c and 218 respectively designate positive and negative electrodes, and reference numerals 219a and 219b respectively designate periodical current restraint layers for modulating a refractive index. In the third embodiment, the wavelength of a propagating light wave is 860 nm, and the gratings of the periodical current restraint layers 219a and 219b have a rectangular shape with a pitch of 8.5 µm and a duty of 50%.

Each of the device lengths of the regions I and III (coupler portions) is a complete coupling length (in this embodiment, 500 µm) which is determined from relation (4), and the device length of the region II (an amplifier portion) is 600 µm. Antireflection (AR) coatings 221a and 221b are respectively provided on input and output facets perpendicular to the light propagation direction. Reference numerals 220a and 220b are respectively tip-rounded optical fibers which are respectively disposed facing the AR coatings 221a and 221b.

The fabrication method of the third embodiment will be described. Initially, layers from the first cladding layer 211 up to the second core layer 214 are consecutively grown on the (100) n-type GaAs substrate 210, using, for example, an ordinary metal organic-chemical vapor deposition (MOCVD) method or a molecular beam epitaxy (MBE). After the growth of the second core layer 214, a p-type $Al_{0.5}Ga_{0.5}As$ layer having a thickness of 0.3 µm and a carrier concentration p≈3×10$^{17}$ cm$^{-3}$ and an n-type $Al_{0.5}Ga_{0.5}As$ layer having a thickness of 0.5 µm and a carrier concentration n≈3×10$^{17}$ cm$^{-3}$ are formed. Then, as described above, a grating pattern of a pitch 8.5 µm is formed by etching so that its depth reaches the p-type $Al_{0.5}Ga_{0.5}As$ layer. After that, a p-type $Al_{0.5}Ga_{0.5}As$ layer having a thickness of 0.7 µm and a carrier concentration p≈3×10$^{17}$ cm$^{-3}$ is grown using the MOCVD method.

The carrier concentration is set at about 3×10$^{17}$ cm$^{-3}$ so that a difference in the refractive index would not occur in layer 215 during the non-carrier injection time. Thus, the periodical current restraint layers 219a and 219b can be formed. Then, the contact layer 216 is grown on the layer 215.

Figure 14:
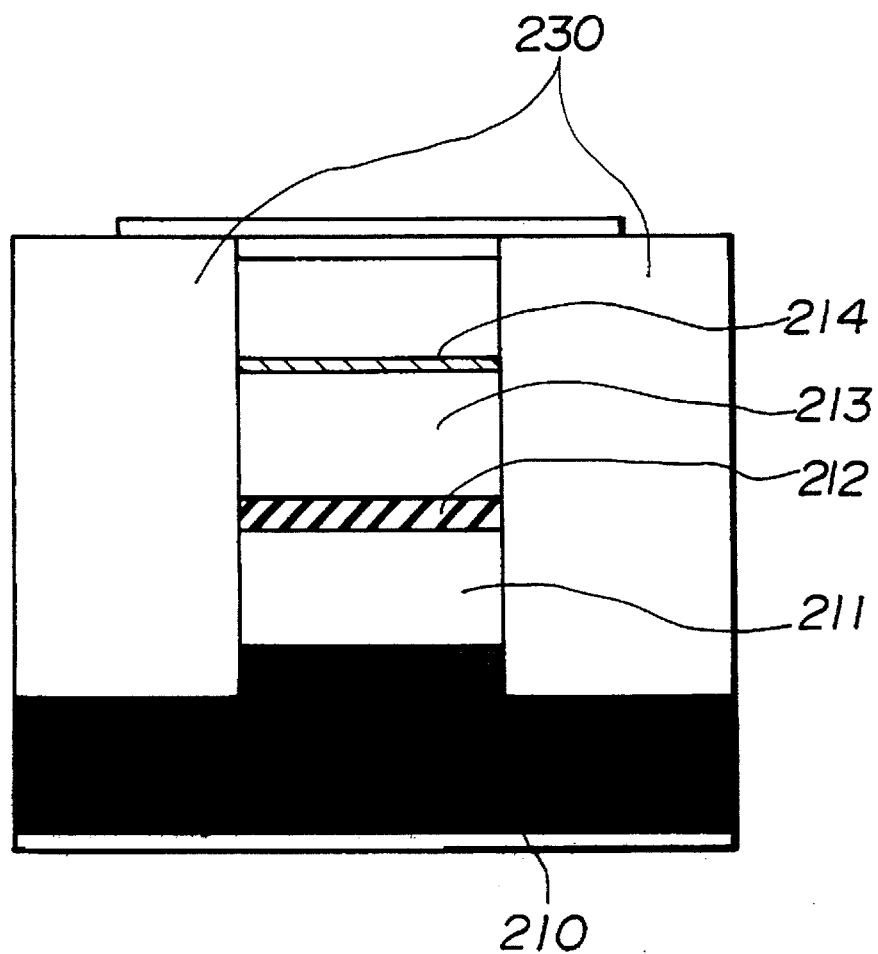
FIG. 14 is a cross-sectional schematic diagram of the third embodiment of the present invention.

After the fabrication of a buried structure or the like for controlling a transverse mode of light, the electrodes 217a–217c and 218 are formed. Thus, the third embodiment is obtained. FIG. 14 is a cross-sectional view of FIG. 13 for showing the transverse section of the structure shown in FIG. 13. In FIG. 14, reference numeral 230 designates an $Al_{0.5}Ga_{0.5}As$ high-resistance burying layer. This structure is for controlling the transverse mode and may be used in other embodiments including the above-discussed embodiments.

The operation of the third embodiment will be described with reference to FIGS. 15 and 16. For the example, it will be assumed that a light beam having a wavelength of 860 nm is propagated solely along the first core layer 212.

Figure 15:
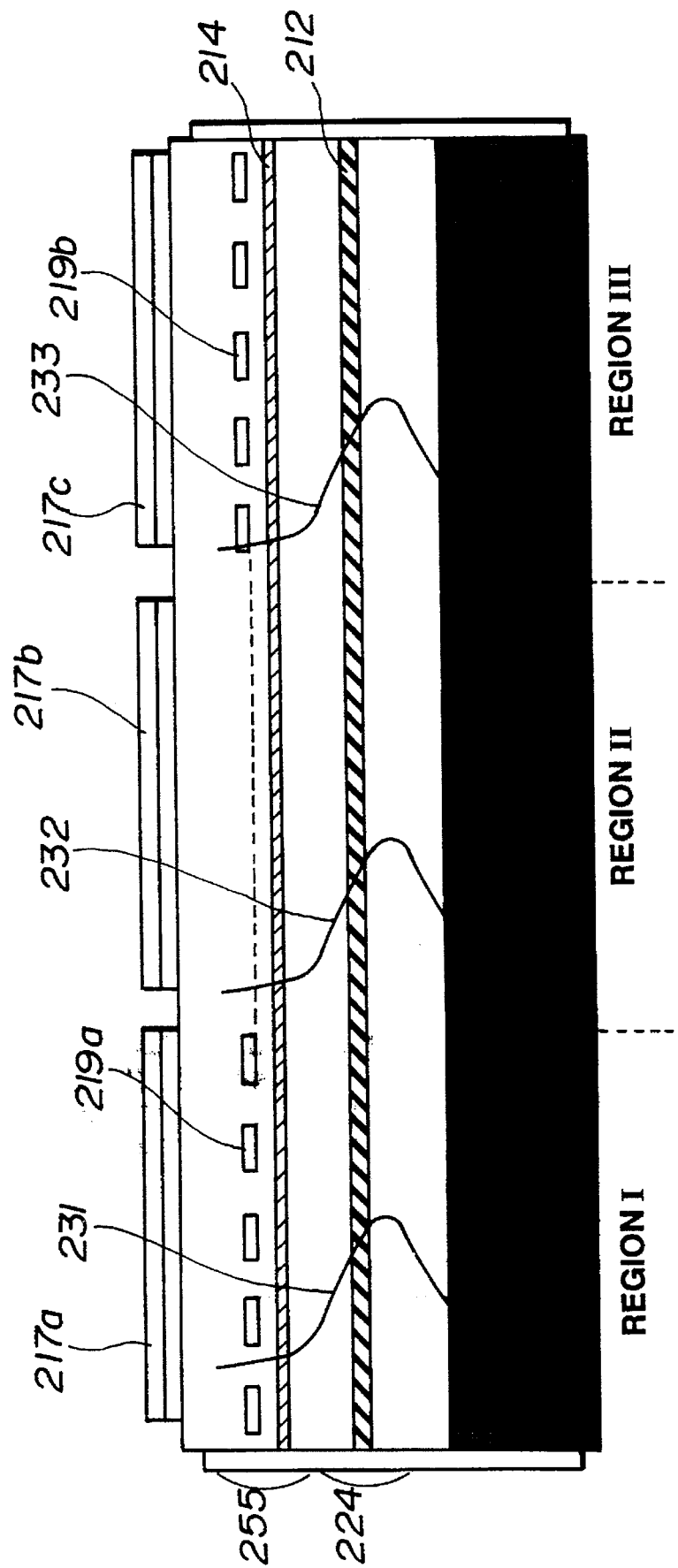
FIG. 15 is a schematic diagram illustrating the operation of the third embodiment of the present invention.

When no current is injected into either regions I–III, a light wave 231, which is input into a first waveguide 224 located around the first core layer 212, does not couple whatsoever to the waveguiding mode of a second waveguide 225 located around the second core layer 214, as shown in FIG. 15, since the refractive index around the periodical current restraint layer 219a remains unchanged. Therefore, light waves 232 and 233 are respectively passed through the regions II and III without any change, and the light wave is output (failure-safety function).

When current is injected into all regions I–III, a density distribution of carriers that are injected through the positive electrode 217a is modulated by the periodical current restraint layer 219a, and a modulated carrier density distribution is created in the second core layer 214. Corresponding to the thus-formed modulated carrier distribution, an equivalent refractive index distribution is produced. Therefore, a light wave 241 that is input into the first waveguide 224 is modulated by the periodical current restraint layer 219a and coupled to the second waveguide 225, as shown in FIG. 16. The light wave 241 is transferred to the second waveguide 225 at a power transfer rate of 100%, as shown by a light wave 242 in FIG. 16, when propagated a complete coupling length, since the structure is designed so that the transfer rate becomes 100% for the density of injected current. Although the carriers that are passed through the second core layer 214 flow into the first core layer 212, the refractive index in the first core layer 212 would not be modulated since no PN junction exists in the first core layer 212 and a diffusion effect and an injection effect of carriers are low therein.

Since the region II is a gain region, only optical amplification is performed therein and the light intensity is increased as illustrated by a light wave 243. In the region III along which a light wave 244 travels, the light wave is shifted from the second waveguide 225 to the first waveguide 224, similar to the region I, and the light wave 244 is output through the AR coating 221b. In the region II, the light wave would not be coupled to the first waveguide 224 irrespective of the amount of injected carriers, so that the carrier injection amount and the device length of the region II can be selected to achieve a desired optical amplification.

Though the n-type substrate is used in the third embodiment, there may be a case where a p-type substrate is advantageously utilized since the diffusion length varies depending on the conduction type of carriers.

Fourth Embodiment

Figure 17:
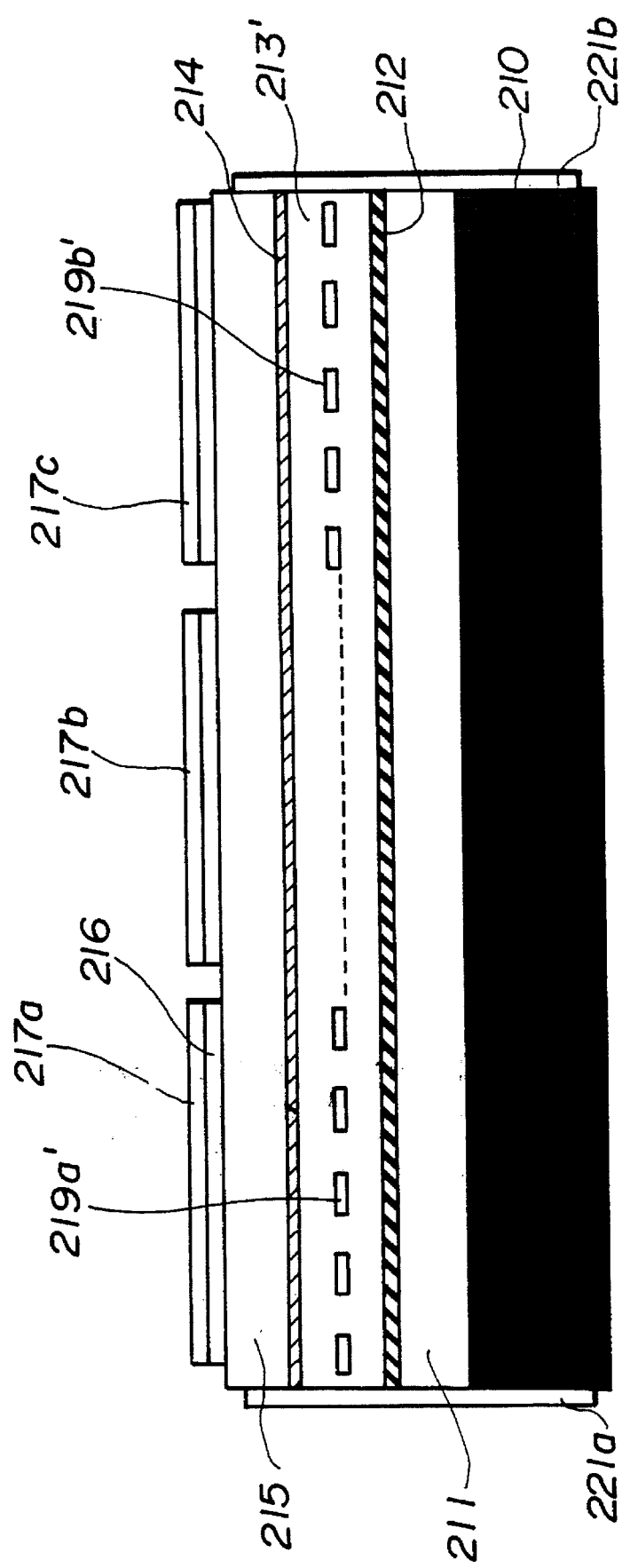
FIG. 17 is a schematic diagram illustrating a fourth embodiment of the present invention.

A fourth embodiment of an integrated optical device of the present invention will be described with reference to FIG. 17. The fourth embodiment is different from the third embodiment in that periodical current restraint layers 219a' and 219b' are formed in the second cladding layer 213'.

As a result, the following effects can be obtained:

(1) Even when the same grating pattern as that of the third embodiment is used in this embodiment, the carrier density distribution in the second core layer 214 during carrier injection time differs from that of the third embodiment. Namely, effective gratings are different between the third and fourth embodiments;

(2) The carrier density distribution can be induced even in the first core layer 212, depending on the location of the periodical current restraint layers 219a' and 219b'; and (3) A more advanced fabrication technique is required to form the second core or gain layer 214 in the fourth embodiment than the third embodiment, since the layer 214 is formed using a regrowth method.

By positively utilizing the effect (2) and making the first core layer 212 of a gain material, greater coupling of light can be attained. In this case, however, the gain material may be a lossy material when no carrier is injected. The other structure and operation of the fourth embodiment are the same as those of the third embodiment.

Fifth Embodiment

Figure 18:
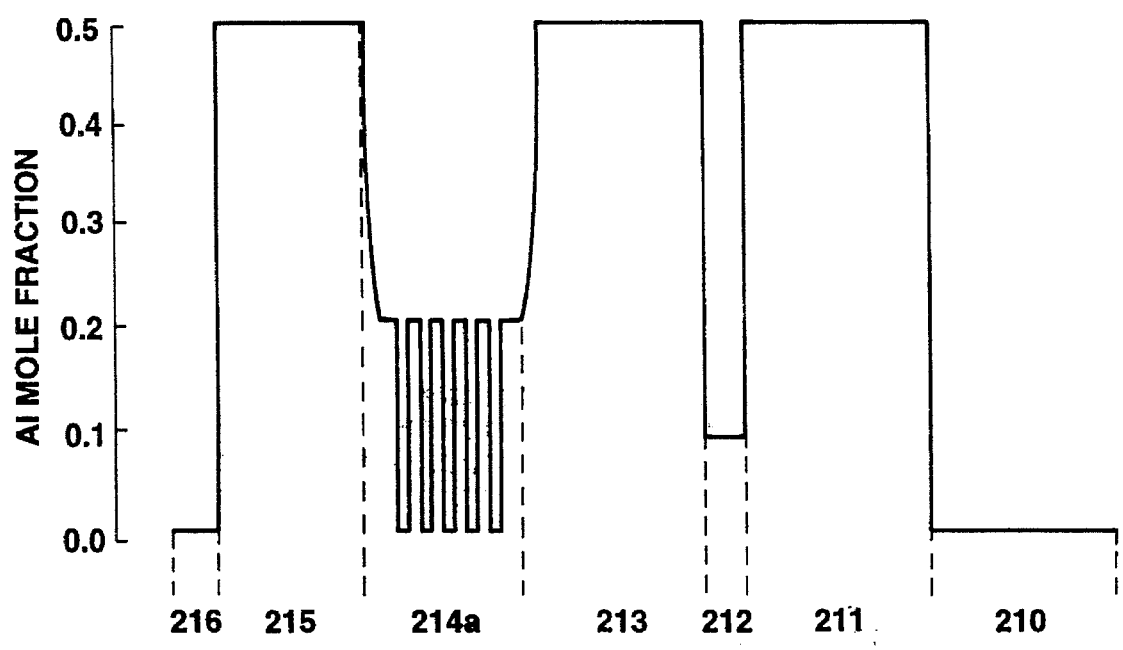
FIG. 18 is a graph illustrating Al mole fractions of layers in a fifth embodiment of the present invention.

In the third and fourth embodiments, a bulk AlGaAs layer is used as the core layer 214 in the amplifier portion, but a quantum well (QW) layer 214a may be used therefor as well. FIG. 18 illustrates Al mole fractions of respective layers 210–213, 214a and 215–216 of this embodiment. The second core layer 214a having a multi-quantum well structure consists of five pairs of $Al_{0.2}Ga_{0.8}As$ barrier layers and GaAs well layers. As a result, the gain spectrum can be narrowed, compared to the third and fourth embodiments, and at the same time the gain can be increased. FIG. 12 also schematically illustrates the gain spectrum 142 of the bulk structure and the gain spectrum 141 of the multi-quantum well structure of this embodiment when the injection level of carriers is made equal to each other. Further, a strained quantum well layer may be used as the second core layer 214a. In this case, it is possible to impart the same gain to both TE (transverse electric) and TM (transverse magnetic) modes so that a polarization independent laser diode amplifier (LDA) can be obtained. The other aspects of the fifth embodiment are the same as those of the third and fourth embodiments.

Sixth Embodiment

A sixth embodiment of an integrated optical device according to the present invention will be described with reference to FIGS. 19 to 22. In this device, three regions are serially arranged along the light propagation direction. Regions I and III are respectively optical coupler/amplifier regions, and a region II is an optical splitter region. The layer structure in each of the regions I and III is designed so that the relations (7-2a) and (7-2b) are satisfied, while the layer structure of the region II is designed so that the relation (8-2) is satisfied.

Figure 19:
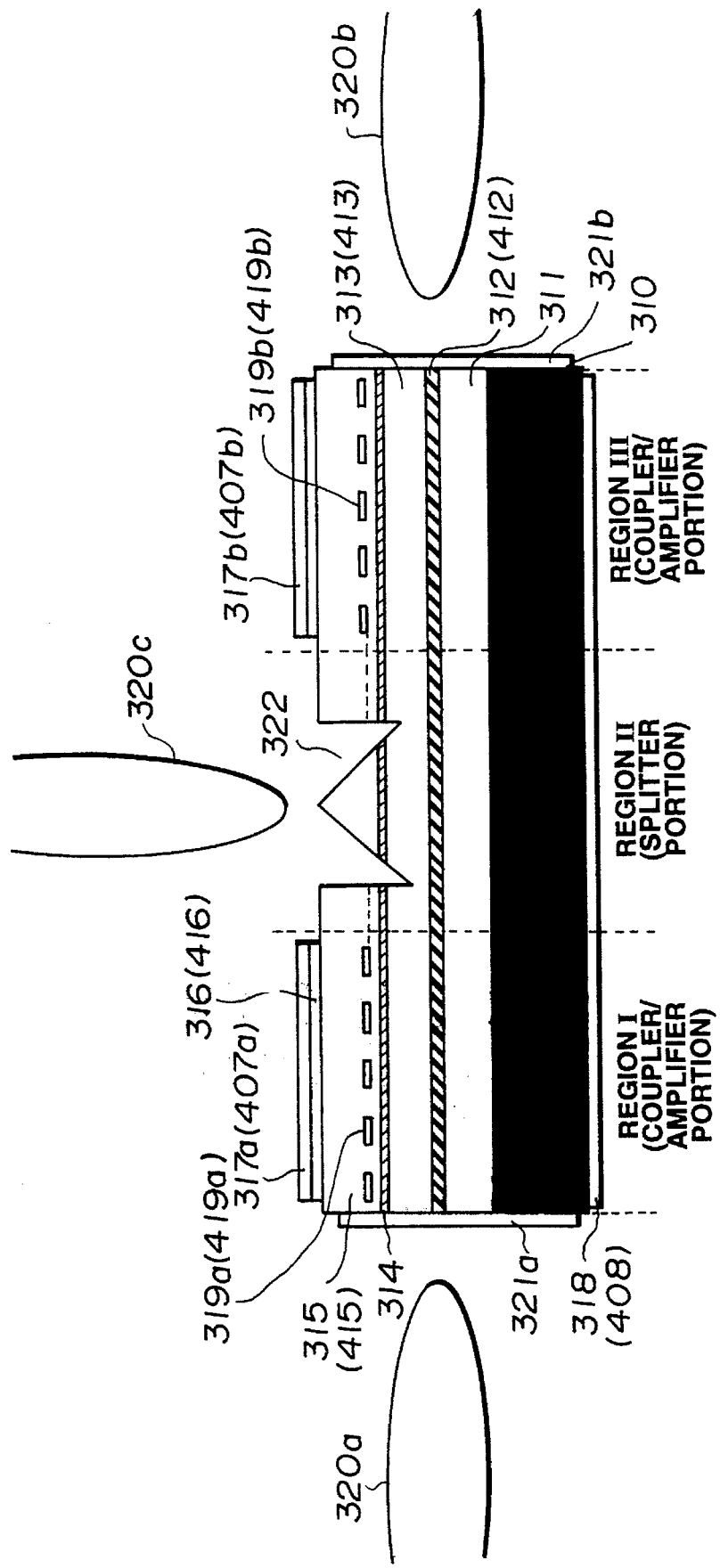
FIG. 19 is a schematic diagram illustrating sixth and eleventh embodiments of the present invention.

In FIG. 19, reference numeral 310 designates an n-type GaAs substrate, reference numeral 311 designates an n-type first cladding layer of $Al_{0.5}Ga_{0.5}As$ having a thickness of 1.5 μm, reference numeral 312 designates an n-type first core layer of $Al_{0.08}Ga_{0.92}As$ having a thickness of 0.1 μm, reference numeral 313 designates an n-type second cladding layer of $Al_{0.5}Ga_{0.5}As$ having a thickness of 0.5 μm, reference numeral 314 designates an undoped second core layer of $Al_{0.08}Ga_{0.92}As$ having a thickness of 0.05 μm, reference numeral 315 designates a p-type third cladding layer of $Al_{0.5}Ga_{0.5}As$ having a thickness of 1.5 μm, and reference numeral 316 designates a contact layer of GaAs. Further, reference numerals 317a–317b and 318 respectively designate positive and negative electrodes, and reference numeral 319a and 319b respectively designate periodical current restraint layers for modulating a refractive index. In the sixth embodiment, the wavelength of a propagating light wave is 860 nm, and the gratings of the periodical current restraint layers 319a and 319b have a rectangular shape having a pitch of 8.5 μm and a duty of 50%.

Each of device lengths of the regions I and III (coupler/amplifier portions) is a complete coupling length (in this embodiment, 500 μm) which is determined from the relation (6), and the device length of the region II (splitter portion) is 200 μm. AR coatings 321a and 321b are respectively provided on input and output end faces perpendicular to the light propagation direction.

In the region II or splitter portion, a pair of grooves 322, whose cross-sectional shape is a right-angled isosceles triangle, are formed to change a path of a waveguiding light wave upward by 100%. For this purpose, the depth of the grooves 322 sufficiently reaches the second cladding layer 314 and are formed perpendicular to a second waveguide 325 (see FIG. 20).

Reference numerals 320a–320c are respectively tip-rounded optical fibers which are respectively disposed facing the AR coatings 321a and 321b and the pair of the grooves 322.

The fabrication method of the sixth embodiment will be described. Initially, layers from the first cladding layer 311 up to the second core layer 314 are consecutively grown on the (100) n-type GaAs substrate 310, using, for example, ordinary MOCVD method or MBE growth method. After the growth of the second core layer 314, a p-type $Al_{0.5}Ga_{0.5}As$ layer having a thickness of 0.3 μm and a carrier concentration p≈$3\times10^{17}$ cm$^{-3}$, which is a layer under the layer for modulating the refractive index in the third cladding layer 315, and an n-type $Al_{0.5}Ga_{0.5}As$ layer having a thickness of 0.5 μm and a carrier concentration n≈$_e3\times10^{17}$ cm$^{-3}$, which is a part of the layer for modulating the refractive index or current restraint layer, are formed. Then, as described above, a grating pattern of a pitch 8.5 μm is formed by etching so that its depth reaches the p-type $Al_{0.5}Ga_{0.5}As$ layer. After that, a p-type $Al_{0.5}Ga_{0.5}As$ layer having a thickness of 0.7 μm and a carrier concentration p≈$3\times10^{17}$ cm$^{-3}$, which is a part of the third cladding layer or current restraint layer, is grown using the MOCVD method.

The carrier concentration is set at about $3\times10^{17}$ cm$^{-3}$ so that a difference in the refractive index would not occur in layer 315 during non-carrier injection time. Thus, the periodical current restraint layers 319a and 319b can be obtained. Then, the contact layer 316 is grown.

Next, the pair of the grooves 322 are formed in the region II, using dry etching or the like. In this embodiment, each groove 322 includes a combination of ordinary 0° mirror and 45° mirror for the connection with the external optical fiber 320c.

After the fabrication of a buried structure or the like for controlling a transverse mode of light, the electrodes 317a–317b and 318 are respectively formed in the regions I and III and on the bottom surface of the substrate 310. The buried structure consists of $Al_{0.5}Ga_{0.5}As$ high-resistance burying layers, similar to the embodiment shown in FIG. 14. Thus, the third embodiment is obtained.

The operation of the sixth embodiment will be described with reference to FIGS. 20 to 22. For example, it is assumed that a light beam of wavelength 860 nm is input from the fiber 320a at the left side and propagated solely along the first core layer 312. The first core layer 312 is made of a material which is transparent to the propagated light wave.

Figure 20:
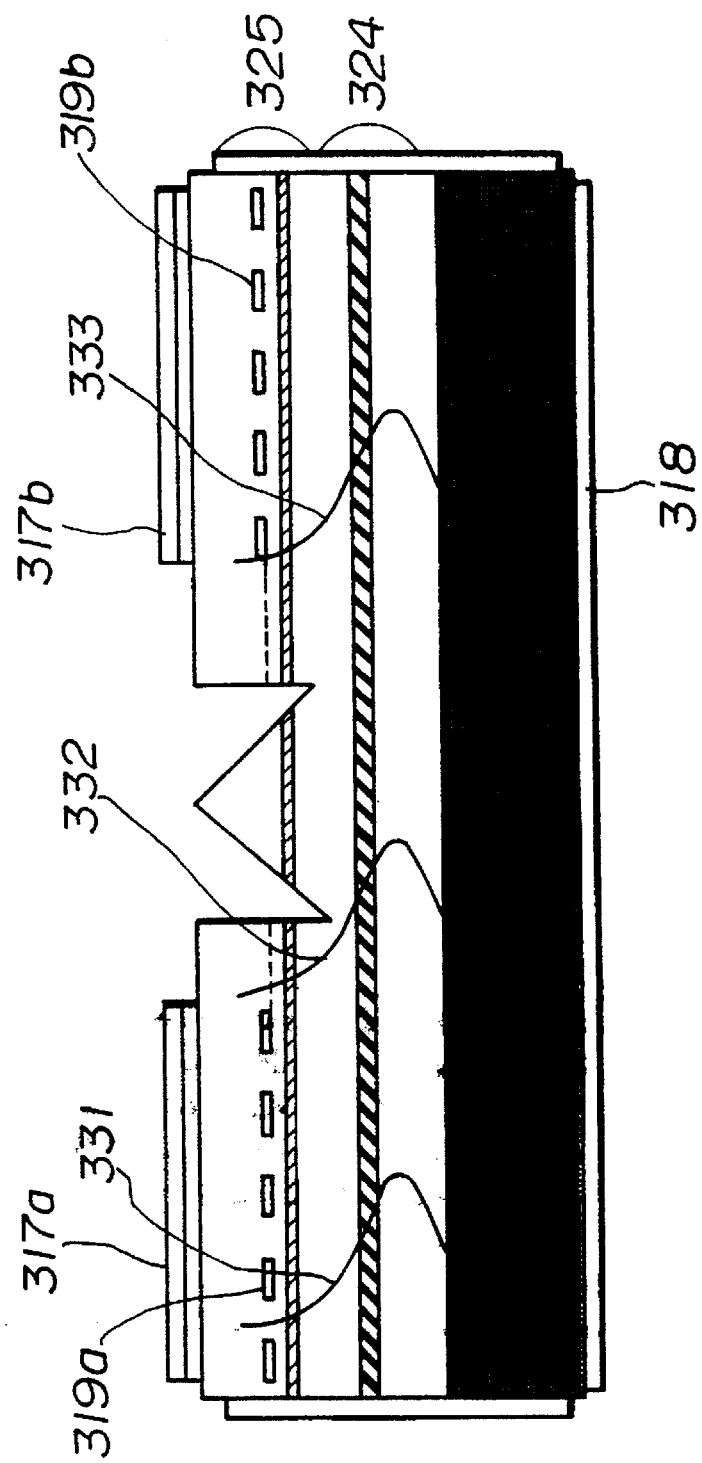
FIG. 20 is a schematic diagram illustrating the operation of the sixth embodiment of the present invention.

When no current is injected into either regions I–III, a light wave 331, which is input into the first waveguide 324, does not couple whatsoever to the waveguiding mode of the second waveguide 325, as shown in FIG. 20, since the refractive index near the periodical current restraint layer 319a remains unchanged. Therefore, light waves 332 and 333 are respectively passed through regions II and III without any change, and the light wave is output. This is the above-discussed failure-safety function.

When current is injected into regions I and III, a density distribution of carriers that are injected through the positive electrode 317a is modulated by the periodical current restraint layer 319a and a modulated carrier distribution is created in the second core layer 314. Corresponding to the thus-formed modulated carrier distribution, an equivalent refractive index distribution is produced in the second core layer 314. Therefore, a light wave 341, which is input into the first waveguide 324, is modulated by the periodical current restraint layer 319a and coupled to the second waveguide 325, as shown in FIG. 21. The light wave 341 is transferred to the second waveguide 325 at a power transfer rate of 100%, as shown by a light wave 342 in FIG. 21, when propagated a complete coupling length, since the structure is designed so that the transfer rate becomes 100% for the density of the injected current. Although carriers passed through the second core layer 314 flow into the first core layer 312, the refractive index in the first core layer 312 would not be modulated since no PN junction exists in the first core layer 312 and a diffusion effect and an injection effect of carriers are low therein.

In the region H, the propagated light wave is guided outward by the V-shaped groove 322 and reflected upward toward the optical fiber 320c by the 45° mirror surface of the groove 322. Since the groove 322 is etched down to the second cladding layer 313 in this embodiment, the propagated light wave 342 is picked outward with 100% efficiency. Therefore, this light wave can be output by the optical fiber 320c or an optical system including an appropriate lens, and no light wave travels into the region III. A portion of the propagated light wave 342 can be output upward and the other portion of the wave 342 can be guided to the region III, by controlling the depth of the groove 322.

Figure 21:
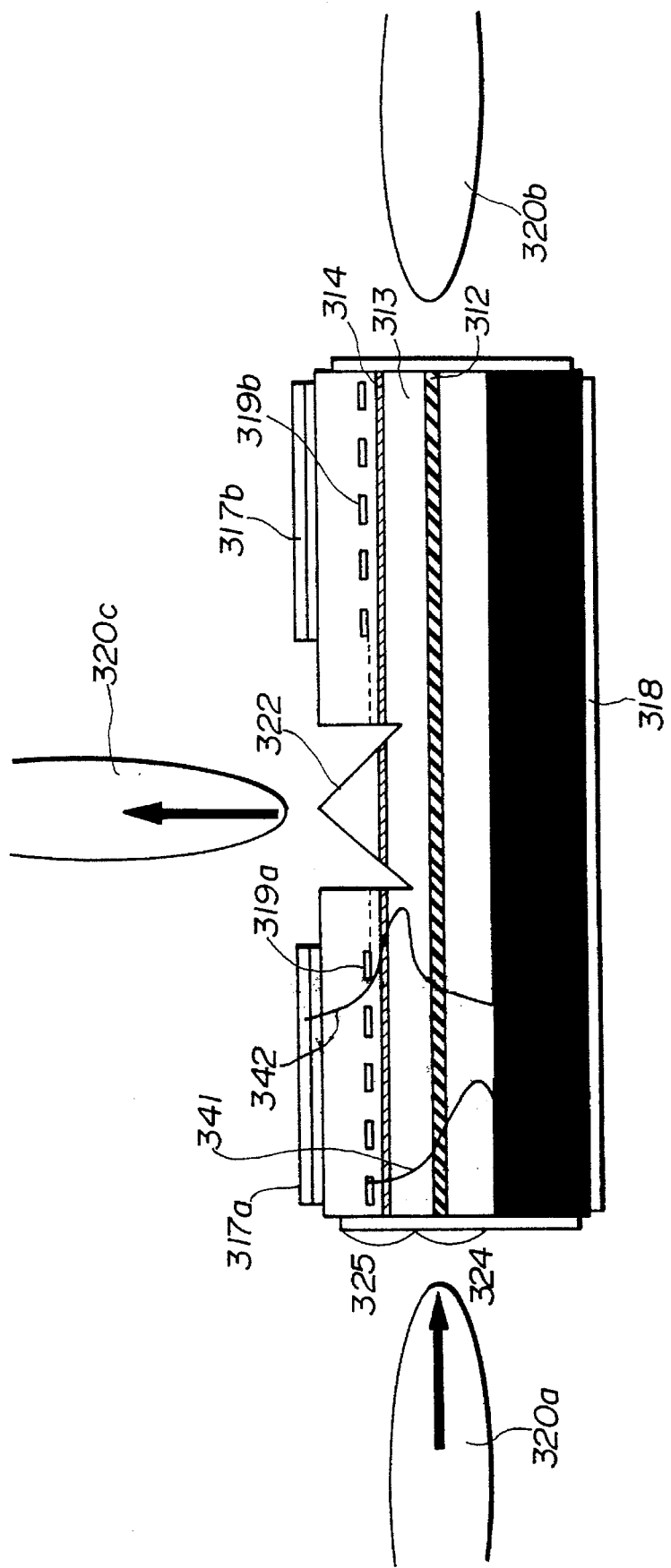
FIG. 21 is a schematic diagram illustrating the operation of the sixth embodiment of the present invention.

Although the shift of the propagated light wave is described only for the light input from the left side in FIG. 21, the same operation can also be performed for light input from an opposite direction, since the device of the sixth embodiment is fabricated symmetrically with respect to right and left directions.

Figure 22:
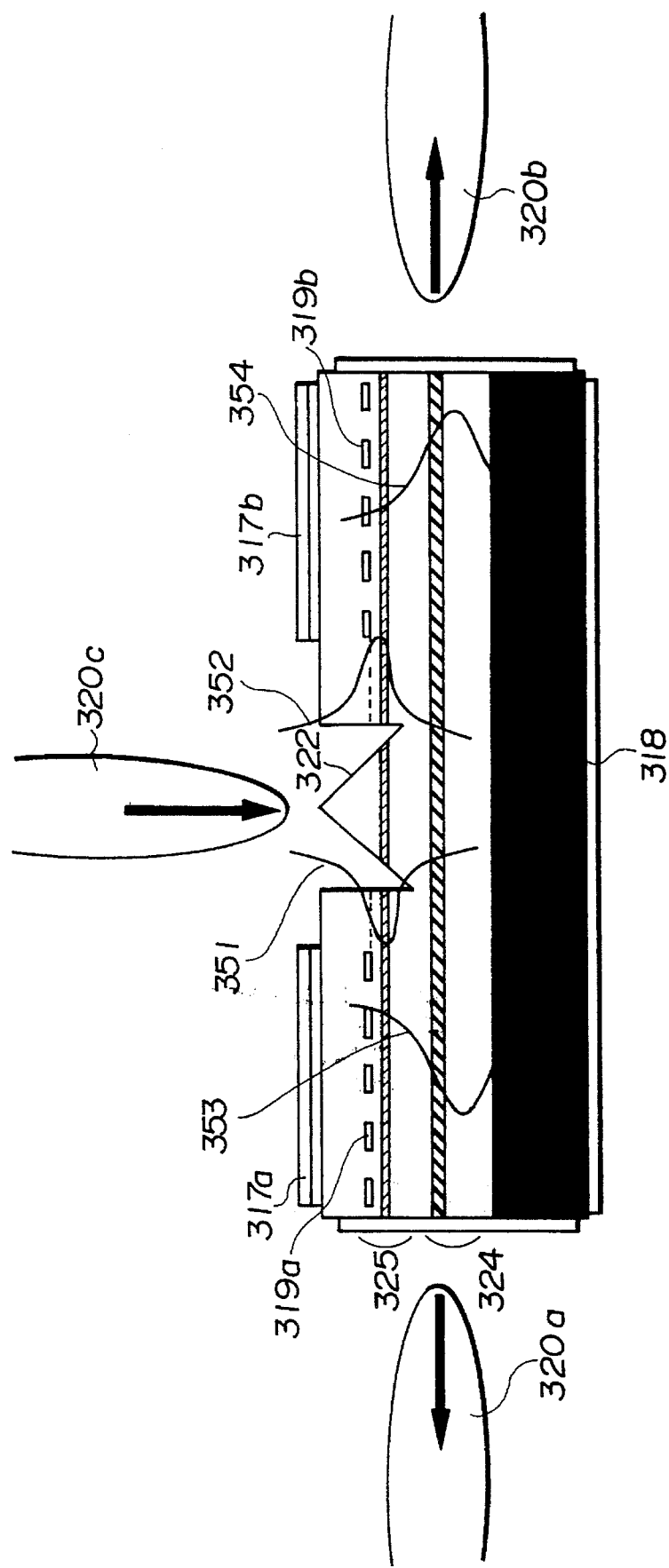
FIG. 22 is a schematic diagram illustrating the operation of the sixth embodiment of the present invention.

Conversely, when light is input from the fiber 320c to the pair of the grooves 322, the light wave is split by the optical splitter consisting of the grooves 322 and light waves 351 and 352 are respectively propagated in opposite directions as shown in FIG. 22. The light waves 351 and 352 are respectively shifted from the second waveguide 325 to the first waveguide 324 when current is injected into the regions I and III (ON state). When no current is injected into those regions I and III (OFF state), those light waves 351 and 352 are diverged outward, but not transferred to the first waveguide 324 and not coupled to the optical fibers 320a and 320b. Thus, the input light can be either output into the optical fibers 320a and 320b or diverged, depending on whether a region is in an on or off state. One of the regions I and III can be brought into the ON state while the other one is in the OFF state.

When the light waves 351 and 352 respectively reach the regions I and III, the light waves are transferred to the first waveguide 324, as shown by light waves 353 and 354 in FIG. 22. At the same time the light waves 353 and 354 are amplified when regions I and III are both in the ON state, since the core layers 312 and 314 are made of a gain material. Thus, coupling loss and branching loss at the time of the incidence on the V-shaped grooves 322 can be compensated for (loss compensation).

Seventh Embodiment

Figure 23:
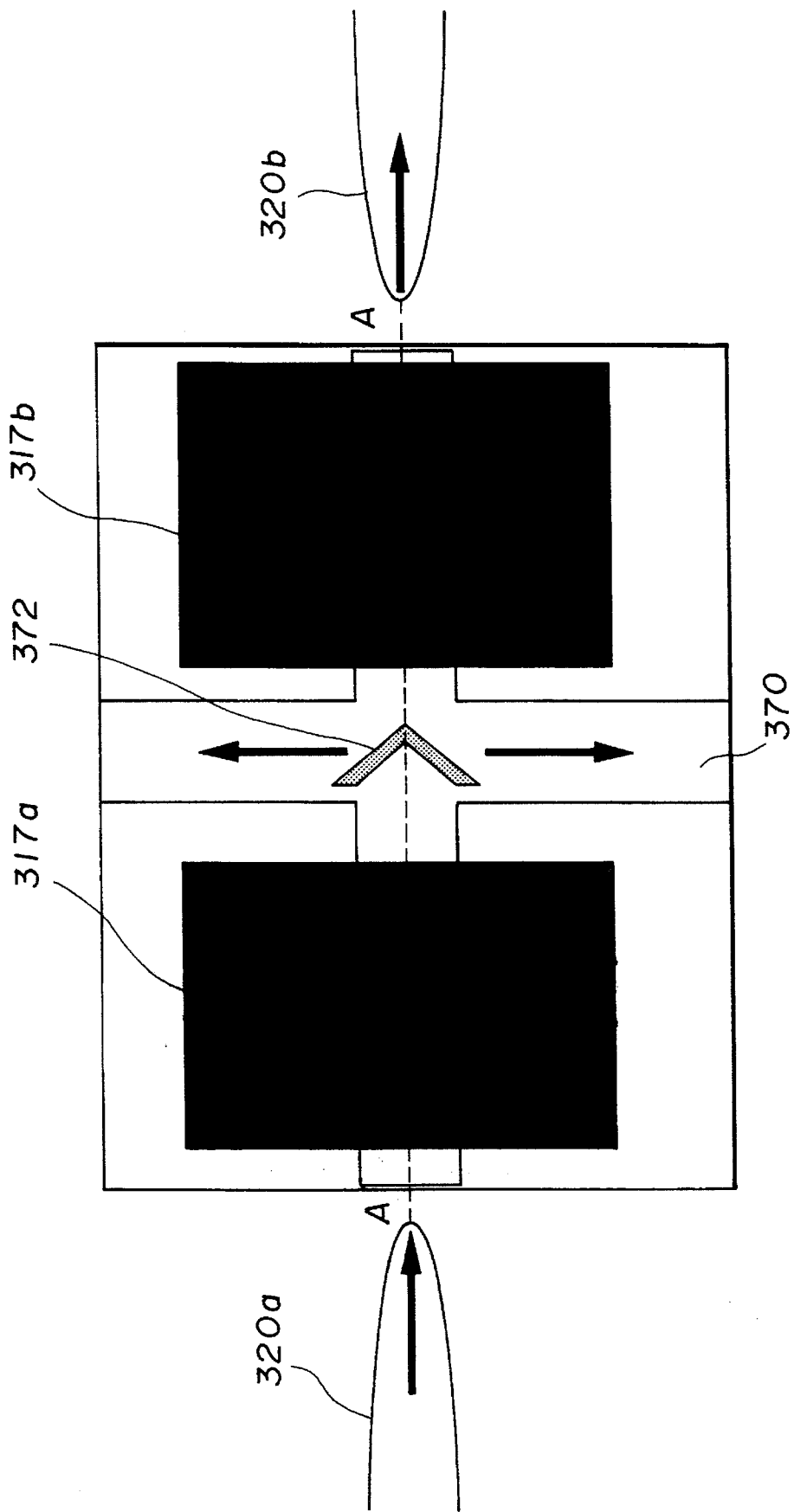
FIG. 23 is a plan schematic diagram illustrating seventh and eleventh embodiments of the present invention.
Figure 24:
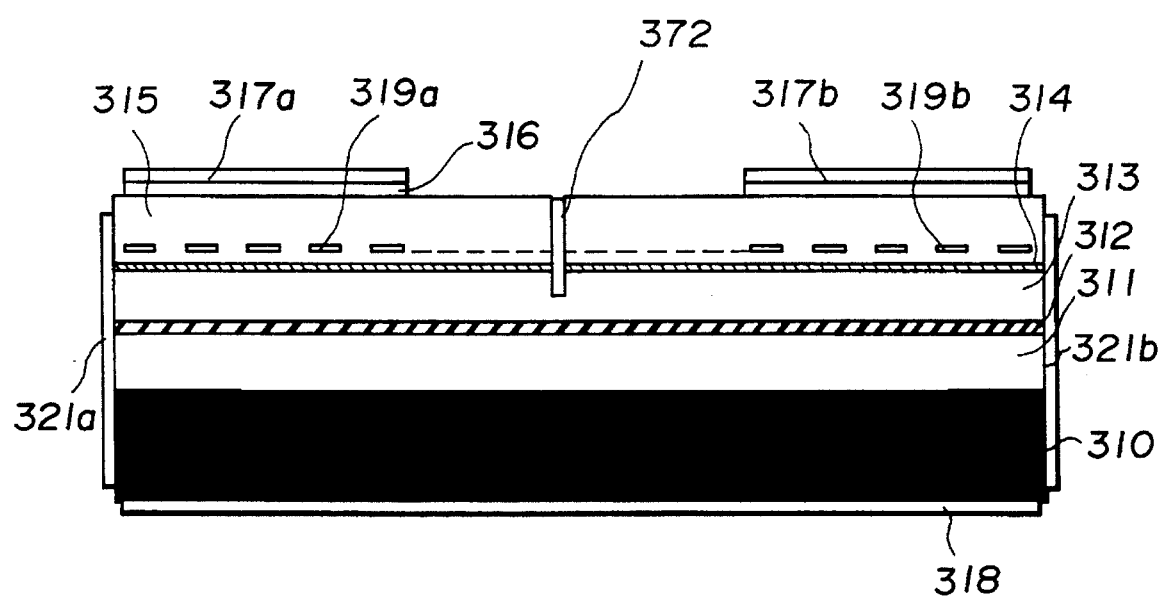
FIG. 24 is a cross-sectional schematic diagram of the seventh embodiment of the present invention.

In the sixth embodiment, the optical splitter portion is configured so that light input and output can be performed perpendicular to the device's top surface, considering readiness of the connection with the external optical fiber 320c. However, a splitter portion can be configured so that light input and output can be performed horizontally. This structure is suitable for an integrated optical node where the connection with other semiconductor devices is conducted by a waveguide 370 (see FIG. 23). The seventh embodiment is directed to such a structure. FIGS. 23 and 24 are respectively a plan view and an A–A' cross-sectional view of the seventh embodiment. In the seventh embodiment, a light splitting or branching ratio can be changed by controlling the width and depth of a slit type splitter 372. The other structure and operation of the seventh embodiment are the same as those of the sixth embodiment.

Eighth Embodiment

In the sixth and seventh embodiments in which a bulk AlGaAs is used as the core layer 314, a change in the refractive index due to carrier injection is considered to result from the combination of band filling, band shrinkage, plasma dispersion and the like. When a quantum well (QW) layer is used therefor, a change in the refractive index is caused chiefly by the band-filling effect and the amount of change is increased, compared to a case where the bulk AlGaAs is used. FIG. 18 also illustrates this structure. Further, a strained quantum well layer may be used as the second core layer. In this case, all the band filling, band shrinkage and plasma dispersion effects are highly influenced by the strained quantum well layer, so that it is possible to cause a large change in the refractive index with a small current if its structure is appropriately designed. The other aspects of the eighth embodiment are the same as the sixth embodiment.

Ninth Embodiment

In the sixth embodiment or the like, when the periodical current restraint layer is formed in the second cladding layer 313, the following advantageous effects can be obtained: (1) The carrier density distribution in the second core layer 314 during carrier injection time can be precisely controlled; (2) The carrier density distribution can be induced also in the first core layer 312 if the location of the periodical current restraint layer is properly set; and (3) Coupling of light can be increased.

Figure 25:
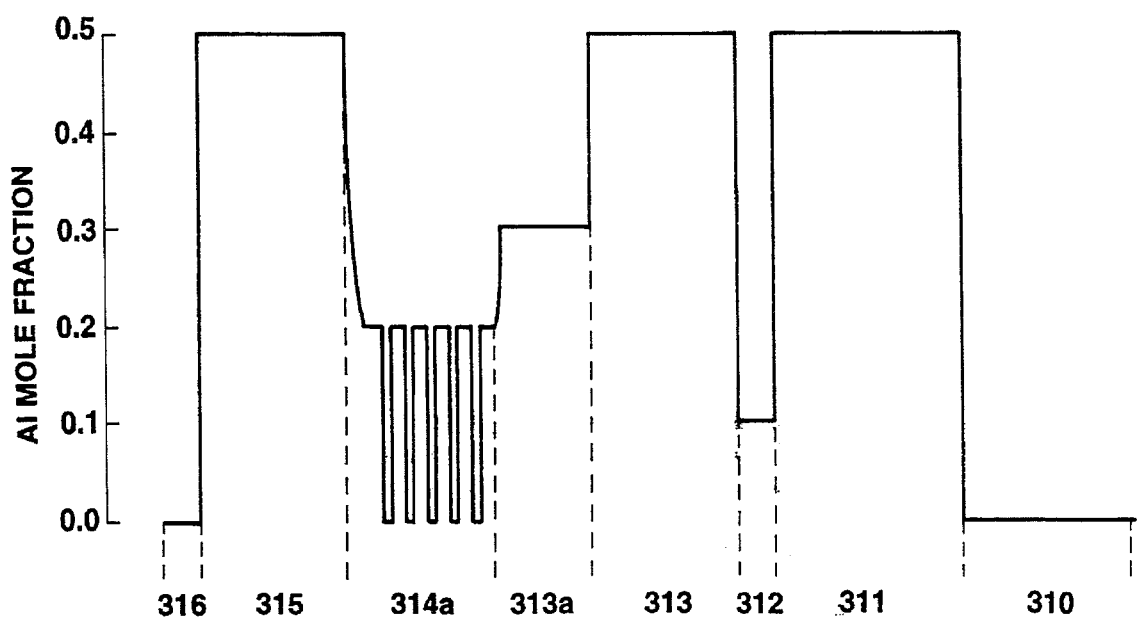
FIG. 25 is a graph illustrating Al mole fractions of layers in a ninth embodiment of the present

FIG. 25 illustrates Al mole fractions of respective layers of the ninth embodiment. Its abscissa indicates thicknesses of layers and its ordinate indicates the Al mole fractions. As can be seen from FIG. 25, a second core layer 314a has a multi-quantum well structure, similar to the eighth embodiment, and a light guide layer 313a is newly inserted between the first and second waveguides 324 and 325 (see, for example, FIG. 20) in order to strengthen the mode coupling therebetween.

Tenth Embodiment

Figure 26:
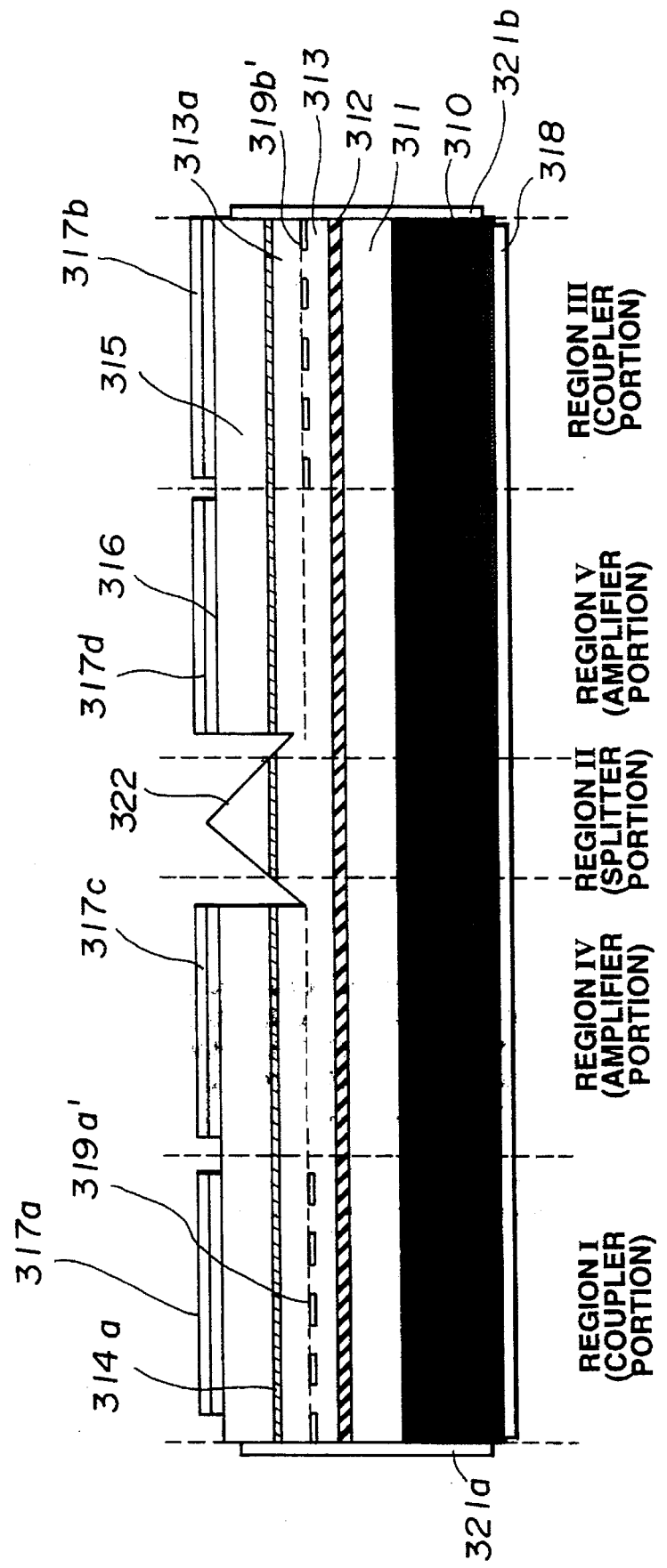
FIG. 26 is a schematic diagram illustrating a tenth embodiment of the present invention.

If the loss compensation effect is insufficient in regions I and III of the sixth embodiment or the like, a region without the periodical current restraint layer can be additionally formed to impart only a gain to the propagated light wave so that loss compensation and the shift of the propagated light wave can be independently performed. FIG. 26 shows such a structure. In FIG. 26, regions IV and V are respectively optical amplifier portions, and reference numerals 317c and 317d respectively designate positive electrodes in the regions IV and V. In the tenth embodiment, the second core layer 314a of the eighth embodiment and the periodical current restraint layers 319a' and 319b' of the ninth embodiment are utilized. The other aspects of the tenth embodiment are the same as the sixth embodiment.

Eleventh Embodiment

An eleventh embodiment of an integrated optical device according to the present invention will be described. The structure of this embodiment is similar to that of the sixth embodiment shown in FIG. 19, so that the structure of the eleventh embodiment will be described with reference to FIG. 19, wherein reference numerals in parentheses indicate portions or elements particular to the eleventh embodiment. In this device, three regions are serially arranged along the light propagation direction. Regions I and III are respectively optical coupler/amplifier regions, and a region II is a light splitter region. The layer structure in each of the regions I and III is designed so that relations (7-2a) and (7-2b) are satisfied, while the layer structure of the region II is designed so that the relation (8-2) is satisfied.

Figure 27:
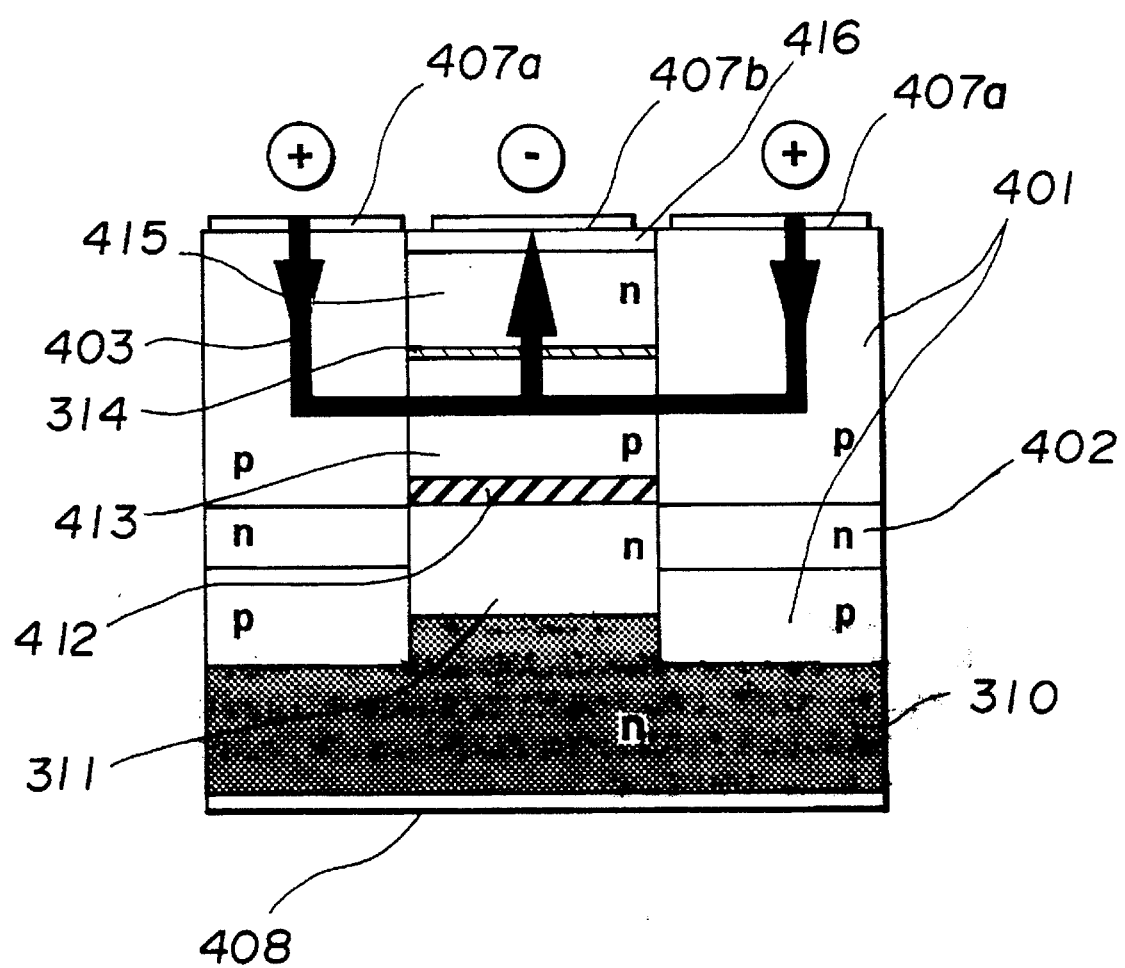
FIG. 27 is a cross-sectional schematic diagram illustrating the operation of the eleventh embodiment of the present invention.

In FIG. 19, reference numeral 412 designates an undoped first core layer of $Al_{0.08}Ga_{0.92}As$ having a thickness of 0.1 µm, reference numeral 413 designates a p-type (not an n-type) second cladding layer of $Al_{0.5}Ga_{0.5}As$ having a thickness of 0.5 µm, reference numeral 415 designates an n-type (not a p-type) third cladding layer of $Al_{0.5}Ga_{0.5}As$ having a thickness of 1.5 µm, and reference numeral 416 designates an n-type contact layer of GaAs. Further, reference numerals 407a and 407b and 408 respectively designate positive and negative electrodes (see also FIG. 27). In FIG. 27, reference numeral 401 designates a p-type burying layer, reference numeral 402 designates an n-type burying layer and reference numeral 403 designates a current path between the positive electrodes 407a and the negative electrode 407b.

The fabrication method of the eleventh embodiment will be described. Initially, layers from the first cladding layer 311 up to the second core layer 314 are consecutively grown on the (100) n-type GaAs substrate 310, using, for example, the MOCVD method or the MBE growth method. After the growth of the second core layer 314, an n-type $Al_{0.5}Ga_{0.5}As$ layer having a thickness of 0.3 µm and a carrier concentration n≈$3×10^{17}$ cm$^{-3}$, which is a layer under the layer for modulating the refractive index in the third cladding layer 415, and a p-type $Al_{0.5}Ga_{0.5}As$ layer having a thickness of 0.5 µm and a carrier concentration p≈$3×10^{17}$ cm$^{-3}$, which is a part of the layer for modulating the refractive index or current restraint layers 419a and 419b, are formed. Then, as described above, a grating pattern of a pitch 8.5 µm is formed by etching so that its depth reaches the n-type $Al_{0.5}Ga_{0.5}As$ layer. After that, an n-type $Al_{0.5}Ga_{0.5}As$ layer having a thickness of 0.7 µm and a carrier concentration n≈$3×10^{17}$ cm$^{-3}$, which build up a part of the third cladding layer 415 and a part of the periodical current restraint layers 419a and 419b, is grown using the MOCVD method.

The carrier concentration is set at about $3×10^{17}$ cm$^{-3}$ so that a change in the refractive index would not occur in layer 415 during the non-carrier injection time. Thus, the periodical current restraint layers 419a and 419b can be obtained. Then, the contact layer 416 is grown. The periodical current restraint layers 419a and 419b of the eleventh embodiment differ from the periodical current restraint layers 319a and 319b of the sixth embodiment in that the conduction types of the periodically arranged portions are reversed between those embodiments.

After the fabrication of the buried structure 401 and 402 or the like for controlling a transverse mode, the electrodes 407a–407b and 408 are respectively formed in the regions I and III and on the bottom surface of the substrate 310. The buried structure consists of the $Al_{0.5}Ga_{0.5}As$ high-resistance burying layers, similar to the embodiment shown in FIG. 14. Thus, the eleventh embodiment is completed.

The operation of the eleventh embodiment will be described with reference to FIGS. 19 and 27–29. For this example, it is assumed that a light beam having a wavelength of 860 nm is input from the fiber 320a at the left side and propagated solely along the first core layer 412. The first core layer 412 is made of a material which is transparent to the propagated light wave.

Figure 28:
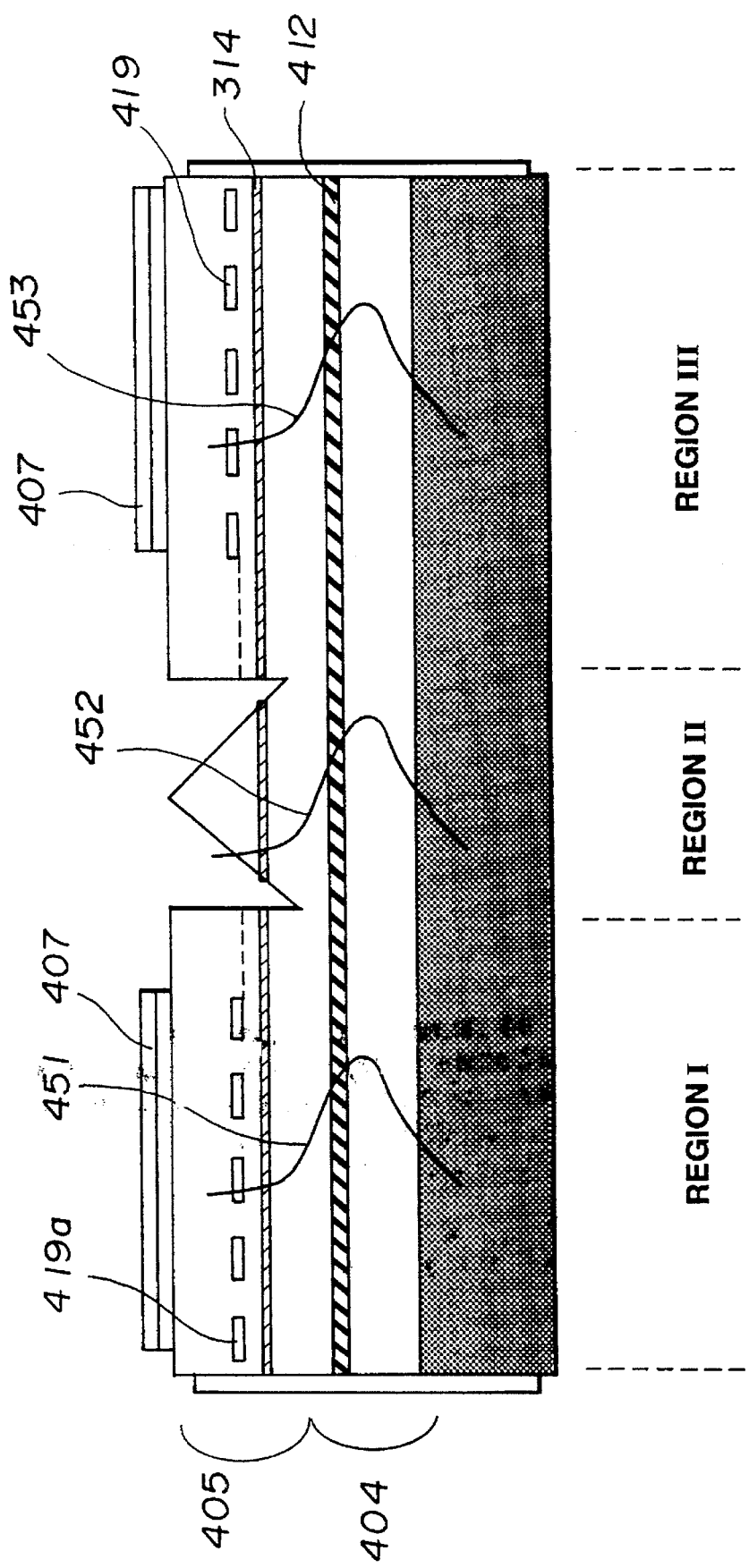
FIG. 28 is a schematic diagram illustrating the operation of the eleventh embodiment of the present invention.

When no current is injected into either regions I–III, and no electric field is applied to the first core layer 412, a light wave 451, which is input into a first waveguide 404, does not couple to the waveguiding mode of a second waveguide 405 whatsoever, as shown in FIG. 28, since the refractive index near the periodical current restraint layer 419a remains unchanged. Therefore, light waves 452 and 453 are respectively passed through the regions II and III without any change, and the light wave is output (failure-safety function). If the device is placed in a transmission line of an optical communication network, the device works as a simple passive device.

When current is injected into the second core layer 314 in regions I and III and no electric field is applied to the first core layer 412, a density distribution of carriers that are injected through the positive electrodes 407a is modulated by the periodical current restraint layer 419a and a modulated carrier density distribution is created in the second core layer 314 (see FIG. 27). Corresponding to the thus-formed modulated carrier distribution, an equivalent refractive index distribution is produced in the second core layer 314. As a result, a light wave that is input into the first waveguide 404 is modulated by the periodical current restraint layer 419a and coupled to the second waveguide 405 (see FIG. 21). The light wave is transferred to the second waveguide 405 at a power transfer rate of 100% when propagated a complete coupling length (see FIG. 21), since the structure is designed so that the transfer rate becomes *100%* for the density of the injected current.

In the region II, the propagated light wave is guided outward by the V-shaped groove 322 and reflected upward toward the optical fiber 320c by the 45° mirror surface of the groove 322. The other aspects of light splitting are also similar to the sixth embodiment (see FIG. 22).

Figure 29:
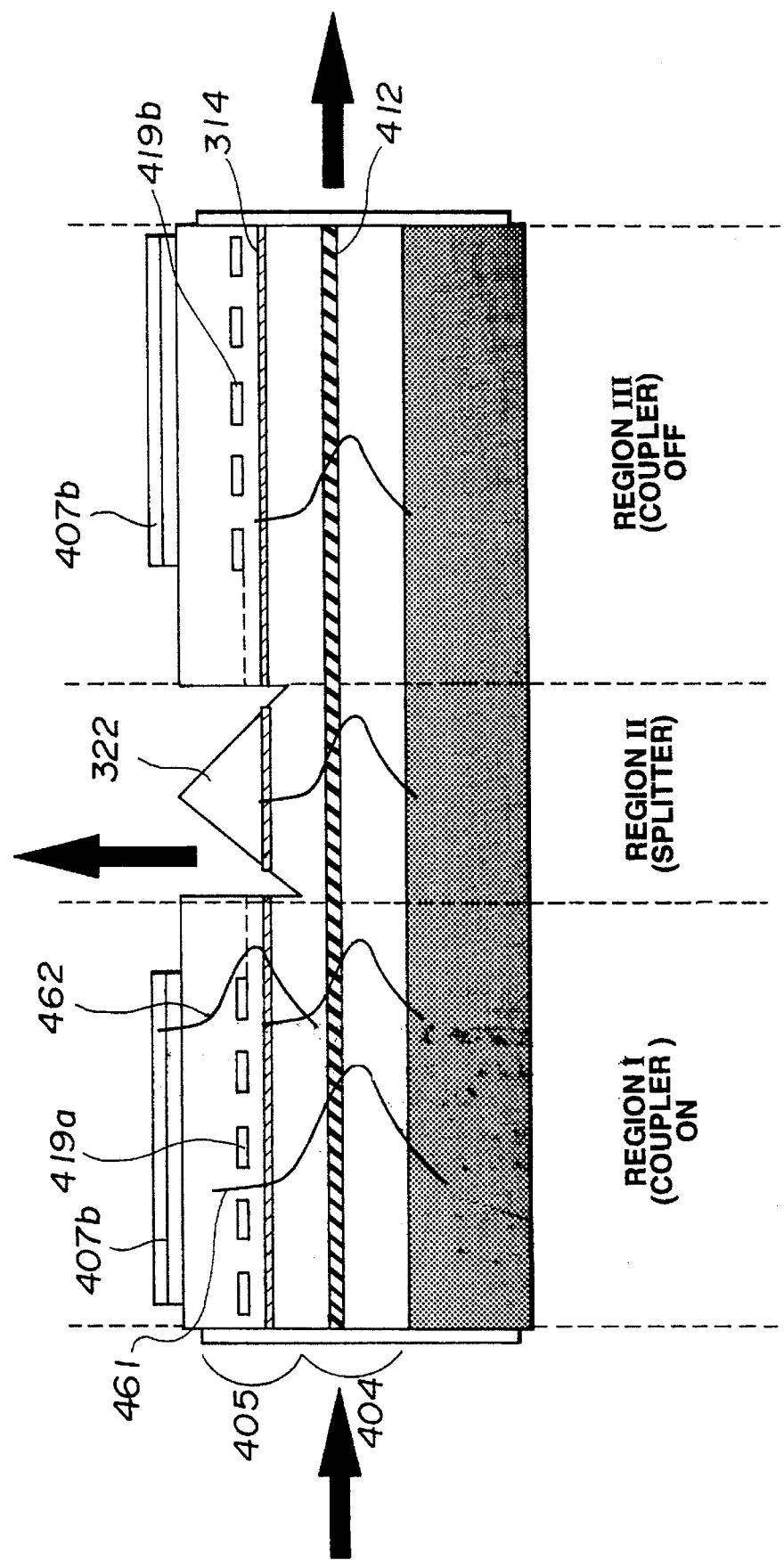
FIG. 29 is a schematic diagram illustrating the operation of the eleventh embodiment of the present invention.

When current is injected into the second core layer 314 in the region I and an electric field is applied to the first core layer 412 in the region I, the coupling coefficient or efficiency κ is changed by a change in the refractive index due to the electric field applied to the first core layer 412 (this is due to Franz Keldysh effect). Thus, the branching ratio varies. As a result, a light wave input into the first waveguide 404 is power-branched in the region I. One branched light wave 461 passes through the first waveguide 404 and is directed into the region III. When no carrier is injected into the second core layer 314 in the region III, the light wave 461 is output without any change. The other branched light wave 462 is output by the light splitter 322 in the region II, as shown in FIG. 29.

Twelfth Embodiment

Figure 30:
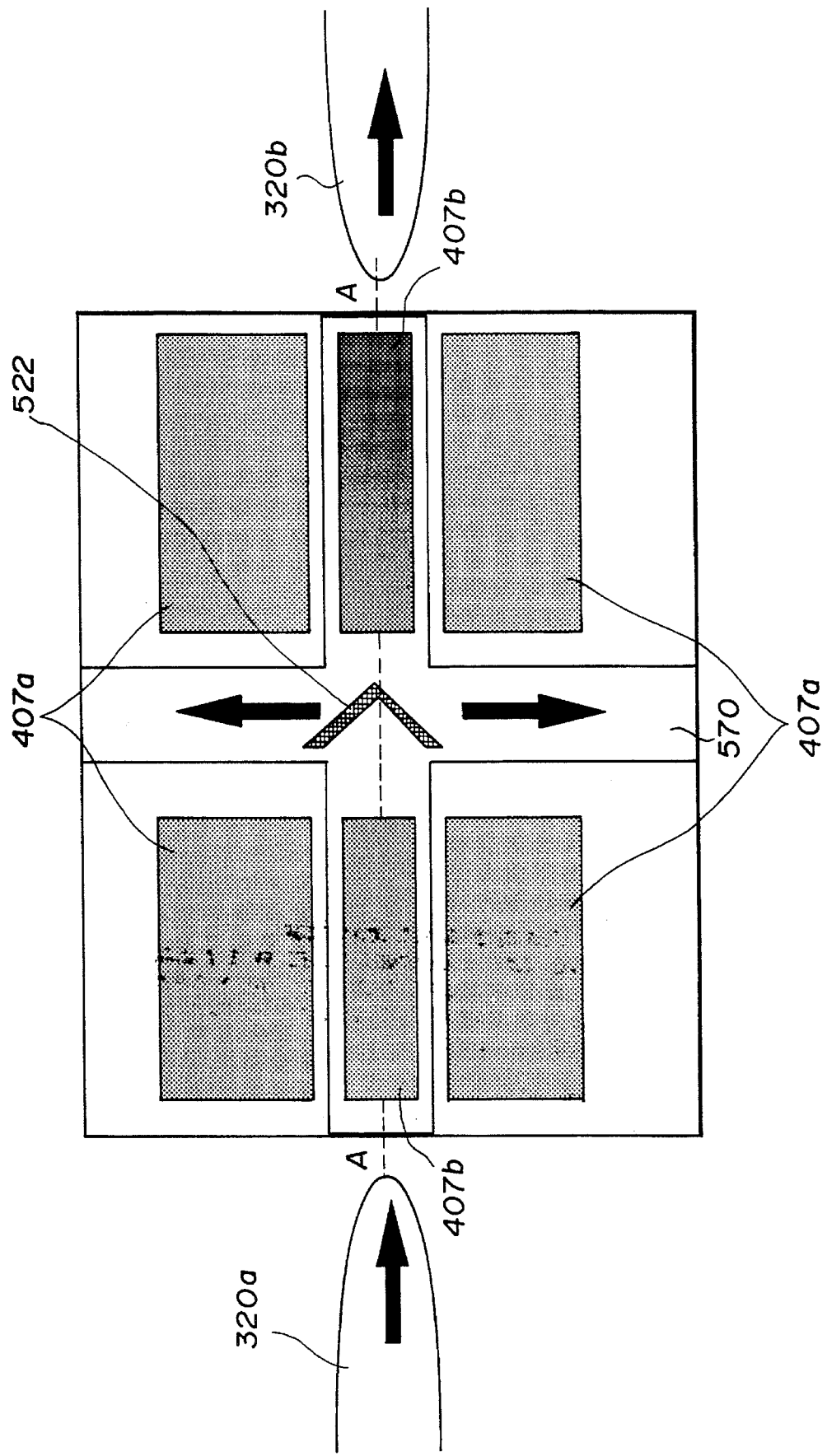
FIG. 30 is a plan schematic diagram illustrating a twelfth embodiment of the present invention.
Figure 31:
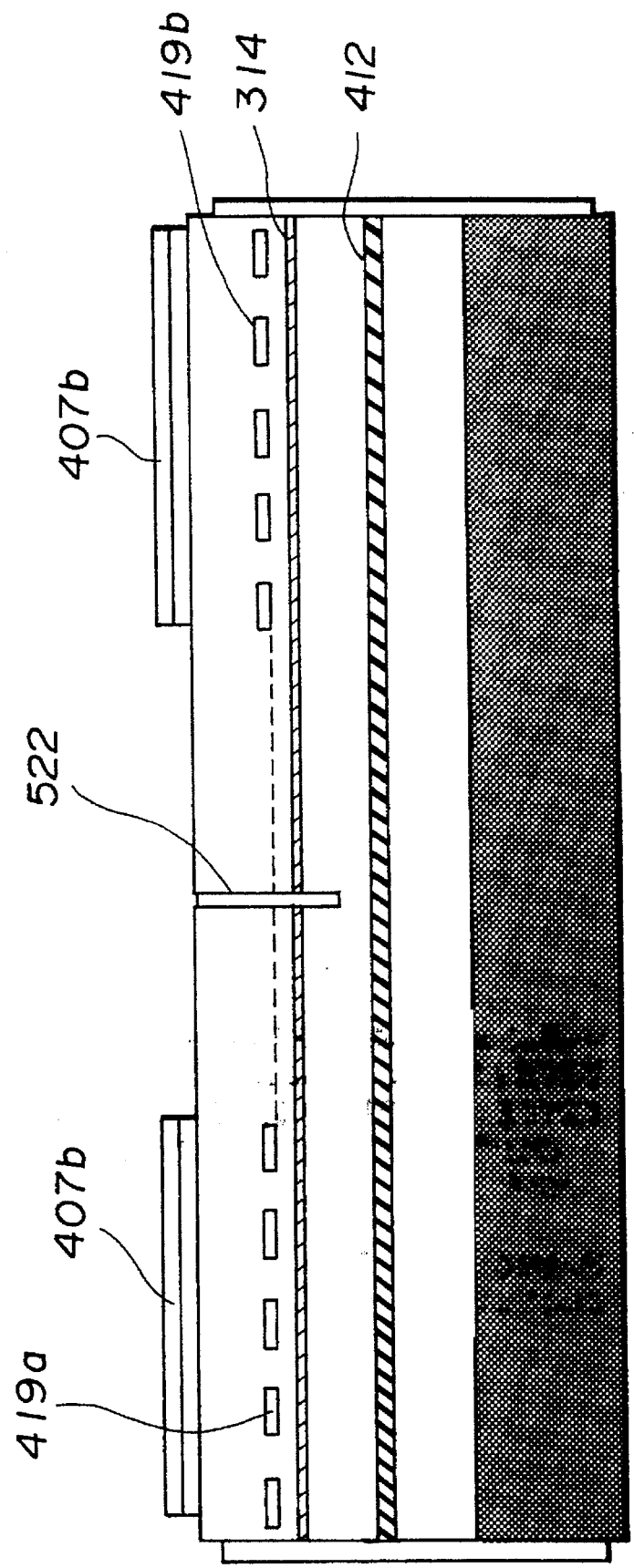
FIG. 31 is a cross-sectional schematic diagram of the twelfth embodiment of the present invention.

In the eleventh embodiment, the light splitter portion is configured so that light input and output can be performed perpendicular to the device's top surface, considering readiness of the connection with the external optical fiber 320c. However, the splitter portion can be configured so that light input and output can be performed horizontally. This structure is suitable for an integrated optical node where the connection with other semiconductor devices is conducted using a waveguide 570 (see FIG. 30). The twelfth embodiment relates to such a structure. FIGS. 30 and 31 are respectively a plan view and an A–A' cross-sectional view of the twelfth embodiment. In the twelfth embodiment, a light splitting ratio at the light splitter portion can be changed by controlling the width and depth of a slit type splitter 522. The other structure and operation of the twelfth embodiment are the same as those of the eleventh embodiment.

Thirteenth Embodiment

In the embodiments wherein bulk AlGaAs is used as the core layer, a change in the refractive index due to carrier injection is considered to result from the combination of band filling, band shrinkage, plasma dispersion and the like. When a quantum well (QW) layer is used therefor, a change in the refractive index is caused chiefly by the band filling effect and this change is increased, compared to a case of the bulk AlGaAs. Further, when a quantum well layer is used as the first core layer 412, a change in the refractive index due to the application of an electric field is caused by the quantum confinement Stark effect. The change by the Stark effect is larger than the change by the Franz Keldysh effect utilized when the bulk semiconductor is used.

Thus, when the quantum well structure is used as at least one of the first and second core layers 412 and 314 of the eleventh embodiment, the device can be operated by a small current or a small voltage. The case where the quantum well structure is used only as the second core layer 314 is described above. The other aspects of the thirteenth embodiment are the same as those of the eleventh embodiment.

Fourteenth Embodiment

Figure 32:
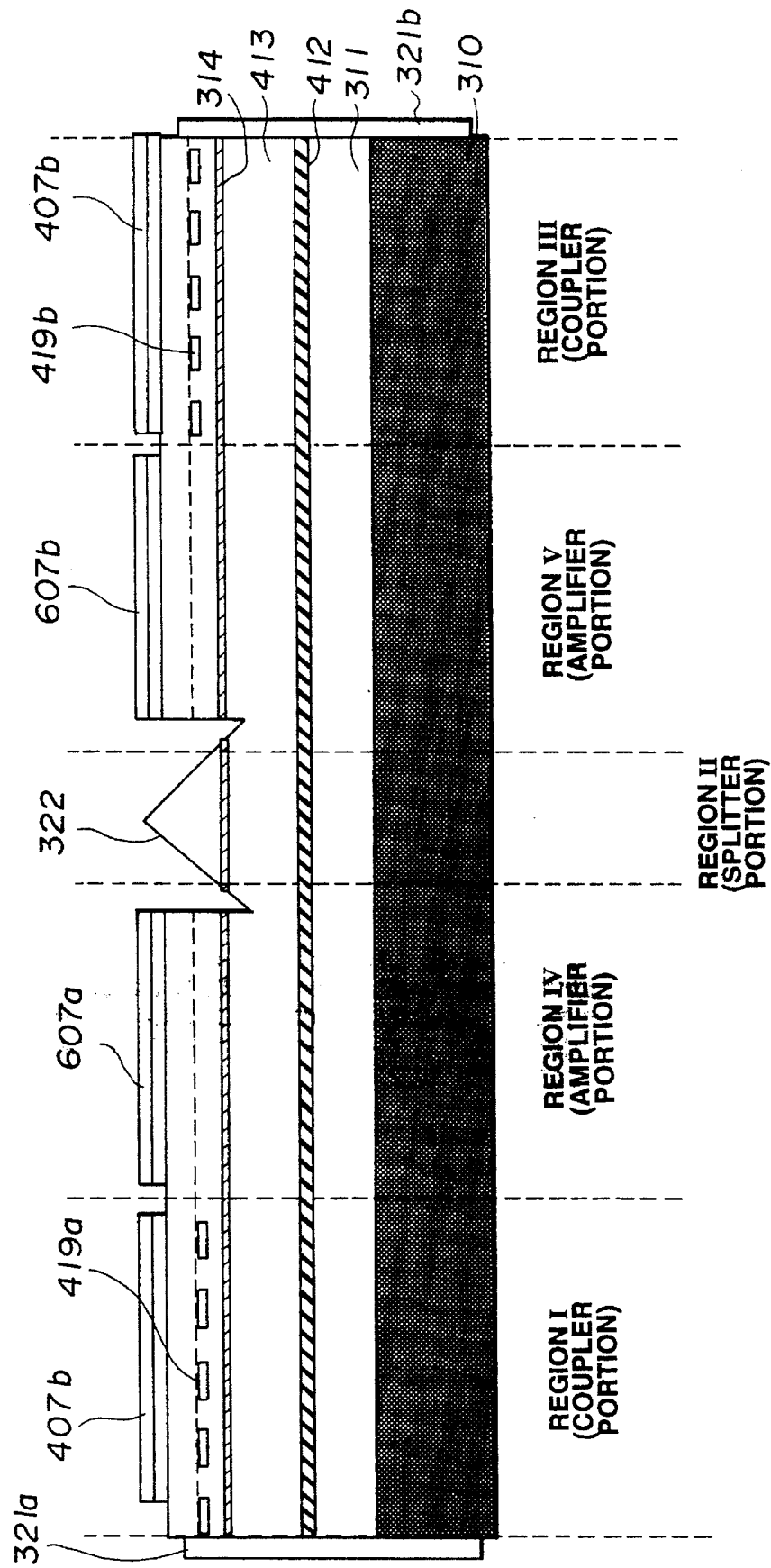
FIG. 32 is a schematic diagram of a fourteenth embodiment of the present invention.

If the loss compensation effect is insufficient in regions I and III of the eleventh embodiment, a region without the periodical current restraint layer can be newly formed to impart only a gain to the propagated light wave so that loss compensation and shift of the propagated light wave can be independently performed. FIG. 32 shows such a structure. In FIG. 32, regions IV and V are respectively optical amplifier portions, and reference numerals 607a and 607b respectively designate positive electrodes for injecting current into regions IV and V. In the fourteenth embodiment, the second core layer 314 and the periodical current restraint layers 419a and 419b of the eleventh embodiment are utilized.

Fifteenth Embodiment

A fifteenth embodiment of an integrated optical device according to the present invention will be described with reference to FIG. 33. In this device, three regions are serially arranged along a light propagation direction. Regions I, II and III are respectively transmitter portion, coupler portion, and receiver portion. The layer structure in the region II is designed so that the relations (7-2a) and (7-2b) are satisfied, while the layer structure of each of the regions I and III is designed so that the relation (8-2) is satisfied.

Figure 33:
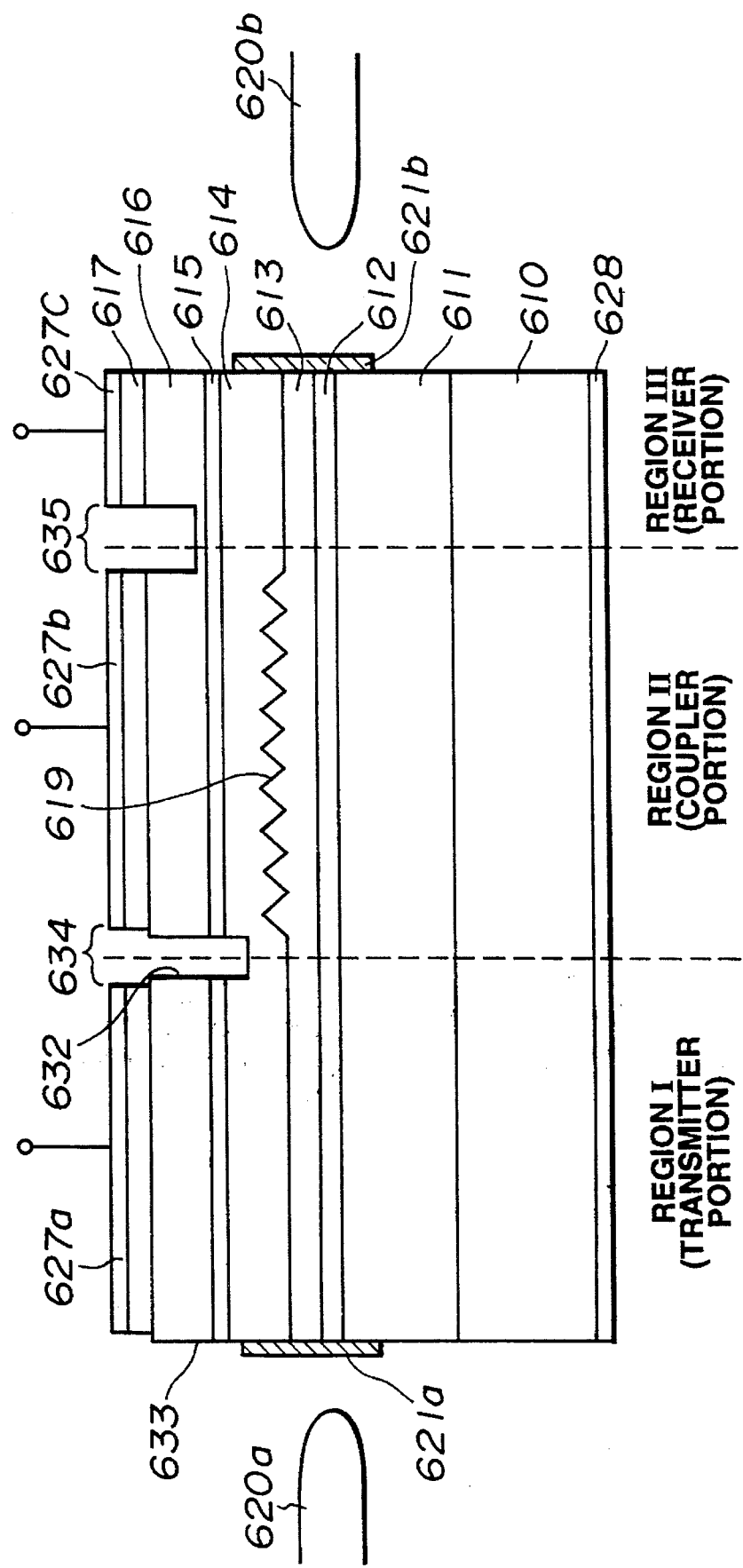
FIG. 33 is a schematic diagram of a fifteenth embodiment of the present invention.

In FIG. 33, reference numeral 610 designates an n-type GaAs substrate, reference numeral 611 designates an n-type first cladding layer of $Al_{0.5}Ga_{0.5}As$ having a thickness of 0.5 µm, reference numeral 612 designates an n-type first core layer of $Al_{0.08}Ga_{0.92}As$ having a thickness of 0.1 µm, reference numeral 613 designates an n-type second cladding layer of $Al_{0.05}Ga_{0.5}As$ having a thickness of 0.5 µm, reference numeral 614 designates an n-type third cladding layer of $Al_{0.3}Ga_{0.7}As$ having a thickness of 0.5 µm, reference numeral 615 designates an undoped second core layer of $Al_{0.08}Ga_{0.92}As$ having a thickness of 0.05 µm, reference numeral 616 designates a p-type fourth cladding layer of $Al_{0.5}Ga_{0.5}As$ having a thickness of 1.5 µm, and reference numeral 617 designates a p-type contact layer of GaAs.

Further, reference numerals 627a–627c and 628 respectively designate positive and negative electrodes, and reference numeral 619 designate a grating for modulating the refractive index therearound. In the fifteenth embodiment, the wavelength of a propagating light wave is 860 nm, and the grating 619 has the shape of a sinusoidal curve having a pitch of 8.5 µm and a depth of 1.2 nm.

The device length of the region II (coupler portion) is a complete coupling length (in this embodiment, 500 µm) which is determined from relation (4), and the device length of the region I (transmitter portion) is 300 µm. The device length of the region III (receiver portion) is 100 µm. Anti-reflection (AR) coatings 621a and 621b are respectively provided on input and output facets perpendicular to a light propagation direction.

The lateral or transverse confinement of the device is achieved by a buried heterostructure (BH) structure (not shown), but other structures may be used therefor. One facet of the region I (transmitter portion) is formed as a cleaved facet 633, and the other facet thereof is formed as an etched end face 632. Thus, a Fabry-Perot type resonator is constructed, but other structures, such as distributed feedback (DFB) and distributed bragg reflector (DBR) type laser diodes (LD) with a grating reflector, may be used. Further, a PIN type photodetector is used in the region III (receiver portion), but other structures may be used. Reference numerals 620a and 620b are respectively tip-rounded optical fibers.

The operation of the fifteenth embodiment will be described. For this example, it is assumed that a light beam having a wavelength of 860 nm is propagated solely along the first core layer 612. Further, a forward bias voltage is applied as an external control to region II (coupler portion) which has the grating 619.

(1) A case where carriers are injected into the region II (coupler portion) will be described.

A light signal transmitted through the optical fiber 620a is coupled to the first core layer 612 in region I (transmitter portion). A coupling lens may be used therefor. The propagated light signal passes through region I and reaches region II (coupler portion). The light signal is coupled to the second core layer 615 under the influence of the grating 619 or the refractive index modulating layer. The light wave is transferred to the second core layer 615 at a power transfer rate of 100% when propagated a complete coupling length, since the layer structure is designed so that the transfer rate becomes 100% for the density of the injected current in the region II. The transferred light signal is converted to an electric signal by an opto-electric (OE) converter fabricated in region III (receiver portion), and is processed by an external control circuit.

Figure 1:
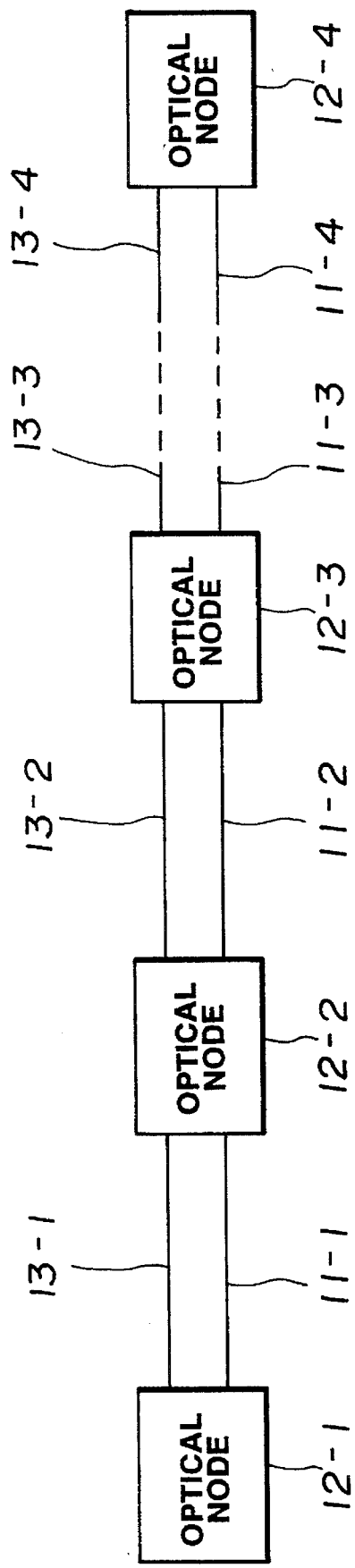
FIG. 1 is a block diagram illustrating a conventional network structure having conventional optical nodes.
Figure 2:
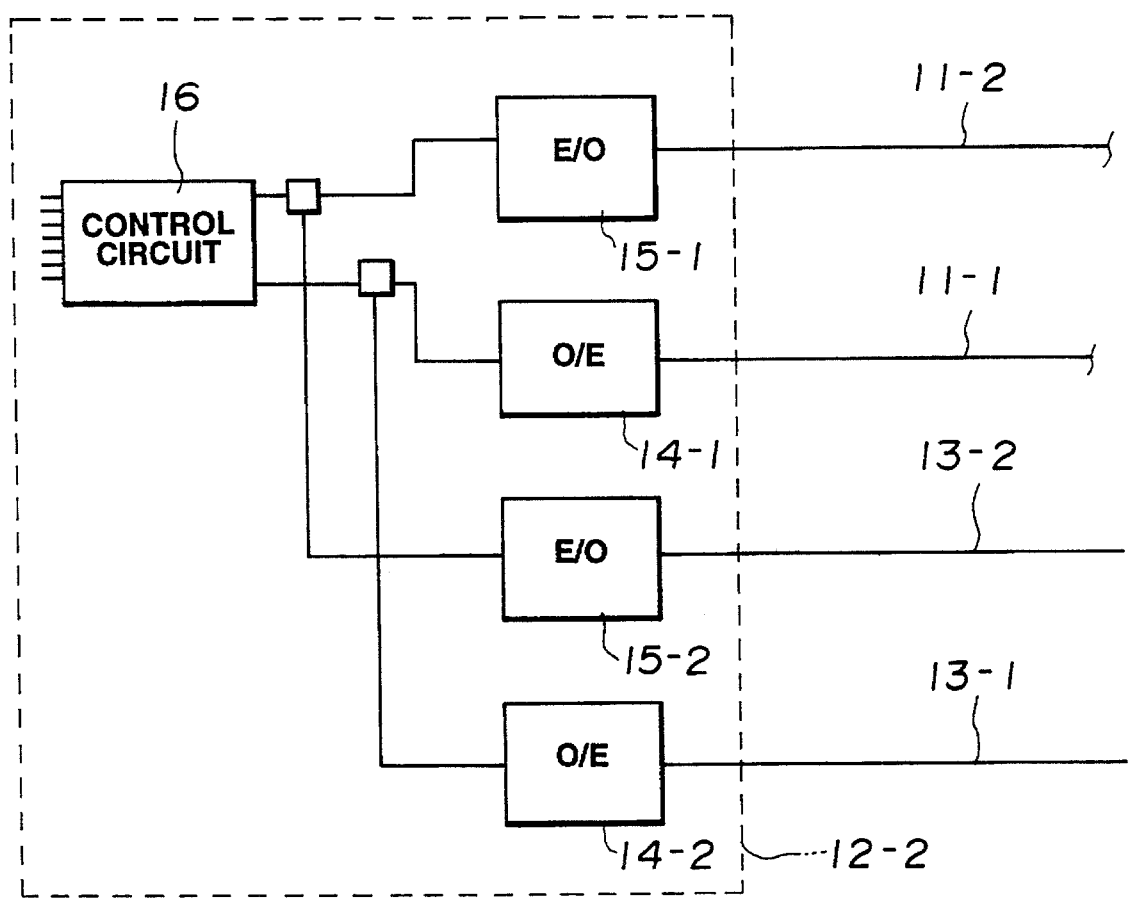
FIG. 2 is a block diagram illustrating a conventional optical node 12-2.
Figure 3:
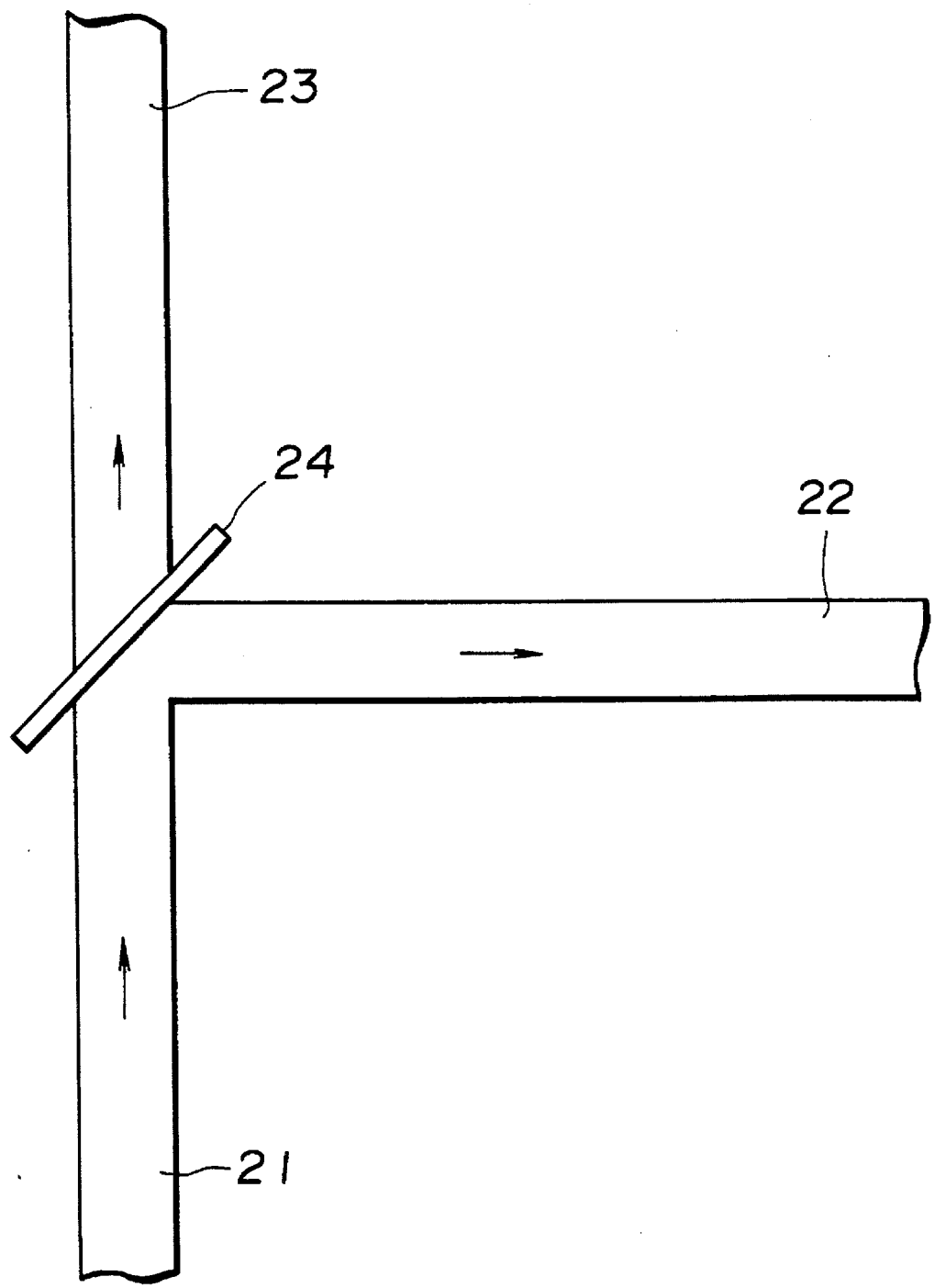
FIG. 3 is a plan view illustrating a conventional light branching-combining device.
Figure 4:
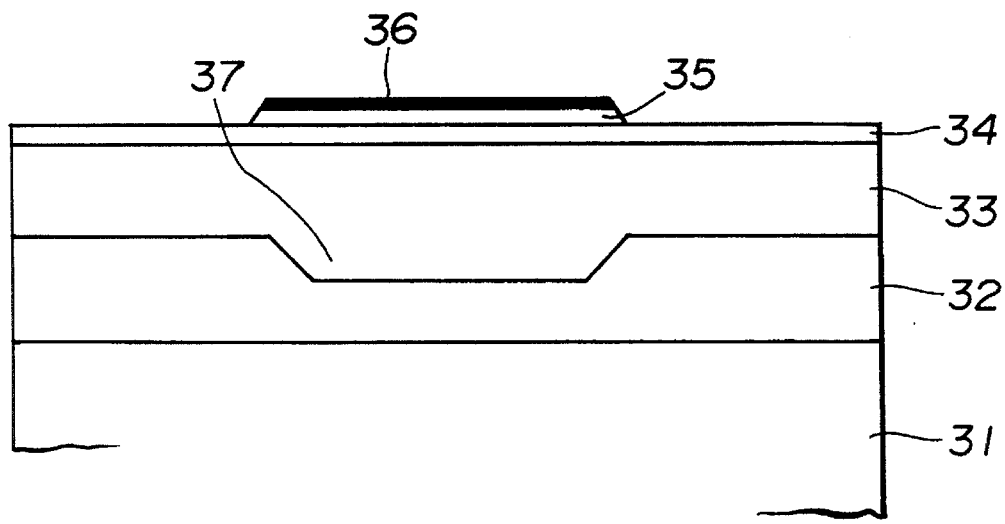
FIG. 4 is a cross-sectional view of FIG. 3.
Figure 5:
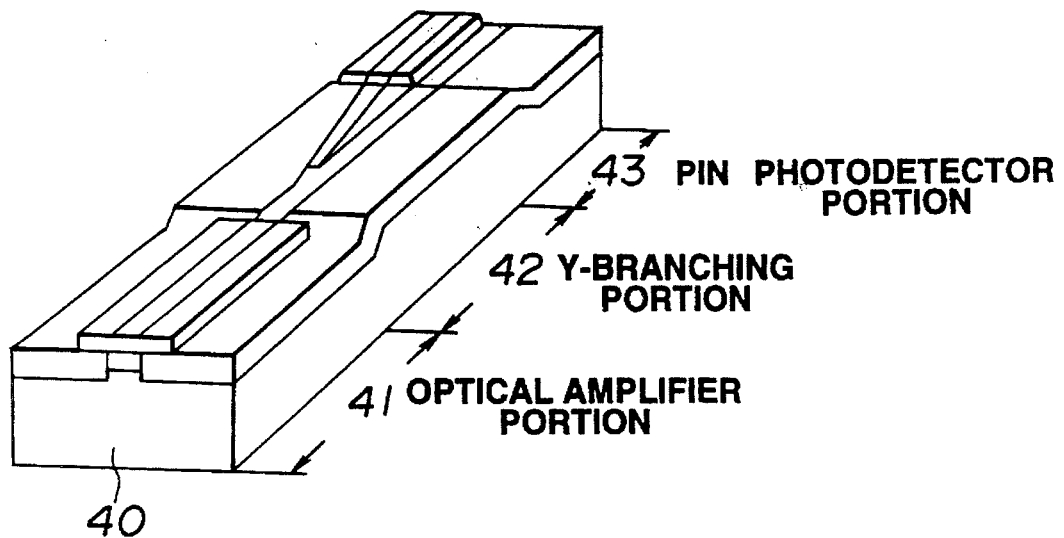
FIG. 5 is a perspective view illustrating a conventional semiconductor amplifier.
Figure 7C:
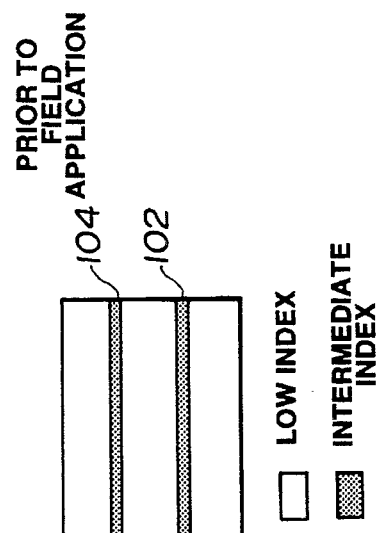
FIGS. 7A–7D are views illustrating a relationship between electric-field application and a change in refractive index to describe the principle of the present invention.
Figure 7D:
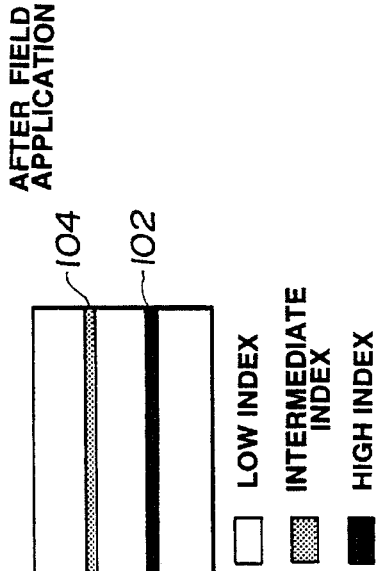
Figure 7A:
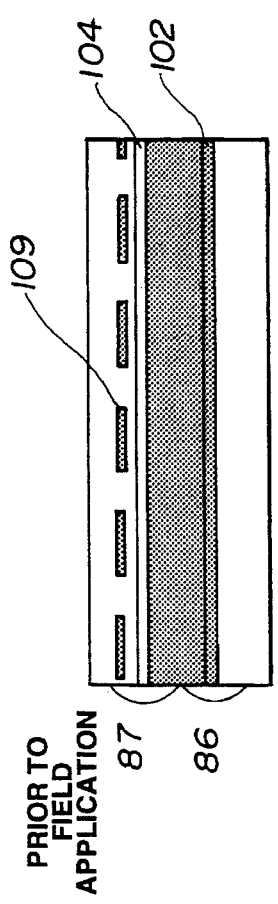
Figure 7B:
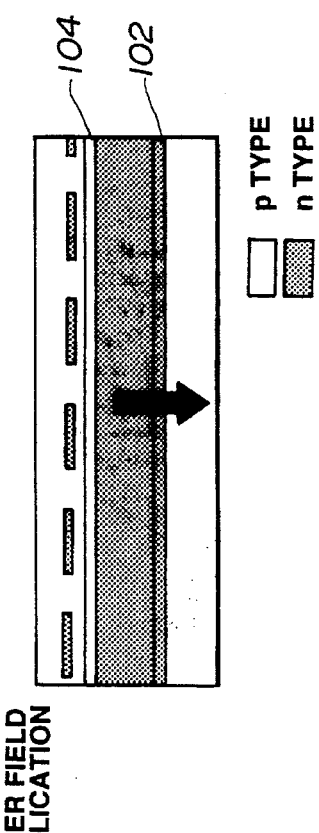

If this device is used as an optical node as shown in FIG. 2, the signal, which is detected by the O/E converter, is again converted to an optical signal by an electro-optic (E/O converter) after passing through the processing circuit. When the E/O converter fabricated in region I is a laser diode, a reproduced light signal emitted from the etched facet 632 is coupled to the opposite second core layer 615 via a separation groove 634, and propagated. This light signal is coupled to the first core layer 612 under the influence of the grating 619, similar to the optical detection operation, and is transferred to the first core layer 612 at a transfer rate of 100%. The transferred light signal is transmitted through the region III, and is emitted through the AR coating 621b at the right-hand side. The emitted light signal is transmitted to a light transmission line through the lensed fiber 620b or lens coupling. Thus, the signal from one optical node is transmitted to another optical node. In FIG. 33, reference numeral 635 designates an electric separation groove formed between the regions II and III.

(2) A case where no carrier is injected into the region II (coupler portion) will be described.

A light signal transmitted through optical fiber 620a is coupled to the first core layer 612 in region I (transmitter portion) through the lensed fiber. A coupling lens may be used therefor. The propagated light signal passes through the region I and reaches region II (coupler portion). In region II, the refractive index remains unchanged, different from the case (1), because no carriers are injected. As a result, the light signal propagated in the first core layer 612 would not couple to the second core layer 615, and passes through region II without any change. The light signal further passes through the region III, and is output into the optical fiber 620b.

As discussed above, case (1) was a case where the optical node operated in a normal manner. Since the optical node operates normally in an electric sense in this case, carriers are injected into region II and the signal light is repeated via the O/E converter in the region III and E/O converter in the region I. Case (2) was a case where the optical node was in an abnormal state. In the following cases the node is in an abnormal mode:

(1) An electric source of a terminal, to which the optical node is installed, is not ON;

(2) A device in the optical node is out of order; and (3) The condition of the refractive-index modulating layer 619 is not normal.

A case such as the case (1) may appear when the network is expanded. In a conventional optical node, network failure occurs under such a condition and the network becomes inoperative. In the optical node of the present invention, carriers will not be injected into the region II when the electric source is OFF. Therefore, the light signal is transmitted to a next optical node in such a manner that the signal intensity is decreased by the amount of coupling loss between node and transmission line and the absorption loss during the transmission in the first core layer 612. Thus, the optical node of the present invention can avoid the inconvenience of the optical network being operative only when the electric sources in all the terminals are switched on in the expanded network.

In a case such as case (2), when the O/E converter and/or E/O converter is out of order, such a failure can be readily found systematically by detecting the signal level in the processing circuit of a next optical node, because the intensity of the light signal transmitted to the next optical node is reduced.

In a case such as case (3), the detection level by the O/E converter is recognized by a level detecting circuit in the processing circuit. If the detection level is found to be below a predetermined value, this detection level, which is output from the O/E converter, is compared with a test signal output from the E/O converter to detect an abnormal state of the refractive index modulating layer 619. In such an abnormal state, the application of voltage to the refractive index modulating layer 619 is stopped and an abnormal state of the optical node is created. This abnormal state of the optical node can be detected by the next optical node.

The wavelength of the repeated light signal from region I may be either equal to or different from the wavelength of the light signal input from the optical fiber 620a. When they are equal, the repeated light signal begins to be transmitted after the input light signal is terminated. When they are different, the repeated light signal is simultaneously transmitted together with reception of the input light signal.

Sixteenth Embodiment

Figure 34:
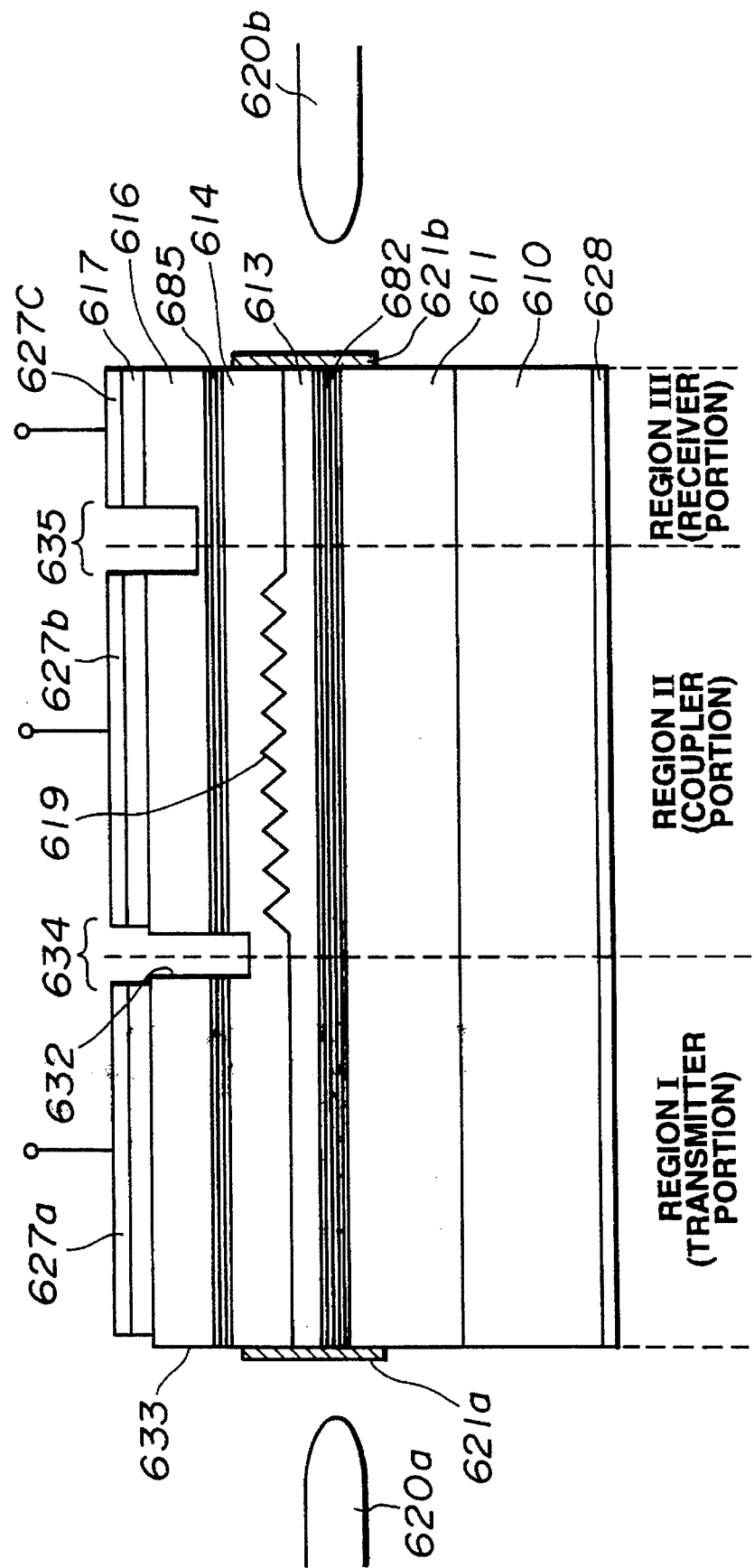
FIG. 34 is a schematic diagram of a sixteenth embodiment of the present invention.

In the fifteenth embodiment, a bulk AlGaAs is used as the first core layer 612, but a quantum well (QW) layer 682 may be used therefor. FIG. 34 illustrates such a layer structure. The first core layer 682, having a multi-quantum well structure, consists of five pairs of AlGaAs barrier layers and GaAs well layers. As a result, the light absorption during the transmission through the first core layer 682 is reduced when the optical node is out of order, compared to the light absorption by the waveguide with bulk AlGaAs.

Further, a second core layer 685 may be a multi-quantum well structure so that light absorption thereby is lowered. Thus, a power input into the photodetector in region III is increased, and an S/N ratio of the signal can be improved. The other aspects of the sixteenth embodiment are the same as those of the fifteenth embodiment.

Seventeenth Embodiment

Figure 35:
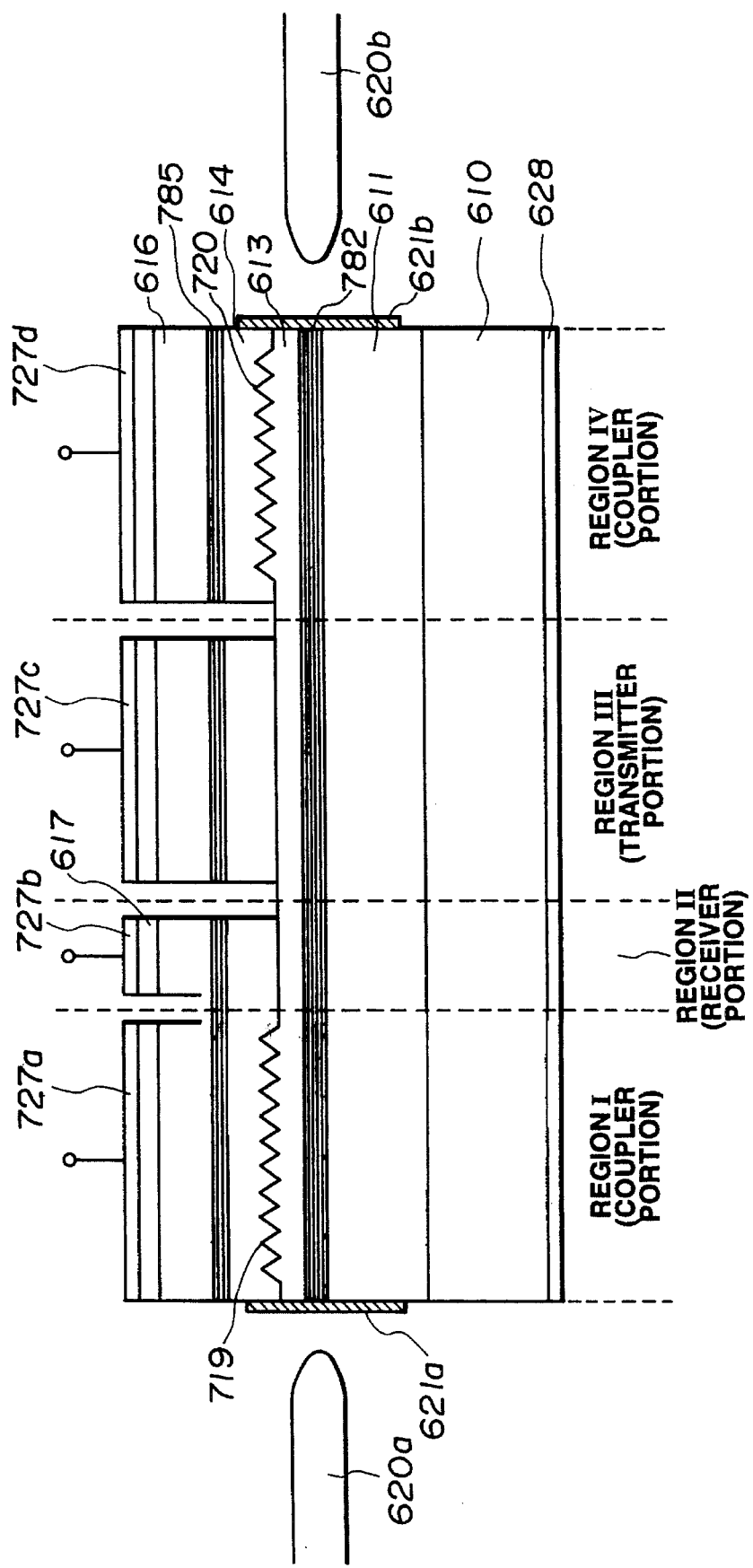
FIG. 35 is a schematic diagram of a seventeenth embodiment of the present invention.

In the fifteenth embodiment, a single grating is formed, and transmitter and receiver portions are constructed at opposite sides of the grating, but in the seventeenth embodiment, as shown in FIG. 35, two refractive index modulating layers or gratings 719 and 720 are formed along the light propagation direction.

The operation of the seventeenth embodiment will be described.

(1) A case where carriers are injected into regions I (coupler portion) and N (coupler portion) will be described.

A light signal transmitted through the optical fiber 620a is coupled to a first core layer 782 in the region I (coupler portion) through the lensed fiber. The light signal is transferred from the first core layer 782 to a second core layer 785 in region I while propagated therethrough, under the influence of the grating 719 due to carriers injected into the region I through an electrode 727a. The light signal is converted to an electric signal by the O/E converter fabricated in region II (receiver portion) having an electrode 727b. This electric signal is converted to an optical signal via an external control circuit (not shown) and E/O converter in region III (transmitter portion) having an electrode 727c. This optical signal is transferred from the second core layer 785 to the first core layer 782 by the grating 720 in the region IV having an electrode 727d, and emitted from the right-hand end surface of the device through the AR coating 621*b*. The output light signal is transmitted to a light transmission line through the lensed fiber 620*b* or a lens coupling.

(2) A case where no carrier is injected into the regions I (coupler portion) and IV (coupler portion) will be described.

A light signal transmitted through the optical fiber 620*a* is coupled to the first core layer 782 in the region I (coupler portion) through the lensed fiber. In the region I, the refractive index remains unchanged, different from case (1), because no carriers are injected into the region I. As a result, the light signal that is propagated in the first core layer 782 would not couple to the second core layer 785, and passes through the regions II, III and IV as it is. The light signal is output from the right-hand facet into the optical fiber 620*b*.

By the structure of the seventeenth embodiment, the signal can be repeated into the light transmission line while processing the received light signal (at the same wavelength), and no time delay occurs with respect to signal reception by other optical nodes.

Eighteenth Embodiment

Figure 36:
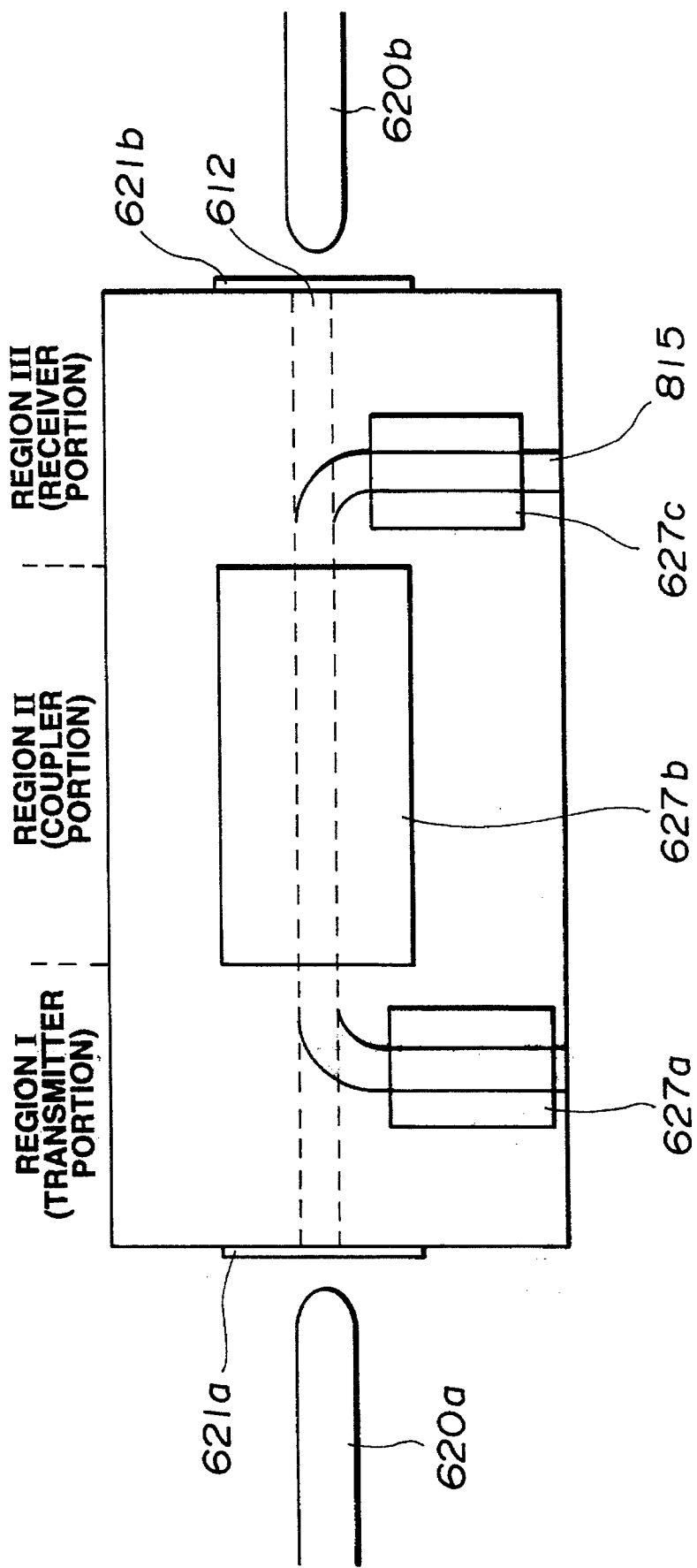
FIG. 36 is a plan schematic diagram of an eighteenth embodiment of the present invention.

In the fifteenth embodiment, input and output ends of the first and second core layers 612 and 615 are formed in a common plane, but in the eighteenth embodiment, as shown in FIG. 36 which is a plan view, input and output ends of a second core layer 815 are respectively formed on a different plane and in a different direction from those of the first core layer 612.

This structure is fabricated in the following manner. Initially, the layers up to the second cladding layer 613 are formed on the substrate 610, similar to the fifteenth embodiment. Then, a transverse confinement structure for the first core layer 612 is formed. Next, after formation of the grating 619, layers from the third cladding layer 614 up to the contact layer 617 are regrown. Regrowth methods like MOCVD, GS (gas source) –MBE, LPE (liquid phase epitaxy) be utilized. After the regrowth, a ridge waveguide consisting of a curved second core layer 815 is fabricated by photolithography and dry etching. The structure of the waveguide may be a confined waveguide formed by using diffusion or the like, instead of the ridge waveguide. According to this structure, the input light signal is prevented from being coupled to the second core layer 815 due to proximity of the optical fiber 620*a*, and first and second core layers 612 and 815. Other structures and operations of the eighteenth embodiment are similar to those of the fifteenth embodiment.

Nineteenth Embodiment

Figure 37:
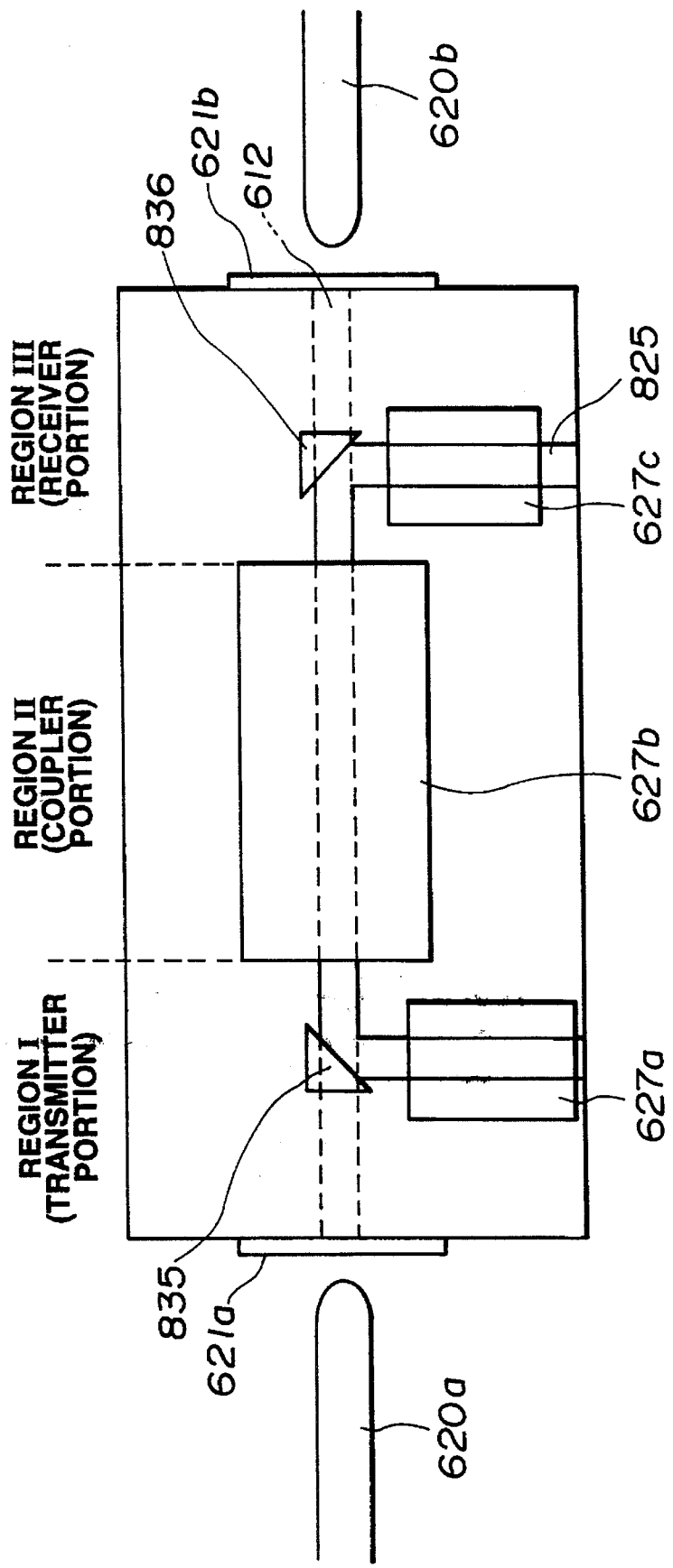
FIG. 37 is a plan schematic diagram of an nineteenth embodiment of the present invention.

In the eighteenth embodiment, the second core layer 815 is formed as a curved waveguide, but in the nineteenth embodiment, as shown in FIG. 37, which is a plan view, input and output ends of the second core layer 825 are respectively formed on a different plane and in a different direction from those of the first core layer 612 by using 45° mirrors 835 and 836. The mirrors 835 and 836 are formed by forming a recessed portion down to the second core layer 825. Thus, the size of the optical node can be reduced. Other structure and operation of the nineteenth embodiment are similar to those of the fifteenth embodiment.

Twentieth Embodiment

Embodiments of optical communication networks having an optical device of the present invention will be described.

In optical communication networks whose transmission topologies are bus type, star type, loop type and the like, an optical node is placed on the network when light needs to be branched to pick out information from the branched light or when information needs to be transmitted from a terminal unit to the network. The optical device of the present invention (e.g., sixth or eleventh embodiment) can be an element of such an optical node so that various networks or protocols can be established.

Figure 38:
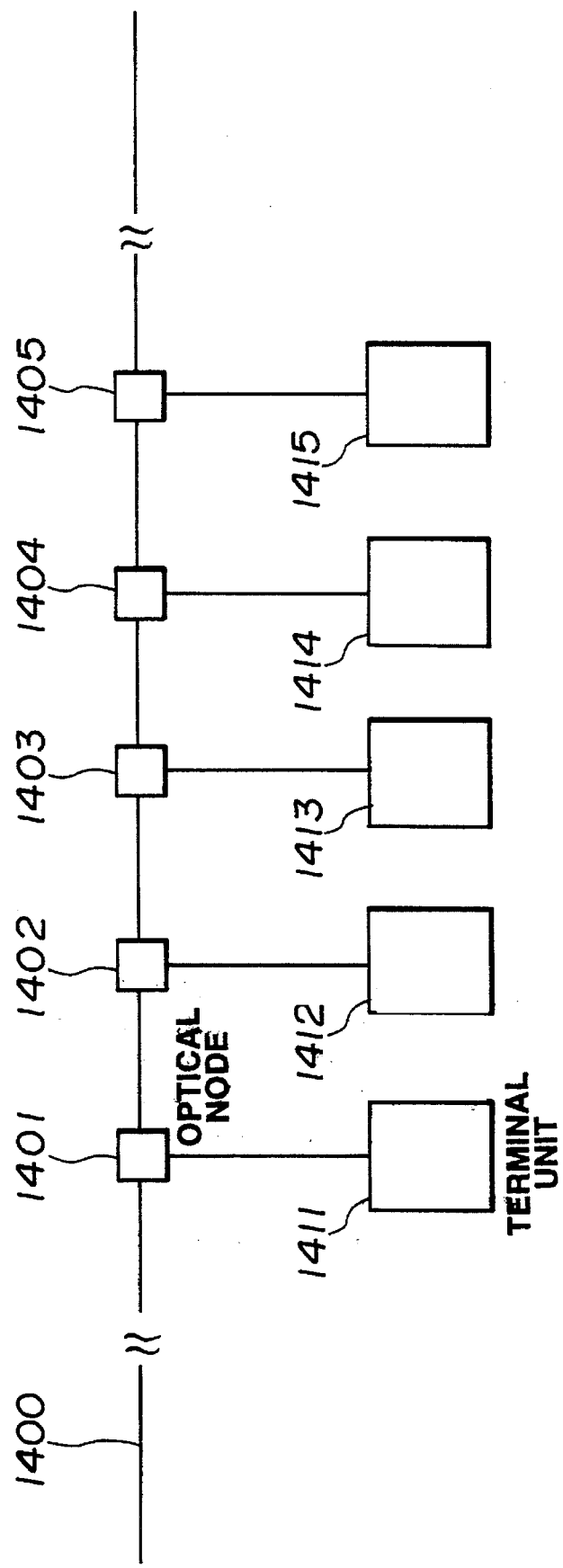
FIG. 38 is a schematic diagram of a twenty-first embodiment of the present invention, which is a bus type optical communication network.

FIG. 38 shows a bus type optical network in which an optical device of the present invention is applied to an optical node. In FIG. 38, reference numeral 1400 designates a bus line, reference numerals 1401–1405 respectively designate optical nodes having the optical device of the present invention, and reference numerals 1411–1415 respectively designate terminal units which are respectively connected to the optical nodes 1401–1405 and act as input and output equipment for terminals.

For example, in a network like Ethernet, which utilizes carrier sense multiple access with collision detection (CSMA/CD), the bus line 1400 is placed in front of and at the rear of the optical device and a portion of the light signal is branched by the splitter portion of the optical device. At this time, since the signal on the network can always be monitored, a portion of the light signal input into one of the nodes 1401–1405 is taken in and a portion is transmitted to a receiving circuit when the signal is addressed to this node. When the signal is not addressed to this node, a signal thereafter is passed through this node to a next node.

Further, in a case where trouble occurs in one or more of the terminal units 1411–1415 or nodes 1401–1405, when an electric source is switched off in this case, the signal completely passes through this node and the failure-safety function is automatically secured. Since the optical device (e.g., sixth or eleventh embodiment) is a bi-directional device which operates even when output and input are reversed, the optical device can be used in a bi-directional bus type system.

Twenty-first Embodiment

Figure 39:
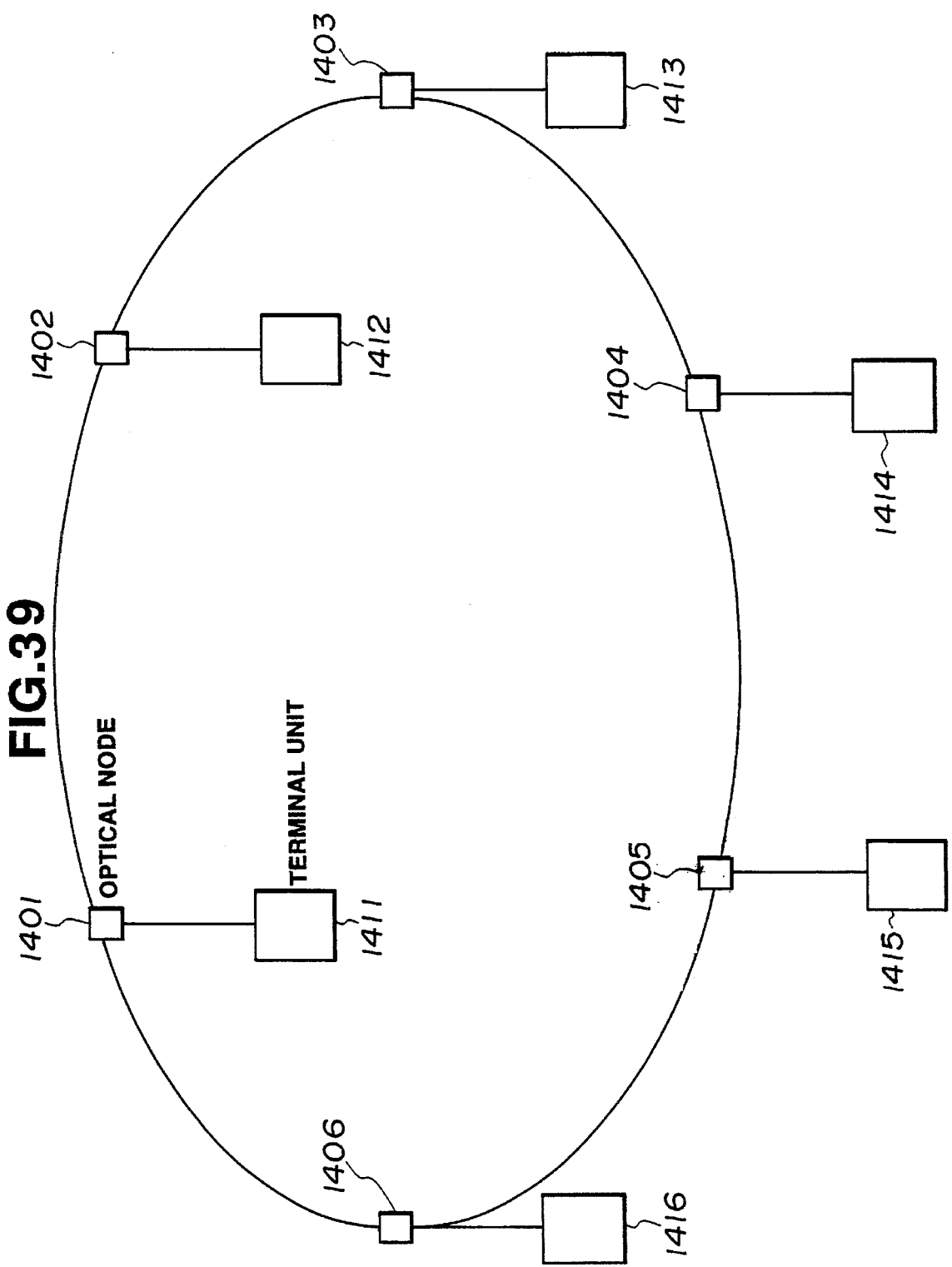
FIG. 39 is a schematic diagram of a twenty-second embodiment of the present invention, which is a loop type optical communication network.

FIG. 39 shows a loop or ring type optical network in which an optical device of the present invention is used in a token ring system. In FIG. 39, reference numerals 1401–1406 respectively designate optical nodes having the optical device of the present invention, and reference numerals 1411–1416 respectively designate terminal units which are respectively connected to the optical nodes 1401–1405 and act as input and output equipment for terminals.

Reproduction and relay is performed in each of the optical nodes 1401–1406 in the token ring system, and therefore, the device (e.g., sixth or eleventh embodiment) for conducting 100%-branching (a change of a light path) is used in the optical node 1401–1406. Further, the device emits a signal from the terminal units 1411–1416, in only a single direction, and hence only the coupler/amplifier portion of the device (see, for example, FIG. 19) at its output side is put in an ON state. The failure-safety function can be achieved by putting both the coupler/amplifier portions of the optical device in an OFF state, similar to the twentieth embodiment.

Twenty-second Embodiment

In optical communication networks whose transmission topologies are bus type, star type, loop type and the like, optical amplifiers are needed, depending on the branching method and the number, when a light signal is branched to pick out information.

Figure 40:
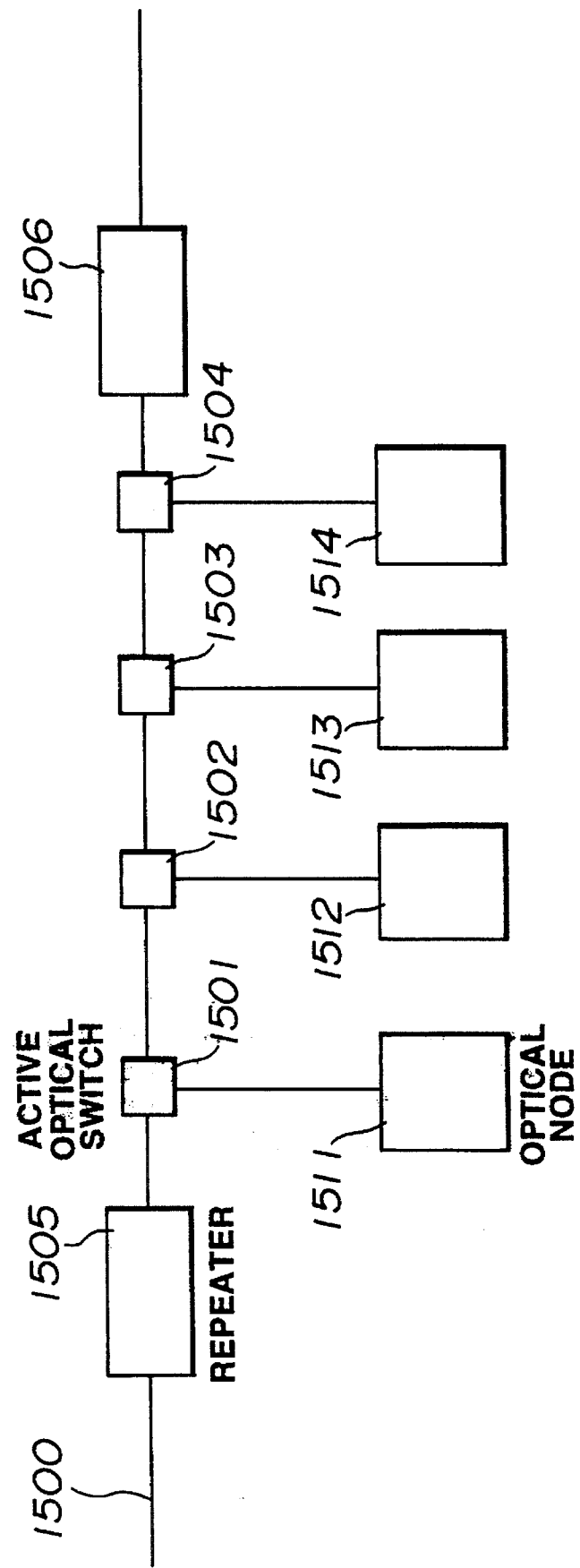
FIG. 40 is a schematic diagram of a twenty-third embodiment of the present invention, which is a bus type optical communication network.

FIG. 40 shows a bus type optical network in which an optical device of the present invention (e.g., first embodiment) is used as an optical booster amplifier. In FIG. 40, reference numeral 1500 designates a bus line, reference numerals 1501–1504 respectively designate active optical switches, reference numerals 1505 and 1506 respectively designate optical repeaters, and reference numerals 1511–1514 respectively designate optical nodes. The optical repeaters 1505 and 1506 respectively include the devices of the present invention and are used for compensating for power lost at each branching. Normally, optical repeaters 1505 and 1506 are interlocked with optical switches 1501–1504. The optical repeater 1505 or 1506 performs optical amplification corresponding to the number of branchings, and the switch is always open to the node side during amplification.

When trouble occurs in the optical amplifier for some reason, an electric power source of the optical amplifier is switched off and at the same time the active optical switch 1501–1506 is closed. As a result, the light signal on the bus line 1500 passes through the active optical switch 1501–1506 without any loss. Thus, the failure-safety function is achieved.

Twenty-third Embodiment

Figure 41:
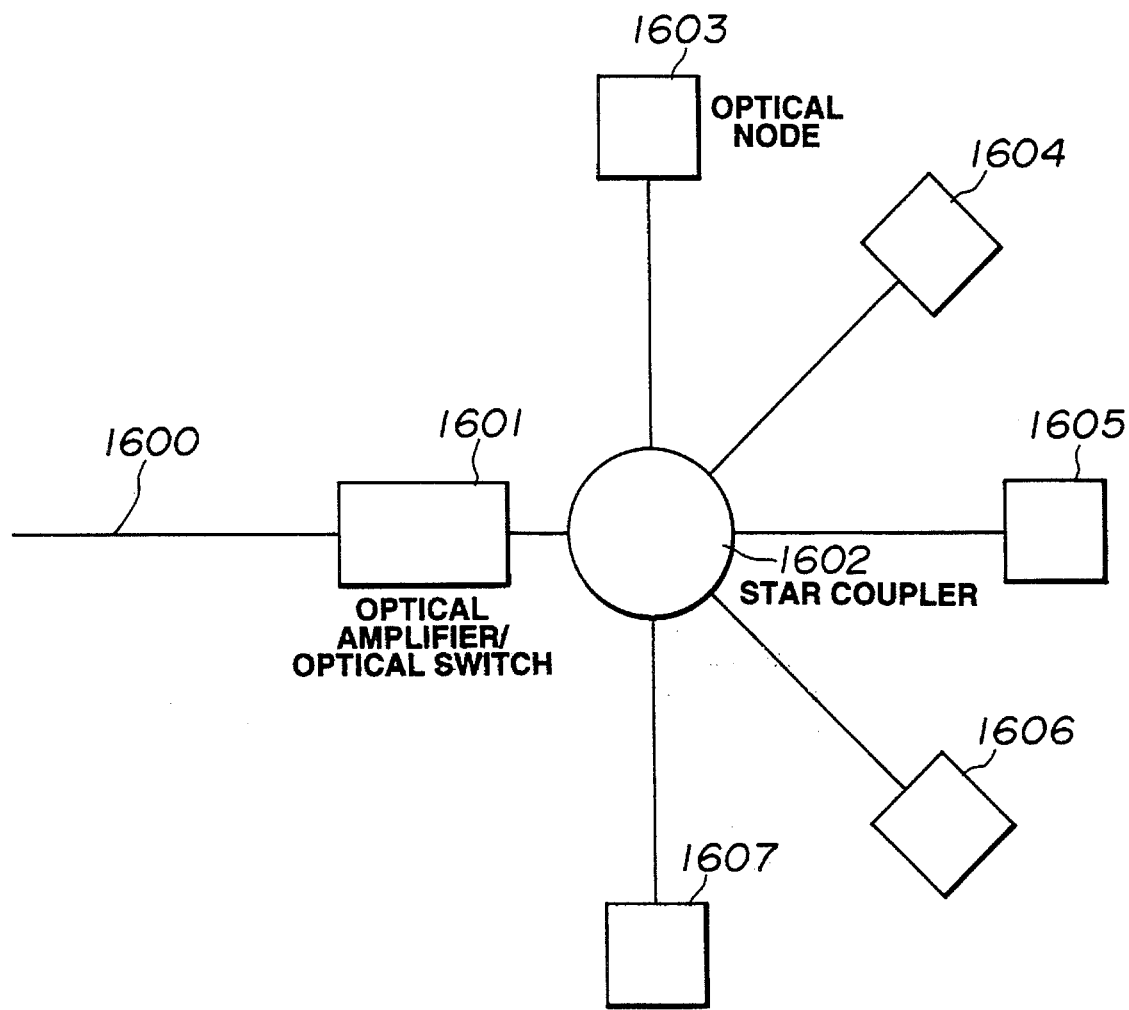
FIG. 41 is a schematic diagram of a twenty-fourth embodiment of the present invention, which is a star type optical communication network.

FIG. 41 shows a star type optical network in which an optical device of the present invention is used as an optical booster amplifier and switch. In FIG. 41, reference numeral 1600 designates a light transmission line, reference numeral 1601 designates an optical amplifier/optical switch, which includes the optical device of the present invention, reference numeral 1602 designates a star type optical switch or star coupler, and reference numerals 1603–1607 respectively designate optical nodes.

The function of the booster amplifier 1601 is the same as that of the twenty-second embodiment. When each terminal transmits a signal, the optical amplifier/optical switch 1601 is switched off and becomes a mere transmission device. Therefore, for example, a network of a so-called ping-pong communication, in which transmission and receiving are alternately performed, can be easily constructed

Others

In some embodiments mentioned above, the periodical current restraint layer is used as the layer for modulating the refractive index, but an ordinary grating can be used therefor as described in some embodiments. When the grating is used, a little coupling with the waveguiding mode may occur even when no carriers are injected. Although this coupling during current non-injection time can be reduced by an appropriate design, there is a limit thereto and a minute coupling inevitably occurs even under optimum conditions. Therefore, such a device can be used when the degree of coupling during the current non-injection time can be neglected considering the use of the device.

Further, in the above-discussed embodiments, the conduction type of the second core layer may be any one of undoped, n-type and p-type.

Moreover, a GaAs/AlGaAs series is used as semiconductor material in the above-discussed embodiments, but there is no limit thereto and material such as InP/InGaAsP series can be used with the same effects.

As described in the foregoing, according to the present invention, the drawbacks of conventional optical devices and communication systems can be solved and the following advantageous effects can be obtained.

(1) An optical switch, optical amplifier, optical modulator, light branching-combining device, optical coupler, light splitter, optical coupler, with a variable branching ratio, and the like can be monolithically integrated, and an optical device can be made compact and have a high level of performance.

(2) The failure-safety function can be automatically achieved in cases where an active device such as an optical amplifier, or a device constituting a terminal unit, an optical node such as an optical node for performing reproduction and relay (repeating), or the like is out of order.

(3) Integration with other devices can be readily attained.

(4) An optical device can be used as either a uni-directional device or a bi-directional device, depending on the structure of a network.

(5) Two series of O/E device, E/O device, optical switch and the like, which are needed for countermeasure of trouble in conventional optical nodes, can be done away with.

(6) It is unnecessary to put all terminals in an operative state even in a wide-range network, since optical nodes connected to respective terminals have a failure-safety function.

(7) Trouble in an optical node can be promptly detected by an optical node at a next stage.

Except as otherwise disclosed herein, the various components shown in outline or block form in the Figures are individually well-known in optical devices, such as optical amplifiers, and the optical communication arts, and their internal construction and operation are not critical either to the making or using of this invention or to a description of the best mode of the invention.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. An optical device comprising:
   a first waveguide for allowing a light wave to propagate therein;
   a second waveguide;
   transfer rate control means for controlling a power transfer rate of the light wave between said first waveguide and said second waveguide, the light-wave power transfer rate having a value of zero when said transfer rate control means is in an inoperative state, wherein said transfer rate control means comprises a refractive index modulating layer including a periodical current restraint layer; and
   electric means for electrically controlling said transfer rate control means by imparting electric energy to said transfer rate control means, said transfer rate control means falling into the inoperative state when said electric means imparts no electric energy to said transfer rate control means.

2. An optical device according to claim 1, wherein said transfer rate control means selects between the inoperative state and an operative state in which the optical power transfer rate is set to 100%.

3. An optical device according to claim 1, wherein said transfer rate control means selects between the inoperative state and an operative state in which the light power transfer rate is variable.

4. An optical device according to claim 1, wherein said refractive index modulating layer comprises a refractive index modulating grating.

5. An optical device according to claim 1, further comprising a 45° mirror for locating light input or output ends of said first waveguide and said second waveguide on different facets of said device.

6. An optical device according to claim 1, wherein at least one of said first waveguide and said second waveguide comprises a quantum well structure layer.

7. An optical device according to claim 1, wherein at least one of said first waveguide and said second waveguide comprises a core layer which is transparent to a propagated light wave.

8. An optical device according to claim 1, wherein at least one of said first waveguide and said second waveguide comprises a core layer which is made of a material for imparting gain to a propagated light wave.

9. An optical device according to claim 1, wherein said transfer rate control means is positioned between said first waveguide and said second waveguide.

10. An optical device according to claim 1, wherein said electric means imparts at least one of current and electric field to said transfer rate control means.

11. An optical device according to claim 1, wherein said device is divided into a plurality of regions along a light propagation direction and said transfer rate control means and said electric means are formed in at least one of the regions.

12. An optical device according to claim 1, wherein said device is divided into a plurality of regions along a light propagation direction, and further comprises an amplifier portion formed in at least one of the regions.

13. An optical device according to claim 1, wherein said device is divided into a plurality of regions along a light propagation direction, and further comprises a light branching-combining portion formed in at least one of the regions.

14. An optical device according to claim 13, wherein said light branching-combining portion guides at least part of the light wave, which is propagated along one of said first and second waveguides, to a point outside of said device.

15. An optical device according to claim 13, wherein said light branching-combining portion guides an incident light wave from a point outside to one of said first waveguide and said second waveguide.

16. An optical device according to claim 13, wherein said light branching-combining portion comprises a groove which reaches one of said first waveguide and said second waveguide, wherein a side of said light branching-combining portion comprises a mirror face.

17. An optical device according to claim 1, wherein said device is divided into a plurality of regions along a light propagation direction, and further comprises an optical transmitter portion formed in one of the regions.

18. An optical device according to claim 17, wherein said optical transmitter portion comprises one of a distributed bragg reflector type laser diode and a large optical cavity type distributed bragg reflector laser diode.

19. An optical device according to claim 1, wherein said device is divided into a plurality of regions along a light propagation direction, and further comprises an optical receiver portion formed in one of the regions.

20. An optical device according to claim 19, wherein said optical receiver portion comprises a PIN photodiode.

21. An optical device according to claim 1, wherein light input ends of said first waveguide and said second waveguide are formed on a common facet of said device.

22. An optical device according to claim 1, wherein light output ends of said first waveguide and said second waveguide are formed on a common facet of said device.

23. An optical device according to claim 1, wherein light input ends of said first waveguide and said second waveguide are formed on different facets of said device.

24. An optical device according to claim 1, wherein light output ends of said first waveguide and said second waveguide are formed on different facets of said device.

25. An optical device according to claim 1, wherein said first waveguide and said second waveguide are parallelly formed in a straightforward form.

26. An optical device according to claim 1, wherein one of said first waveguide and said second waveguide are formed in a curved form.

27. An optical communication network comprising:

a plurality of terminals;

a light transmission line for connecting said terminals to each other; and an optical device located on said light transmission line, said optical device comprising:

a first waveguide for allowing a light wave to propagate therein;

a second waveguide;

transfer rate control means for controlling a power transfer rate of the light wave between said first waveguide and said second waveguide, the light-wave power transfer rate having a value of zero when said transfer rate control means is in an inoperative state, wherein said transfer rate control means comprises a refractive index modulating layer including a periodical current restraint layer; and electric means for electrically controlling said transfer rate control means by imparting electric energy to said transfer rate control means, said transfer rate control means falling into the inoperative state when said electric means imparts no electric energy to said transfer rate control means.

28. An optical communication network comprising:

a plurality of terminals;

a light transmission line for connecting said terminals to each other; and an optical device disposed in each of said terminals, said optical device comprising:

a first waveguide for allowing a light wave to propagate therein;

a second waveguide;

transfer rate control means for controlling a power transfer rate of the light wave between said first waveguide and said second waveguide, the light-wave power transfer rate having a value of zero when said transfer rate control means is in an inoperative state, wherein said transfer rate control means comprises a refractive index modulating layer including a periodical current restraint layer; and electric means for electrically controlling said transfer rate control means by imparting electric energy to said transfer rate control means, said transfer rate control means falling into the inoperative state when said electric means imparts no electric energy to said transfer rate control means.

29. An optical device comprising:

a semiconductor substrate;

a first cladding layer formed on said semiconductor substrate, said first cladding layer having a first conduction type;

a first core layer formed on said first cladding layer, said first core layer having the first conduction type;

a second cladding layer formed on said first core layer, said second cladding layer having the first conduction type;

a second core layer formed on said second cladding layer;

a third cladding layer formed on said second core layer, said third cladding layer having a second conduction type;

a periodical current restraint layer, said periodical current restraint layer being formed in at least one of said second cladding layer and said third cladding layer and in at least one of a plurality of regions divided along a light propagation direction of said device; and electric means for electrically controlling said periodical current restraint layer by imparting electric energy to said periodical current restraint layer.

30. An optical device according to claim 29, wherein said periodical current restraint layer comprises first portions having the same refractive index and conduction type as said cladding layer around said periodical current restraint layer and second portions having the same refractive index as said cladding layer around said periodical current restraint layer and having a conduction type different from the conduction type of said cladding layer around said periodical current restraint layer, said first portions and said second portions being alternately arranged periodically along the light propagation direction of said device.

31. An optical device comprising:

a semiconductor substrate;

a first cladding layer formed on said semiconductor substrate, said first cladding layer having a first conduction type;

a first core layer formed on said first cladding layer;

a second cladding layer formed on said first core layer, said second cladding layer having a second conduction type;

a second core layer formed on said second cladding layer;

a third cladding layer formed on said second core layer, said third cladding layer having the first conduction type;

first means comprising a periodical current restraint layer for periodically modulating a refractive index of a cladding layer around said first means in a light propagation direction of said device, said first means being formed in at least one of said second cladding layer and said third cladding layer and at least one of a plurality of regions divided along the light propagation direction of said device;

second means for amplifying a light wave propagated through said device, said second means being formed in at least one of the plurality of regions; and electric means for electrically controlling said first means and said second means by imparting electric energy to said first and second means.

32. An optical device according to claim 31, wherein said first means and said second means cooperatively control an electric field distribution of a propagated light wave.

33. An optical device according to claim 31, wherein said periodical current restraint layer comprises first portions having the same refractive index and conduction type as said cladding layer around said periodical current restraint layer and second portions having the same refractive index as said cladding layer around said periodical current restraint layer and having a conduction type different from the conduction type of said cladding layer around said periodical current restraint layer, said first portions and said second portions being alternately arranged periodically along the light propagation direction of said device, and said electric means injects carriers into said periodical current restraint layer.

34. An optical device according to claim 31, wherein said second means comprises a PN junction evenly formed along the light propagation direction of said device, and said electric means performs one of carrier injection and reverse bias voltage application to said PN junction.

35. An optical device according to claim 1, further comprising means for controlling a refractive index of said first waveguide.

* * * * *

UNITED STATES PATENT AND TRADEMARK OFFICE
CERTIFICATE OF CORRECTION

PATENT NO. : 5,613,020
DATED : March 18, 1997
INVENTOR(S) : Uchida et al.

It is certified that error appears in the above-identified patent and that said Letters Patent is hereby corrected as shown below:

On the title page, item:

[56] FOREIGN PATENT DOCUMENTS:

"4264429 9/1992 Japan" should read
--4-264429 9/1992 Japan--.

COLUMN 7:

Line 4, "$10^{-1}$" should read --$10^{-3}$--.

COLUMN 10:

Line 61, "present" should read --present invention--.

COLUMN 16:

Line 35, "$n \approx_c 3 \times 10^{17}$" should read --$n \approx 3 \times 10^{17}$--.

COLUMN 20:

Line 62, "Franz Keldysh" should read --Franz-Keldysh--.

UNITED STATES PATENT AND TRADEMARK OFFICE
CERTIFICATE OF CORRECTION

PATENT NO. : 5,613,020
DATED : March 18, 1997
INVENTOR(S) : Uchida et al.

It is certified that error appears in the above-identified patent and that said Letters Patent is hereby corrected as shown below:

COLUMN 21:

Line 36, "Franz Keldysh" should read --Franz-Keldysh--.

COLUMN 22:

Line 41, "bragg" should read --Bragg--.

COLUMN 27:

Line 42, "constructed" should read --constructed.--

COLUMN 29:
Line 57, "bragg" should read --Bragg--; and
Line 58, "bragg" should read --Bragg--.

Signed and Sealed this

Twenty-seventh Day of January, 1998

Attest:

BRUCE LEHMAN

Attesting Officer

Commissioner of Patents and Trademarks